(12) United States Patent
Toda

(10) Patent No.: US 7,962,838 B2
(45) Date of Patent: Jun. 14, 2011

(54) MEMORY DEVICE WITH AN ECC SYSTEM

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/555,507

(22) Filed: Sep. 8, 2009

(65) Prior Publication Data

US 2010/0115383 A1 May 6, 2010

(51) Int. Cl.
*H03M 13/00* (2006.01)
(52) U.S. Cl. ............... 714/781; 714/784; 714/785
(58) Field of Classification Search ............ 714/781, 714/784, 785
See application file for complete search history.

(56) References Cited

U.S. PATENT DOCUMENTS

| | | | | |
|---|---|---|---|---|
| 3,418,629 A * | 12/1968 | Chien | ...................... | 714/782 |
| 4,058,851 A * | 11/1977 | Scheuneman | ............. | 714/6 |
| 4,099,160 A * | 7/1978 | Flagg | ........................ | 714/785 |
| 4,142,174 A * | 2/1979 | Chen et al. | ................. | 714/784 |
| 4,498,175 A * | 2/1985 | Nagumo et al. | ........... | 714/756 |
| 4,509,172 A * | 4/1985 | Chen | .......................... | 714/759 |
| 4,567,568 A * | 1/1986 | Inagawa et al. | ........... | 708/650 |
| 4,567,594 A * | 1/1986 | Deodhar | ................... | 714/769 |
| 4,574,361 A * | 3/1986 | Inagawa et al. | ........... | 708/492 |
| 4,604,655 A * | 8/1986 | Moriyama | ................. | 386/100 |
| 4,608,692 A * | 8/1986 | Nagumo et al. | ........... | 714/756 |
| 4,677,622 A * | 6/1987 | Okamoto et al. | .......... | 714/756 |
| 4,782,490 A * | 11/1988 | Tenengolts | ............... | 714/756 |
| 4,841,300 A * | 6/1989 | Yoshida et al. | ............ | 341/94 |
| 4,958,349 A * | 9/1990 | Tanner et al. | .............. | 714/759 |
| 5,040,179 A * | 8/1991 | Chen | .......................... | 714/759 |
| 5,155,734 A * | 10/1992 | Kashida et al. | ............ | 714/785 |
| 5,459,740 A * | 10/1995 | Glaise | ....................... | 714/755 |
| 5,537,429 A * | 7/1996 | Inoue | ........................ | 714/755 |
| 5,710,782 A * | 1/1998 | Weng | ........................ | 714/785 |
| 5,761,102 A * | 6/1998 | Weng | ........................ | 708/492 |
| 5,771,246 A * | 6/1998 | Weng | ........................ | 714/762 |
| 5,887,005 A * | 3/1999 | Sharma | ..................... | 714/784 |
| 5,889,793 A * | 3/1999 | Sharma | ..................... | 714/784 |
| 5,974,583 A * | 10/1999 | Joo | ............................ | 714/784 |
| 5,978,956 A * | 11/1999 | Weng et al. | ................ | 714/784 |
| 6,185,134 B1 | 2/2001 | Tanaka | | |
| 6,199,188 B1 * | 3/2001 | Shen et al. | ................. | 714/782 |
| 6,272,659 B1 * | 8/2001 | Zook | ........................ | 714/774 |
| 6,286,123 B1 * | 9/2001 | Kim | ............................ | 714/781 |
| 6,343,367 B1 * | 1/2002 | Shen et al. | ................. | 714/782 |

(Continued)

FOREIGN PATENT DOCUMENTS

JP 2000-173289 6/2000

(Continued)

OTHER PUBLICATIONS

U.S. Appl. No. 12/524,880, filed Jul. 29, 2009, Haruki Toda.

*Primary Examiner* — Joseph D Torres
(74) *Attorney, Agent, or Firm* — Oblon, Spivak, McClelland, Maier & Neustadt, L.L.P.

(57) ABSTRACT

A memory device has an error detection and correction system constructed on a Galois finite field. The error detection and correction system includes calculation circuits for calculating the finite field elements based on syndromes obtained from read data and searching error locations, the calculation circuits having common circuits, which are used in a time-sharing mode under the control of internal clocks.

4 Claims, 34 Drawing Sheets

U.S. PATENT DOCUMENTS

| | | | |
|---|---|---|---|
| 6,360,348 B1 * | 3/2002 | Yang | 714/784 |
| 6,374,383 B1 * | 4/2002 | Weng | 714/781 |
| 6,560,747 B1 * | 5/2003 | Weng | 714/781 |
| 6,643,819 B1 * | 11/2003 | Weng | 714/785 |
| 6,651,212 B1 | 11/2003 | Katayama et al. | |
| 6,651,214 B1 * | 11/2003 | Weng et al. | 714/771 |
| 6,928,601 B2 * | 8/2005 | Katayama et al. | 714/781 |
| 7,010,738 B2 * | 3/2006 | Morioka et al. | 714/752 |
| 7,076,722 B2 * | 7/2006 | Shibata | 714/763 |
| 7,228,467 B2 * | 6/2007 | Ball | 714/710 |
| RE40,252 E | 4/2008 | Tanaka | |
| 2003/0028842 A1 * | 2/2003 | Katayama et al. | 714/781 |
| 2003/0101405 A1 * | 5/2003 | Shibata | 714/763 |
| 2007/0198902 A1 | 8/2007 | Toda | |
| 2007/0220400 A1 | 9/2007 | Toda et al. | |
| 2007/0266291 A1 * | 11/2007 | Toda et al. | 714/746 |
| 2008/0082901 A1 | 4/2008 | Toda | |
| 2009/0049366 A1 | 2/2009 | Toda | |
| 2010/0036901 A1 * | 2/2010 | Rarick | 708/532 |

FOREIGN PATENT DOCUMENTS

WO    WO 2008/099723 A1    8/2008

* cited by examiner

FIG. 6

$$S(=S_1) \quad S_3 \quad S_5 \quad S_7$$
$$\downarrow \text{STEP 1}$$
$$\zeta = S^3 + S_3 \quad \eta = S^5 + S_5 \quad \theta = S^7 + S_7$$
$$\downarrow \text{STEP 2}$$
$$S^3 \zeta \quad S \eta \quad S^4 \eta \quad S^2 \theta$$
$$\downarrow \text{STEP 3}$$
$$\Gamma = S^3 \zeta + S \eta + \zeta^2 \quad \Gamma T = S^4 \eta + S^2 \theta + \zeta^3 \quad S^3 \eta \quad S \zeta \quad S \theta \quad \zeta \eta$$
$$\downarrow \text{STEP 4}$$
$$\Gamma D = S^3 \eta + S^2 \zeta^2 + S \theta + \zeta \eta \quad S^4 \zeta^2 \quad S^2 \zeta \eta \quad \zeta \theta$$
$$\downarrow \text{STEP 5}$$
$$\Gamma Q = S^4 \zeta^2 + S^2 \zeta \eta + \zeta \theta + \eta^2 \quad D \quad T$$
$$\downarrow \text{STEP 6}$$
$$Q \quad a = D/S \quad ST$$
$$\downarrow \text{STEP 7}$$
$$b = D^2 + ST \quad \zeta T \quad Ta \quad S^2 Q$$
$$\downarrow \text{STEP 8}$$
$$c = S^2 Q + SDT + T^2 = S^2 Q + \zeta T \quad B = a^4 + Ta + Q$$

FIG. 13 (Case 1)

FIG. 14 (Case 2)

FIG. 15 (Case 3)

FIG. 16 (Case 4)

Syndrome Element Calculation (SEC) : 90

FIG. 20

| | Information Bit Number $2^n-1$ | 4EC Check Bit Number $4n$ | Correction Rate $4/(2^{n-1}+4n)$ | Memory Redundancy Rate $4n/2^{n-1}$ | $h=2^n-1$ Factorization | MAX Component Index Bit Number | Bus Width |
|---|---|---|---|---|---|---|---|
| $GF(2^8)$ | 128 | 32 | 0.025 | 0.25 | $255=3\cdot 5\cdot 17$ | 5 | 25 |
| | | | | | | 7 | 80 |
| $GF(2^9)$ | 256 | 36 | 0.0137 | 0.1406 | $511=7\cdot 73$ | 5 | 45 |
| $GF(2^{10})$ | 512 | 40 | 0.0072 | 0.0738 | $1023=3\cdot 11\cdot 31$ | 7 | 112 |
| $GF(2^{11})$ | 1024 | 44 | 0.0037 | 0.0430 | $2047=23\cdot 89$ | 4 | 31 |
| $GF(2^{12})$ | 2048 | 48 | 0.0019 | 0.0234 | $4095=3\cdot 3\cdot 5\cdot 7\cdot 13$ | 5 | 49 |
| | | | | | $4095=13\cdot 15\cdot 21$ | | |
| $GF(2^{13})$ | 4096 | 52 | 0.0010 | 0.0127 | 8191 | 13 | 13b |

FIG. 22

| F(w) {α,β} | F(w) γ* |
|---|---|
| wmod 3=0 / wmod 11=0 | wmod 31=0 |
| wmod 11=10 | |
| wmod 3=1 / wmod 11=0 | ～ |
| wmod 11=10 | |
| wmod 3=2 / wmod 11=0 | wmod 31=30 |
| wmod 11=10 | |

$\alpha* = (F(w)) \text{wmod } 3 = \alpha)$   $\beta* = (F(w)) \text{wmod } 11 = \beta)$   $\gamma* = (F(w)) \text{wmod } 31 = \gamma)$ $Pn_9$ $Pn_8$ $Pn_7$ $Pn_6$ $Pn_5$ $Pn_4$ $Pn_3$ $Pn_2$ $Pn_1$ $Pn_0$
  C0~C3      B0~B15            A0~A15

FIG. 27
adder input multiplexer : 400
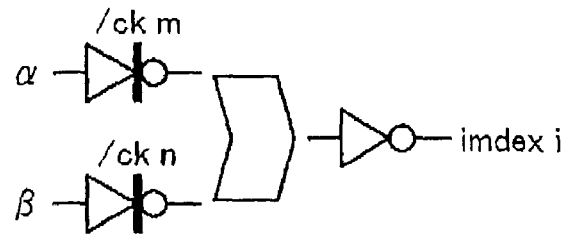
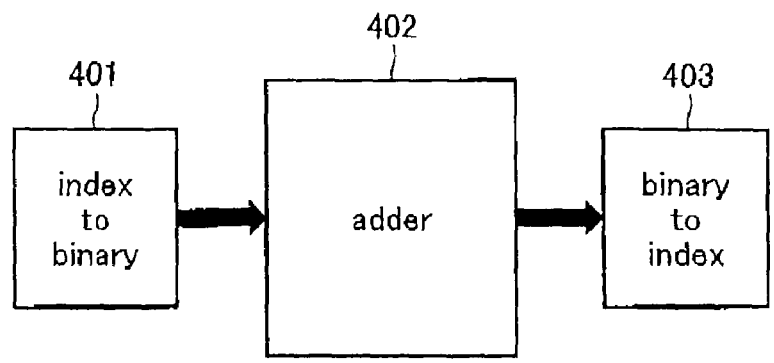
FIG. 28
index/binary converter : 401
(index(3),(11),(31) to 2,4,5 binary)
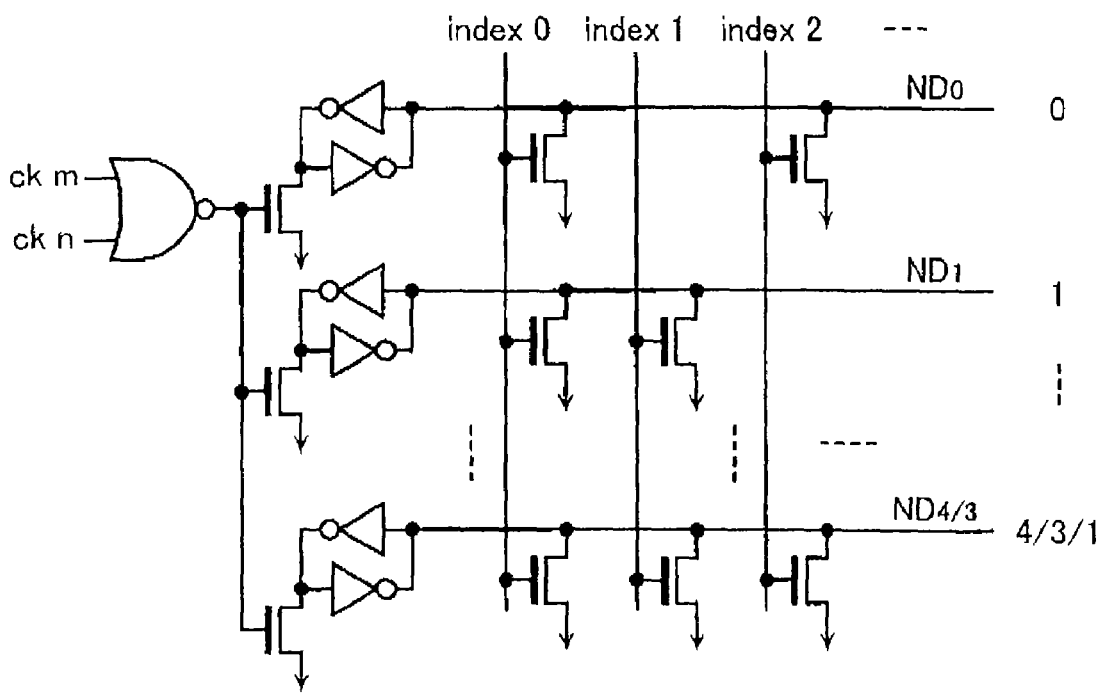

FIG. 29
binary / index converter : 403
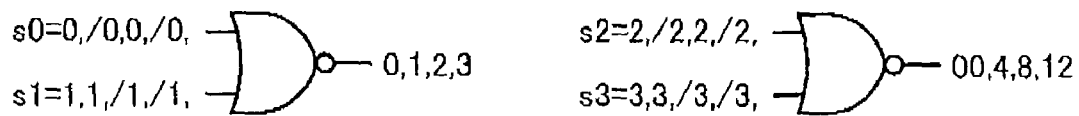
FIG. 30
index decode & latch : 404
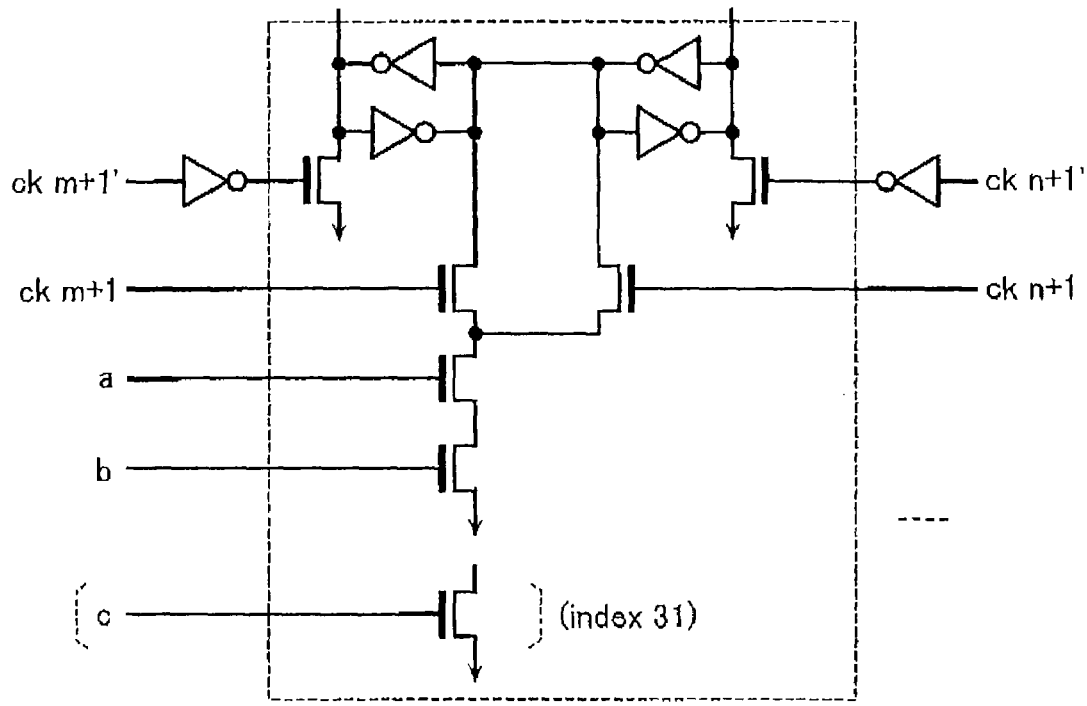
FIG. 31
index i(3)
| i | 0 | 1 | 2 |
| a | 0 | 1 | 2 |
| b | 0 | 1 | 2 |

FIG. 32 index i(11)

| i | 0 | 1 | 2 | 3 | 4 | 5 | 6 | 7 | 8 | 9 | 10 |
|---|---|---|---|---|---|---|---|---|---|---|----|
| a | 0 | 1 | 2 | 3 | 0 | 1 | 2 | 3 | 0 | 1 | 2 |
| b | 00 | 00 | 00 | 00 | 4 | 4 | 4 | 4 | 8 | 8 | 8 |

FIG. 33 index i(31)

| i | 0 | 1 | 2 | 3 | 4 | 5 | 6 | 7 | 8 | 9 | 10 |
|---|---|---|---|---|---|---|---|---|---|---|----|
| a | 0 | 1 | 2 | 3 | 0 | 1 | 2 | 3 | 0 | 1 | 2 |
| b | 00 | 00 | 00 | 00 | 4 | 4 | 4 | 4 | 8 | 8 | 8 |
| c | /s4 | /s4 | /s4 | /s4 | s4 | s4 | s4 | s4 | /s4 | /s4 | /s4 |

| i | 11 | 12 | 13 | 14 | 15 | 16 | 17 | 18 | 19 | 20 | 21 |
|---|----|----|----|----|----|----|----|----|----|----|----|
| a | 3 | 0 | 1 | 2 | 3 | 0 | 1 | 2 | 3 | 0 | 1 |
| b | 8 | 12 | 12 | 12 | 12 | 00 | 00 | 00 | 00 | 4 | 4 |
| c | /s4 | /s4 | /s4 | /s4 | /s4 | s4 | s4 | s4 | s4 | s4 | s4 |

| i | 22 | 23 | 24 | 25 | 26 | 27 | 28 | 29 | 30 |
|---|----|----|----|----|----|----|----|----|----|
| a | 2 | 3 | 0 | 1 | 2 | 3 | 0 | 1 | 2 |
| b | 4 | 4 | 8 | 8 | 8 | 8 | 12 | 12 | 12 |
| c | s4 | s4 | s4 | s4 | s4 | s4 | s4 | s4 | s4 |

2bit (3) adder : 410

FIG. 37
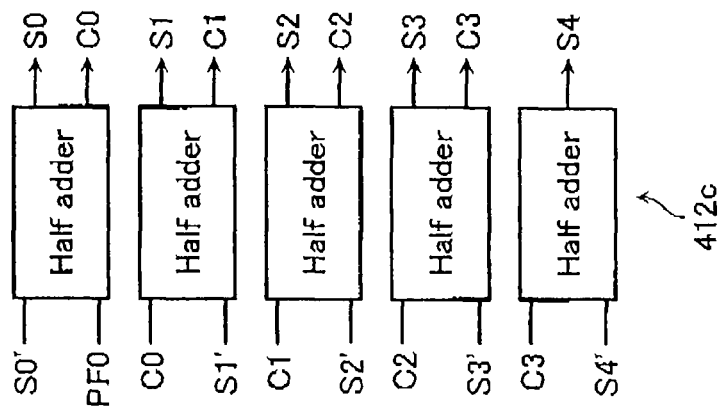
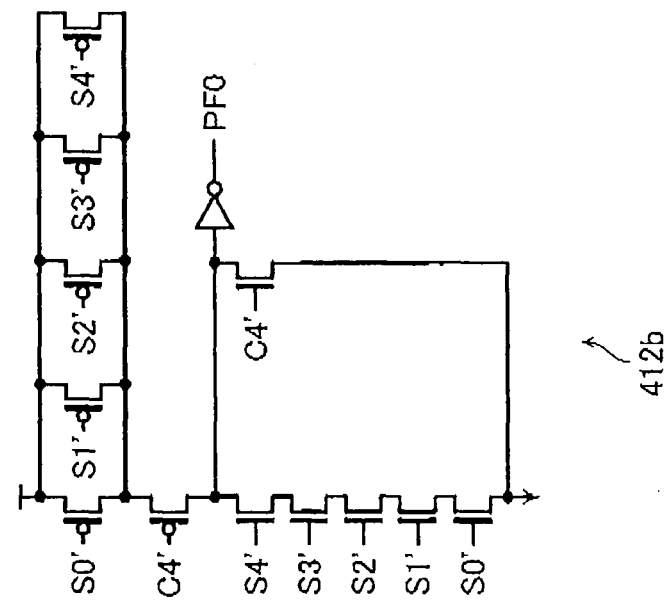
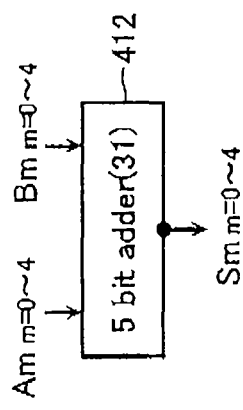
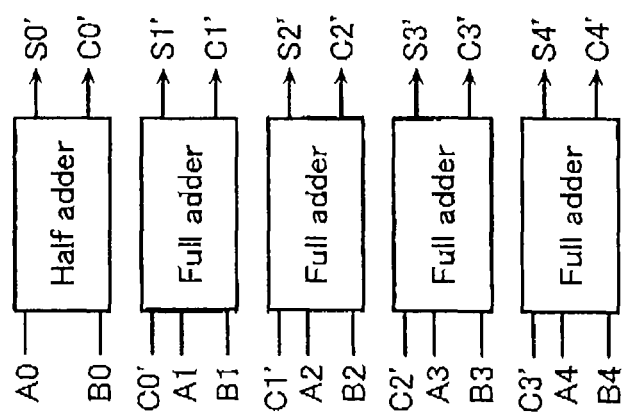

half adder

FIG. 40

| i(37) | i(11) | i(3) | x(-1) | | | x(1/2) | | | x(1/3) | | | x2 | | |
|---|---|---|---|---|---|---|---|---|---|---|---|---|---|---|
| | | | -i(31) | -i(11) | -i(3) | i/2(31) | i/2(11) | i/2(3) | i/3(31) | i/3(11) | i/3(3) | 2i(31) | 2i(11) | 2i(3) |
| 0 | 0 | 0 | 0 | 0 | 0 | 0 | 0 | 0 | 0 | 0 | 0 | 0 | 0 | 0 |
| 1 | 1 | 1 | 30 | 10 | 2 | 16 | 6 | 2 | 21 | 4 | 1 | 2 | 2 | 2 |
| 2 | 2 | 2 | 29 | 9 | 1 | 1 | 1 | 1 | 11 | 8 | 1 | 4 | 4 | 1 |
| 3 | 3 | | 28 | 8 | | 17 | 7 | | 1 | 1 | | 6 | 6 | |
| 4 | 4 | | 27 | 7 | | 2 | 2 | | 22 | 5 | | 8 | 8 | |
| 5 | 5 | | 26 | 6 | | 18 | 8 | | 12 | 9 | | 10 | 10 | |
| 6 | 6 | | 25 | 5 | | 3 | 3 | | 2 | 2 | | 12 | 1 | |
| 7 | 7 | | 24 | 4 | | 19 | 9 | | 23 | 6 | | 14 | 3 | |
| 8 | 8 | | 23 | 3 | | 4 | 4 | | 13 | 10 | | 16 | 5 | |
| 9 | 9 | | 22 | 2 | | 20 | 10 | | 3 | 3 | | 18 | 7 | |
| 10 | 10 | | 21 | 1 | | 5 | 5 | | 24 | 7 | | 20 | 9 | |
| 11 | | | 20 | | | 21 | | | 14 | | | 22 | | |
| 12 | | | 19 | | | 6 | | | 4 | | | 24 | | |
| 13 | | | 18 | | | 22 | | | 25 | | | 26 | | |
| 14 | | | 17 | | | 7 | | | 15 | | | 28 | | |
| 15 | | | 16 | | | 23 | | | 5 | | | 30 | | |
| 16 | | | 15 | | | 8 | | | 26 | | | 1 | | |
| 17 | | | 14 | | | 24 | | | 16 | | | 3 | | |
| 18 | | | 13 | | | 9 | | | 6 | | | 5 | | |
| 19 | | | 12 | | | 25 | | | 27 | | | 7 | | |
| 20 | | | 11 | | | 10 | | | 17 | | | 9 | | |
| 21 | | | 10 | | | 26 | | | 7 | | | 11 | | |
| 22 | | | 9 | | | 11 | | | 28 | | | 13 | | |
| 23 | | | 8 | | | 27 | | | 18 | | | 15 | | |
| 24 | | | 7 | | | 12 | | | 8 | | | 17 | | |
| 25 | | | 6 | | | 28 | | | 29 | | | 19 | | |
| 26 | | | 5 | | | 13 | | | 19 | | | 21 | | |
| 27 | | | 4 | | | 29 | | | 9 | | | 23 | | |
| 28 | | | 3 | | | 14 | | | 30 | | | 25 | | |
| 29 | | | 2 | | | 30 | | | 20 | | | 27 | | |
| 30 | | | 1 | | | 15 | | | 10 | | | 29 | | |

MEMORY DEVICE WITH AN ECC SYSTEM

CROSS-REFERENCE TO RELATED APPLICATION

This application is based on and claims the benefit of priority from the prior Japanese Patent Application No. 2008-281316, filed on Oct. 31, 2008, the entire contents of which are incorporated herein by reference.

BACKGROUND OF THE INVENTION

1. Field of the Invention

This invention relates to a memory device with an ECC system installed therein.

2. Description of the Related Art

In a memory device with a large capacity scale such as a NAND-type flash memory, a resistance change memory (ReRAM) and a phase change memory (PCRAM) and the like, data contents are destroyed during data holding due to variable causes. Specifically, in case the physical mechanism used for holding a data state is easily affected by noise, and when the large scale integration of the memory capacity and the size-shrinking in the fabricating process progress more, the error rate of the memory device will be increased more. Therefore, it becomes a key technology to install an on-chip ECC (Error Correcting Code) system in a memory device.

There has already been provided such a technology that an ECC circuit is installed in a flash memory chip or a memory controller thereof (refer to, for example, JP-A-2000-173289).

In case error correction is performed for two bits or more in an ECC system with BCH code (i.e., BCH-ECC system) using Galois finite field $GF(2^n)$, if such a method is used that the finite field elements are substituted sequentially for solving an error location searching equation, the operation time becomes very long, so that the read and write performance of the memory will be declined largely even if the ECC system is installed therein.

So, it is desired to install an ECC system, which does not use the above-described sequential substitution method and does not sacrifice the memory performance.

SUMMARY OF THE INVENTION

According to an aspect of the present invention, there is provided a memory device having an error detection and correction system constructed on a Galois finite field, wherein
the error detection and correction system includes calculation circuits for calculating the finite field elements based on syndromes obtained from read data and searching error locations with a decoding method, the calculation circuits having common circuits, which are used in a time-sharing mode under the control of internal clocks.

According to another aspect of the present invention, there is provided a memory device having an error detection and correction system constructed on Galois finite field, wherein
the error detection and correction system includes:
an encode part configured to generate check bits to be written into the memory device together with information bits;
a syndrome operation part configured to search syndromes from read data;
a syndrome element calculation part configured to perform calculation between the finite field elements based on the syndromes and search some quantities necessary in the calculation of searching error locations;
an error searching part configured to perform data transmission/reception for the syndrome element calculation part and the calculation of searching the error locations between the finite field elements; and
a clock generator configured to generate internal clocks used for making operation circuits in the syndrome element calculation part and the error searching part activated in a time-sharing mode.

According to still another aspect of the present invention, there is provided a memory device having an error detection and correction system constructed on a Galois finite field, wherein
a cubic error searching equation having roots defined by the finite field elements designating error locations in the error detection and correction system is solved by the procedures of: solving simultaneous equations containing two variables to determine the coefficients of the error searching equation which is represented with syndromes; and searching solutions of the error searching equation based on the product of a quadratic equation and a simple equation transformed from the error searching equation.

BRIEF DESCRIPTION OF THE DRAWINGS

FIG. 6 shows the steps for calculating the finite elements from the syndromes.

FIG. 20 shows the relationship between the types of the finite field used in the on-chip ECC and ECC properties.
FIG. 22 shows the scale-decreasing method of the decoder circuit.

FIG. 27 shows the adder circuit configuration.

FIG. 28 shows the index/binary converting circuit at the input portion of the adder circuit.

FIG. 29 shows the binary/index converting circuit at the output portion of the adder circuit.

FIG. 30 shows the index decode $ output latch in the adder circuit.

FIG. 31 shows the decode input of the expression index component i(3) at the output latch.

FIG. 32 shows the decode input of the expression index component i(11) at the output latch.

FIG. 33 shows the decode input of the expression index component i(31) at the output latch.

FIG. 37 shows the 5-bit adder configuration of the adder.

FIG. 40 shows the relationship between the expression indexes.

DETAILED DESCRIPTION OF THE EMBODIMENTS

Figure 1:
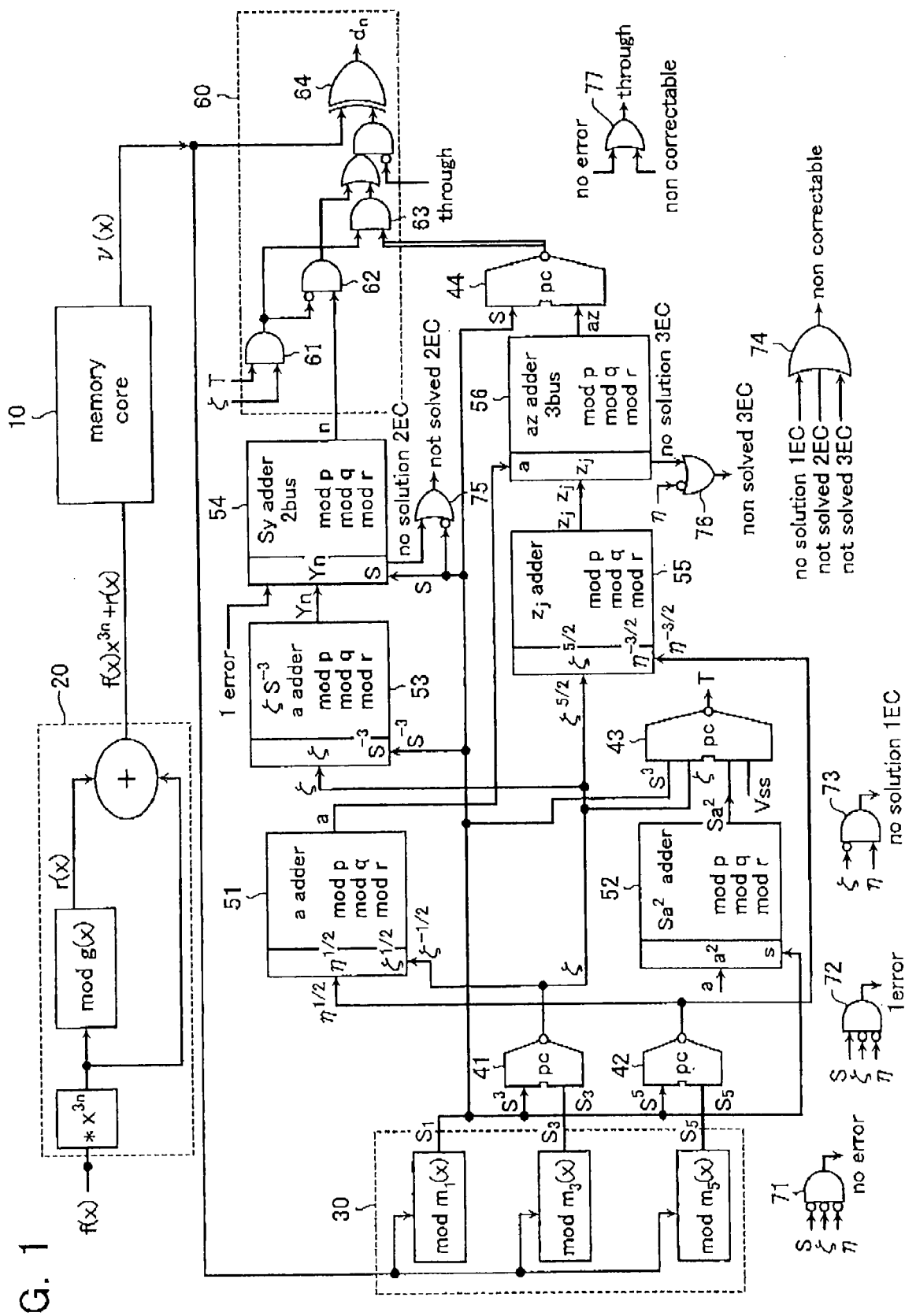
FIG. 1 shows a 3EC-BCH-ECC system in accordance with an embodiment of the present invention.

Illustrative embodiments of this invention will be explained with reference to the accompanying drawings below.

As the size-shrinking and integration of a memory progress, the reliability of data holding of the memory is decreased. Specifically, in a flash memory dealing with multi-level data and a recently developed resistance RAM (ReRAM) or phase-change RAM (PCRAM), the data insta-bility is not avoided, and it is required of it to be dealt with that the held data necessarily changes. Therefore, it becomes a material technology to correct errors in the read data with an ECC system prior to the practical use.

Since it is required of the ECC system installed in the memory device to perform data correcting in real time, it is necessary to perform high-speed operation processing. It is well-known that an ECC system with BCH code is effective for randomly generated errors.

This inventor has proposed a high-speed BCH-ECC system, which is constructed to be able to correct 4-bit errors (for example, refer to JP-A-2007-210659). To make the ECC system adaptable for correcting 4-bit errors, not only the circuit system becomes complicated, but also the operation scale becomes large. Therefore, it is required of such the ECC system to be made as small as possible in the circuit scale.

In the embodiment described below, branching conditions in the calculating process are made clear and time-sharing of the operation circuit is effectively used in a 4-bit error cor-rectable BCH-ECC system, the circuit scale will be decreased. As a Galois finite field adaptable to an on-chip ECC system, $GF(2^{10})$ will be selected. Installing such the ECC system, it becomes possible to provide a memory, the data reliability of which is increased without reducing the memory performance, when externally observing it.

The technology used in the embodiment will be summa-rized as follows:

(A) In an ECC system fox correcting errors up to 4 bits with logic operations on a finite field, the calculating branch for searching 1 error, 2 errors, 3 errors and 4 errors, will be decided based on exclusive conditions between quantities derived from the syndrome.

(B) In an ECC system correcting errors up to 3 bits with a finite field, when solving a cubic equation, which has roots expressed by finite field elements designating error locations, the cubic equation is transformed to a product of a simple equation by a quadratic equation. The coefficients of the product will be searched from those in the untransformed cubic equation, and then the quadratic equation will be solved by use of the coefficients.

(C) In an ECC system for correcting errors with a finite field, adder circuits and parity checker circuits, each of which calculates a product and a sum of finite elements represented by "expression indexes", respectively, are used for calculat-ing quantities derived from the syndrome and searching solu-tions of an equation used for searching elements designating error locations. These circuits are physically shared as widely as possible, and used in a time-sharing mode under the control of internal clocks.

(D) In the explanation described above, "expression index" is defined as follows: when designating elements of finite field $GF(2^n)$ by indexes "k" of roots $\alpha^k$ of the basic irreducible polynomial, the indexes may be represented as a combination of the remainders with different factors of $2^n-1$ as modulo, and the remainders are referred to as "expression indexes". For example, supposing that the domain $2^n-1$ is factorized into at least two prime factors "p" and "q", a combination of the expression indexes k(mod p) and k(mod q) is utilized.

(E) In detail, in the embodying real time and on-chip ECC system built in a memory, finite field $GF(2^{10})$ is used, and a combination of numbers with 3, 11 and 31 as modulo (a combination of mod 3, mod 11 and mod 31) are used as expression indexes for expressing the elements of the finite field.

(F) In the ECC system, in which the elements of finite field are represented by "expression index" components with the different factors as modulo, decoder circuits for searching the expression index components of the element of finite field are formed to include decoder groups, which are used in common to two components of the expression indexes, and the expres-sion index components are obtained by taking a logic between the outputs of the decoder group.

(G) Mainly explained in the embodiment described below is a 4EC-EW-BCH system, which performs error correction up to four bits (this is considered as the maximum error correction number of a high-speed and real time data process-ing on-chip BCH ECC circuit), and generates a warning when five or more errors are generated. However, 3-bit, 2-bit and 1-bit error correction data processing is performed in each branch in the 4EC-EW system. Therefore, the system will be explained sequentially in order of error bit number. Initially, the principle of 2-bit error correction including 1-bit error correction is explained below.

[The Principle Explanation of 2EC-EW (Two Error Cor-rection-Error Warning)-BCH System]

Data Encoding

Assume that a basic irreducible polynomial on the Galois field $GF(2^n)$ is $m_1(x)$, and root thereof is $\alpha$. Since $GF(2^n)$ is dealt with a finite field here, $m_1(x)$ is expressed as a n-degree polynomial. By use of root $\alpha$, elements of $GF(2^n)$ are repre-sented by the following $2^n$ numbers; $0, \alpha^0, \alpha^1, \ldots \alpha^{h-2}$ and $\alpha^{h-1}$, where $h=2^n-1$.

To perform 2-error correction, another basic irreducible polynomial $m_3(x)$ with root $\alpha^3$ is selected.

Using these irreducible polynomials, code generating polynomial, $g(x)=m_1(x) m_3(x)$, is formed.

Since the number of elements constituting the ECC code is "h" excepting zero factor, (h−1)-degree polynomial f(x) shown in the following Expression 1 becomes an information polynomial, the coefficients of which designate data.

$$f(x) = a_{h-1}x^{h-1-2n} + a_{h-2}x^{h-2-2n} + \ldots + a_{2n+2}x^2 + a_{2n+1}x + a_{2n} \quad [\text{Exp. 1}]$$

Information bits in data bits are assigned to coefficients $a_{2n} \sim a_{h-1}$. As shown in the following Expression 2, with respect to polynomial f(x) with the above-described coefficients, polynomial $f(x)x^{2n}$ beginning from 2n-degree is divided by g(x), and the remaining is referred to as r(x).

$$f(x)x^{2n} = q(x)g(x) + r(x)$$

$$r(x) = b_{2n-1}x^{2n-1} + b_{2n-2}x^{2n-2} + \ldots + b_1 x + b_0 \quad [\text{Exp. 2}]$$

The coefficients, $b_{2n-1} \sim b_0$, of the remaining polynomial r(x) are used as check bits, which constitute data bits to be stored in the memory together with information bits $a_{h-1} \sim a_{2n}$.

Data Decoding

Errors generated in the data bits are represented by (h−1)-degree error polynomial e(x), and read data from the memory are represented by the polynomial v(x) shown in the following Expression 3.

$$v(x) = f(x)x^{2n} + r(x) + e(x) \quad [\text{Exp. 3}]$$
$$= q(x)g(x) + e(x)$$

The error polynomial e(x) is solved, and error correction may be achieved.

At a first stage, v(x) is divided by $m_1(x)$ and $m_3(x)$, and remainders $S_1(x)$ and $S_3(x)$, respectively, are obtained. These remainders are also, as shown in the following Expression 4, those of e(x). These remaining polynomials $S_1(x)$ and $S_3(x)$ are referred to as syndromes.

$$v(x) \equiv S_1(x) \bmod m_1(x)$$

$$\rightarrow e(x) \equiv S_1(x) \bmod m_1(x)$$

$$v(x) \equiv S_3(x) \bmod m_3(x)$$

$$\rightarrow e(x) \equiv S_3(x) \bmod m_3(x) \quad [\text{Exp. 4}]$$

If errors are present at degree numbers "i" and "j", e(x) is expressed as follows; $e(x) = x^i + x^j$. Therefore, search the degree numbers "i" and "j", and error locations may be detected, i.e., which data is erroneous will be determined.

So, calculation is performed in $GF(2^n)$ with respect to the indexes of roots α of $m_1(x) = 0$ to search "i" and "j". Assume that the remaining polynomial obtained by dividing $x^n$ by $m_1(x)$ is referred to pn(x), $\alpha^n = pn(\alpha)$. Therefore, unknown numbers $X_1, X_2$ and syndromes $S_1, S_3$ are defined as follows.

$$X_1 pi(\alpha) = \alpha^i$$

$$X_2 = pj(\alpha) = \alpha^j$$

$$S_1 = S_1(\alpha) = \alpha^{\sigma_1}$$

$$S_3 = S_3(\alpha) = \alpha^{\sigma_3} \quad [\text{Exp. 5}]$$

From these definitions, the following Expression 6 will be obtained.

$$e(\alpha) = X_1 + X_2 = S_1$$

$$e(\alpha^3) = X_1^3 + X_2^3 = S_3 \quad [\text{Exp. 6}]$$

Note here that indexes of $X_1$ and $X_2$ are "i" and "j", respectively, and indexes of $S_1$ and $S_3$ are $\sigma_1(=\sigma)$ and $\sigma_3$, respectively.

At a second stage, considering error searching polynomial $\Lambda^R(x)$ in $GF(2^n)$ with unknown numbers $X_1$ and $X_2$, the coefficients are, as shown in the following Expression 7, defined by basic symmetric equations S and D, which are defined by $X_1$ and $X_2$.

$$\Lambda^R(x) = (x - X_1)(x - X_2) = x^2 + Sx + D = 0$$

$$S = S_1 = X_1 + X_2$$

$$D = X_1 X_2 \quad [\text{Exp. 7}]$$

There is a relationship between these coefficients and symmetric equations (i.e., syndromes) $S_1(=S)$ and $S_3$, and the following Expression 8 will be obtained.

$$D = \zeta/S \text{ (where, } \zeta = SD = S^3 + S_3) \quad [\text{Exp. 8}]$$

Next, search the finite field elements satisfying the quadratic equation of: $x^2 + Sx + D = 0$.

(1) First, as a branch of the error searching process, case of S=0 and D=0 will be considered, where double root or zero element is included. If S=0, it designates double root, i.e., one error of $X_1 = X_2 = D^{1/2}$. On the other hand, if one error, and $X_1 = S$. In this case, since S=0, it designates zero error of $X_1 = 0$. Therefore, D=0, and then $\zeta = SD = 0$, i.e., this shows zero error.

If D=0, one root is a zero element, and the other is $X_1 = S$. Therefore, this case is one error, and $\zeta = SD = 0$.

These are summarized in the case of $\zeta = 0$, and the error location is defined by $X_1 = S$. If S=0, no error; and if S≠0, one error.

(2) Second, in case of two errors, error searching is to search index "n" of the root $X = \alpha^n$ of $\Lambda^R(x) = x^2 + Sx + \zeta/S = 0$. In this case, since S≠0 and D≠0, i.e., $\zeta = SD \neq 0$, by use of variable transformation of: x=Sy, the quadratic equation to be solved is transformed to that shown in the following Expression 9.

$$y^2 + y = \zeta/S^3 \quad [\text{Exp. 9}]$$

That is, the error location searching equation is subjected to variable transformation, and variable part and syndrome part thereof are separated from each other.

As described above, as a result of that $\Lambda^R(x)$ is transformed to have the variable part and syndrome part separated from each other, it becomes possible to search "n" the only based on the relationship between indexes. Explaining in other words, compare $y^2 + y$ (where, finite field element is substituted for "y") with $\zeta/S^3$ with a decoder, and search two roots, and two error locations will be obtained. The solution method with a decoder will be explained in detail later.

(3) The case where there are three or more errors includes the following equivalent two cases: one is contradictory case defined by S=0 and $\zeta \neq 0$; and the other is that solution "n" is not searched. That is, in case necessary decoding is impossible, it is judged that there are three or more errors.

Root calculation in case of two errors will be performed as follows. Assume that the index of the result, $\alpha^{2i} + \alpha^i$, that is obtained by substituting $\alpha^i$ for the variable "y" in the variable part $y^2 + y$ is "$y_1$". If this is congruent with index $\sigma(\zeta/S^3)$ of $\zeta/S^3$ in mod h, "i" thereof becomes the index of error position "y". In other words, "i" satisfying the congruence $\sigma(\zeta/S^3) \equiv y_1$ mod h is searched as the index of "y".

If there are not two "i"s satisfying "$y_1$" corresponding the right side index determined from the syndromes, it designates that no solution is searched, i.e., there are three or more bit errors.

A practical error position will be searched as a bit position "n" based on the equation of: $x=Sy=\alpha^{\sigma 1+i}=\alpha^n$. That is, to return index "i" of "y" corresponding to index "$y_i$" to the real index of variable axe, multiply "y" by $S=\alpha^{\sigma 1}$ to search index "n" of the solution "X", and $n \equiv \sigma_1+i$ mod h is the index of the solution "X" corresponding to the error position. With this "X", $\Lambda^R(x)=0$ is satisfied.

[The Principle Explanation of 3EC-EW (Three Error Correction-Error Warning)-BCH System]

Data Encoding

In addition to the irreducible polynomials $m_1(x)$ and $m_3(x)$ used in the 2EC system, another irreducible polynomial $m_5(x)$ with root $\alpha^5$ will be used. Based on these irreducible polynomials $m_1(x)$, $m_3(x)$ and $m_5(x)$, code generation polynomial $g(x)=m_1(x)m_3(x)m_5(x)$ is formed.

Since finite field elements constituting the code of system are "h" excepting zero factor, coefficients of (h−1)-degree polynomial express data. Coefficient parts up to (3n−1)-degree are used as check bits of data. Information polynomial corresponding to Expression 1 will be expressed in the following Expression 10.

$$f(x) = a_{h-1} x^{h-1-3n} + a_{h-2} x^{h-2-3n} + \ldots + a_{3n+2} x^2 + a_{3n+1} x + a_{3n} \quad [\text{Exp. 10}]$$

Information bits in data bits are assigned to coefficients $a_{3n} \sim a_{h-1}$. As shown in the following Expression 11, with respect to polynomial f(x) with the above-described coefficients, polynomial f(x) $x^{3n}$ beginning from 3n-degree is divided by g(x), and the remaining is referred to as r(x).

$$f(x)x^{3n} = q(x)g(x) + r(x)$$

$$r(x) = b_{3n-1} x^{3n-1} + b_{3n-2} x^{3n-2} + \ldots + b_1 x + b_0 \quad [\text{Exp. 11}]$$

The coefficients $b_{3n-1} \sim b_0$ of the remaining polynomial r(x) are used as check bits, which constitute data bits to be stored in the memory together with information bits $a_{h-1} \sim a_{3n}$.

Data Decoding

Errors generated in the data bits are represented by (h−1)-degree error polynomial e(x), and read data from the memory are represented by the polynomial v(x) shown in the following Expression 12.

$$v(x) = f(x)x^{3n} + r(x) + e(x) \quad [\text{Exp. 12}]$$
$$= q(x)g(x) + e(x)$$

Search error polynomial e(x) in the Expression 12, and error correction may be achieved.

At a first stage, v(x) is divided by $m_1(x)$, $m_3(x)$ and $m_5(x)$, and remainders $S_1(x)$, $S_3(x)$ and $S_5(x)$, respectively, are obtained as syndromes as shown in Expression 13. These remainders are also those of e(x)

$$v(x) \equiv S_1(x) \bmod m_1(x)$$
$$\rightarrow e(x) \equiv S_1(x) \bmod m_1(x)$$
$$v(x) \equiv S_3(x) \bmod m_3(x)$$
$$\rightarrow e(x) \equiv S_3(x) \bmod m_3(x)$$
$$v(x) \equiv S_5(x) \bmod m_5(x)$$
$$\rightarrow e(x) \equiv S_5(x) \bmod m_5(x) \quad [\text{Exp. 13}]$$

If errors are present at degree numbers "i", "j" and "k", e(x) is represented as follows: $e(x)=x^i+x^j+x^k$. Therefore, search degree numbers "i", "j" and "k", and error locations may be decided, i.e., which data is erroneous will be determined.

So, calculation is performed in $GF(2^n)$ with respect to the indexes of roots $\alpha$ of $m_1(x)=0$ to search "i", "j" and "k". Assume that the remaining polynomial obtained by dividing $x^n$ by $m_1(x)$ is referred to pn(x), $\alpha^n=pn(\alpha)$. Therefore, unknown numbers $X_1$, $X_2$ and $X_3$, and syndromes $S_1$, $S_3$ and $S_5$ are defined as follows.

$$X_1 = pi(\alpha) = \alpha^i$$
$$X_2 = pj(\alpha) = \alpha^j$$
$$X_3 = pk(\alpha) = \alpha^k$$
$$S_1 = S_1(\alpha) = \alpha^{\sigma 1}$$
$$S_3 = S_3(\alpha) = \alpha^{\sigma 3}$$
$$S_5 = S_5(\alpha) = \alpha^{\sigma 5} \quad [\text{Exp. 14}]$$

From these definitions, the following Expression 15 will be obtained.

$$e(\alpha) = X_1 + X_2 + X_3 = S_1$$
$$e(\alpha^3) = X_1^3 + X_2^3 + X_3^3 = S_3$$
$$e(\alpha^5) = X_1^5 + X_2^5 + X_3^5 = S_5 \quad [\text{Exp. 15}]$$

Note here that indexes of $X_1$, $X_2$ and $X_3$ are "i", "j" and "k", respectively, and indexes of $S_1$, $S_3$ and $S_5$ are $\sigma_1(=\sigma)$, $\sigma_3$ and $\sigma_5$, respectively.

At a second stage, as shown in the following Expression 16, consider error searching polynomial $\Lambda^R(x)$ in $GF(2^n)$ with roots of unknown numbers $X_1$, $X_2$ and $X_3$.

$$\Lambda^R(x) = (x-X_1)(x-X_2)(x-X_3) = x^3 + Sx^2 + Dx + T = 0$$
$$S = S_1 = X_1 + X_2 + X_3$$
$$D = X_1 X_2 + X_2 X_3 + X_3 X_1$$
$$T = X_1 X_2 X_3 \quad [\text{Exp. 16}]$$

There are two solution methods for the above-described polynomial. First decoding solution method 1 will be firstly explained below.

(3EC-EW, First Decoding Solution Method 1)

As shown in Expression 16, the coefficients S, D and T in $\Lambda^R(x)$ are basic symmetric equations of $X_1$, $X_2$ and $X_3$. There is a relationship between these coefficients and symmetric equations (i.e., syndromes) $S_1(=S)$, $S_3$ and $S_5$, and the following Expression 17 will be obtained.

$$\zeta D = \zeta S^2 + \eta$$
$$\zeta T = \zeta S_3 + \eta S + \zeta^2 \quad [\text{Exp. 17}]$$

(where, $SD+T=S^3+S_3=\zeta$ and $S_3 D+S^2 T-S^5+S_5=\zeta$)

Error searching, i.e., root searching of $\Lambda^R(x)=0$ will be branched to the two error case, three error case and four or more error case as explained below.

(1) In case the solution includes zero element or double root, it is judged to include two errors, so that the system is branched to 2EC-EW. That is, zero element is included as a root, T=0, while in case of double root, it becomes equivalent to SD=T based on $x^3+Sx^2+Dx+T=(x+S)(x^2+D)$. Therefore, $\zeta=0$ is derived from $\zeta SD=S(\zeta S^2+\eta)=\zeta T=\zeta S^3+\eta S+\zeta^2$ and $\zeta T=0$ is satisfied, so that this case is branched to 2EC-EW.

(2) If $\zeta T \neq 0$, it is 3EC-EW. In this case, if $\eta=0$, $X^3+Sx^2+Dx+T=(x+S)^3+\zeta$ is obtained from $D=S^2$ and $T=S^3+\zeta$, and this designates one error of triple root. However, if one error, then ζ=0. These are contradictory. Therefore, in this case, η≠0. If η=0, then four errors or more.

(3) Equivalent to cases (1) and (2) where solution "n" is not searched in the solution search process in 2EC-EW branch and 3EC-EW branch, it is judged that there are four or more errors.

It will be summarized below such a case that the cubic equation on $GF(2^n)$ has roots excepting non-zero three roots. That is, if zero element is included as one of three roots or double root is included, it becomes two roots or less. Such condition will be searched.

In case zero element is a solution, T=0. This case results in the quadratic equation search as shown in the following Expression 18.

$$x^3+Sx^2+Dx+T=(x+a)(x^2+b) \quad [\text{Exp. 18}]$$

In this case, T=ab=SD is obtained from a=S, b=D and ab=T, and SD+T=0. Additionally, since ζ=SD+T, and ζ=0. Therefore, ζT=0 is a condition for branching to 2EC-EW. This coincides with the above described consideration.

In case there are three errors, in place of the method of sequentially substituting finite field elements for "x" to search a solution, it will be used such a method as to prepare solution candidates as table in advance, and then search index "n" of root $x=\alpha^n$ of $\Lambda^R(x)=0$ by use of the table. The calculation method will be explained below.

First, the polynomial of the error search equation, $\Lambda^R(x)$, is transformed, the variable part and syndrome part are separated from each other. By use of this, solution "n" may be searched based on the relationships between indexes of the solution candidates and the syndrome indexes.

Explaining in detail, the following variable transformation as shown in Expression 19 is performed for $\Lambda^R(x)=x^3+Sx^2+Dx+T=x^3+Sx^2+(S^2+\eta/\zeta)x+(S^3+\eta S/\zeta+\zeta)$.

$$x=az+b$$

$$a=(\eta/\zeta)^{1/2}$$

$$b=S \quad [\text{Exp. 19}]$$

As a result of this variable transformation, the following Expression 20 will be obtained because of η≠0 in the case of three errors, $$z^3+z=\zeta^{5/2}/\eta^{3/2} \quad [\text{Exp. 20}]$$

When solving this variable-transformed equation, basic indexes necessary from the syndrome calculation are as follows: $\sigma_1$ of $S_1$, $\sigma_3$ of $S_3$, $\sigma_5$ of $S_5$, ζ of $\sigma_\zeta$, η of $\sigma_\eta$ and $\sigma_a$ of $a=(\eta/\zeta)^{1/2}$.

Index $Z_j$ of $\alpha^{3j}+\alpha^j=\alpha^{zj}$ are preliminary searched by substituting $\alpha^j$ for the variable part "z" in the equation, and summarized in a table.

On the other hand, the index of the syndrome part $\zeta^{5/2}/\zeta^{3/2}$ is (5/2) $\sigma_\zeta=(3/2)\sigma_\eta$. Therefore, "j" satisfying $(5/2)\sigma_\zeta-(3/2)\sigma_\eta\equiv Z_j$ mod h is that transformed from the error index. The practical error position may be searched from the following process: search $\sigma_x$ of $\sigma_{a+j}\equiv\sigma_x$ mod h from $az=\alpha^{\sigma a+j}=\alpha^{\sigma x}$; and search the bit position "n" of $X=az+S=\alpha^{\sigma X}+\alpha^{\sigma 1}=\alpha^n$.

Note here that if there is not searched "j" corresponding to $z_j$, there are four or more errors.

The branch in the error search process, which is necessary for constituting the 3EC-EW circuit system, will be summarized as follows:

As explained above, ζT=0 designates that the root has zero element or double root. Therefore, when ζ≠0, perform 3-error searching calculation. If there is not searched three errors, or equivalently η=0, it is judged that there are four or more errors.

When ζT=0, branch to 2EC-EW or more less error level. Since ζ≠0 in 2EC-EW, if ζ≠0, search 2-error. In case two solutions are not searched or S=0 (i.e., contradictory), there are four or more errors.

In case of ζT=0 and ζ=0, it is judged as one error or less. This is equivalent to the case of ζ=0 and η=0, and $X_1=S$ at the error position. If S=0, it designates no error.

These will be summarized as follows:
(1) If ζ=0 and η=0, one error with $X_1=S$ (including zero error, S=0).
(2) If ζ≠0 and ζT=0, it is branched to 2EC-EW. In case of S=0 and there are not obtained two solutions, four or more errors.
(3) If ζ≠0 and ζT≠0, it is branched to 3EC-EW. In case of η=0 and there are not obtained three solutions, four or more errors.

FIG. 1 shows the configuration of the REC-EW system with the first decoding solution method 1 described above.

Input to encode part 20 is information polynomial f(x) with coefficients $\alpha^{3n}\neq a^{h-1}$, to which h−1−3n data bits are assigned. Only coefficients of suitable degrees necessary for data bits are selected as information bits, and other coefficients, which are not used, are dealt with fixed data ("0" or "1"). With these fix data, which are not stored in the memory, the system may be constructed to be adaptable to the memory capacitance.

Encode part 20 divides f(x) $x^{3n}$ by the code generating polynomial g(x) to obtain the remainder r(x), and write the coefficients of the polynomial f(x) $x^{3n}+r(x)$ as data bits into the memory core 10. h-bit read data of the memory core 10 will be dealt with coefficients of (h−1)-degree polynomial σ(x).

Memory core 10 includes, for examples, a NAND-type flash memory with an MLC (multi-level cell) scheme, a ReRAM, a PCRAM and the like. The memory core 10 will be explained in detail below.

Figure 2:
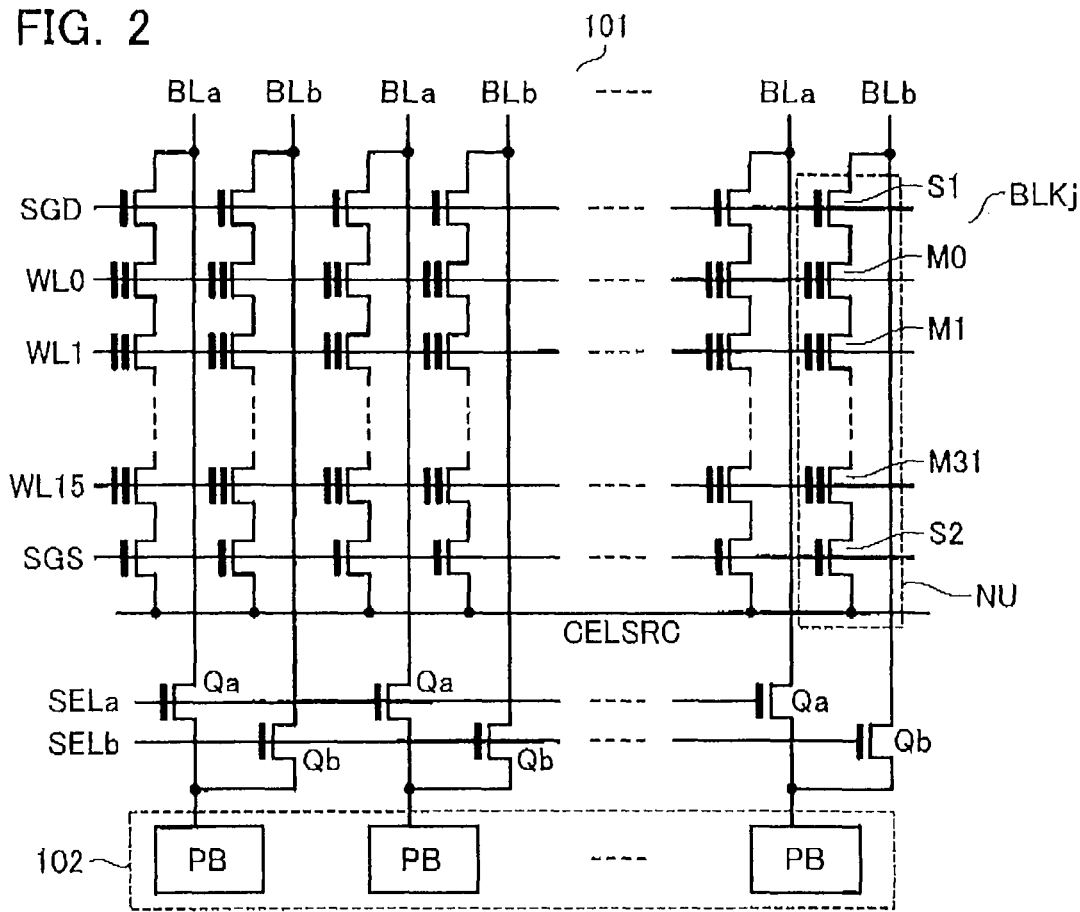
FIG. 2 shows a NAND-type flash memory cell array as an example used in the memory core.

FIG. 2 shows cell array 101 and sense amplifier array 102, which constitute a NAND-type flash memory. Cell array 101 has NAND cell units (i.e., NAND strings) each having floating gate type of non-volatile memory cells M0-M31 connected in series. Specifically, in case the NAND-type flash memory is of a multi-level data storage scheme, the ECC system in this embodiment is effective.

Figure 3:
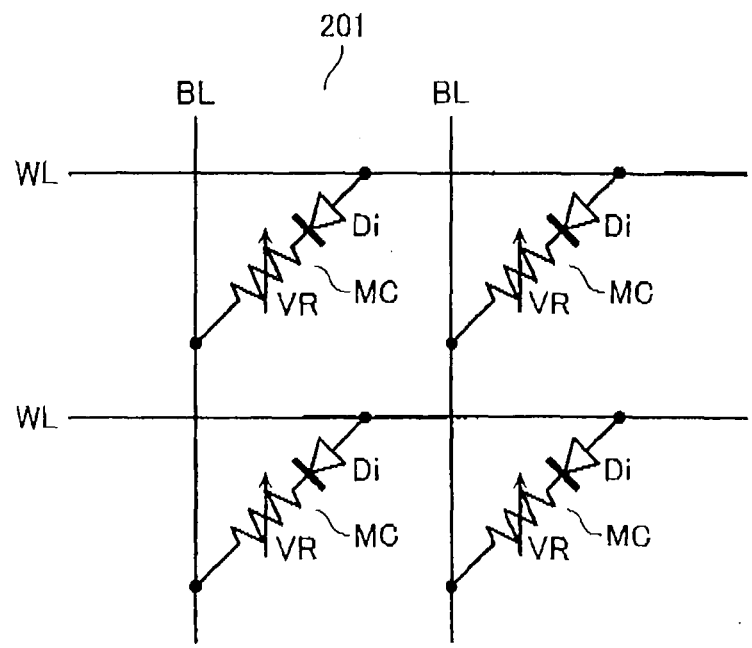
FIG. 3 shows a ReRAM cell array as another example used in the memory core.
Figure 4:
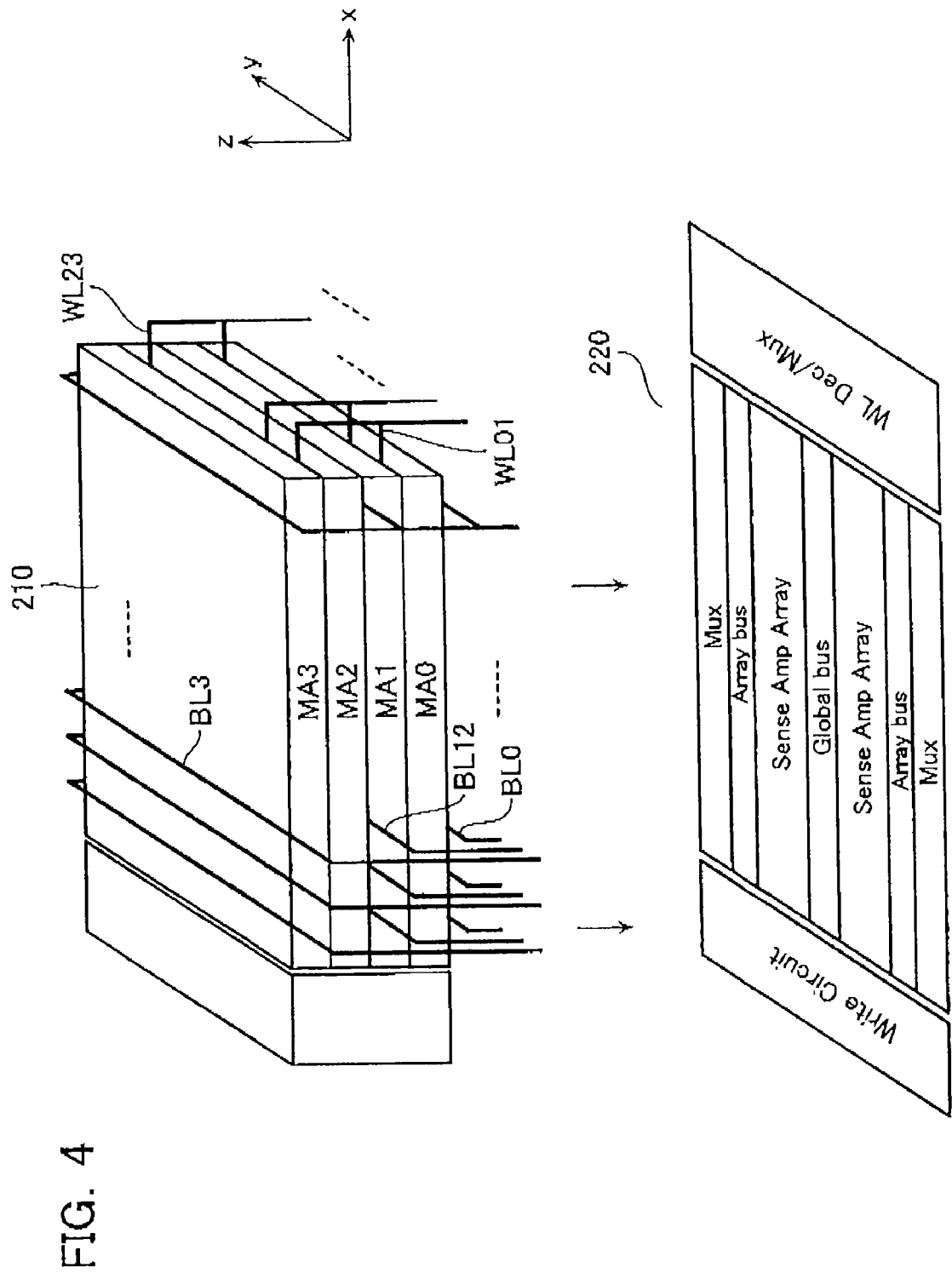
FIG. 4 shows a three dimensional ReRAM cell array.

FIG. 3 shows ReRAM cell array 201 with memory cells each having variable resistance element VR and diode Di connected in series. In detail, in the ReRAM with a large capacity, as shown in FIG. 4, there is used three-dimensional cell array 210 with multiple cell arrays MA0-MA3 stacked on the underlying semiconductor substrate, on which read/write circuit 220 is formed.

Parts for decoding read data v(x) and error-searching are as follows.

First, it is syndrome operation part 30 that searches syndromes $S_1$, $S_3$ and $S_5$. That is, divide v(x) by $m_1(x)$, $m_3(x)$ and $m_5(x)$ to obtain the remainders, and syndromes $S_1$, $S_3$ and $S_5$ will be obtained from the respective remainders.

Next, parity checks between $S^3$ and $S_3$ and between $S^5$ and $S_5$ are performed with parity checkers 41 and 42, ζ and η are searched, respectively. With respect to these indexes in the calculation, expression indexes are used, which are distinguished from each other with mod p, mod q and mode r, where prime factors "p", "q" and "r" of h (=pqr).

That is, in the adder calculation, syndrome $S_1$, $S_3$ and $S_5$, and ζ and η are subjected to addition of binary numbers with expression indexes. In the parity check, finite field elements are represented as (n−1)-degree polynomial, and coefficients of the respective degrees are subjected to parity check, so that coefficients of polynomial with additional elements are obtained.

If all of S, ζ and η are zero, gate 71 detects it to output a signal "no error". If S is not zero, gate 72 detects it to output a signal "1 error)". In receipt of this output, Sy adder 54 output "n" as the index of S.

If ζ is zero and η is not zero, gate 73 outputs a signal designating that there is no solution in 1EC, i.e., "no solution 1EC" that designates there are two or more errors.

Next, indexes of "a" and "Sa²", each being product or quotient between powers of syndromes S, $S_3$ and $S_5$, and ζ and η, are calculated in adder circuits 51 and 54. In these circuits, calculations are performed with congruences of mod p, mod q and mod r, and resultant expression indexes are used in the successive processing.

4-input parity checker 43 searches "T" that is an addition of $S_3$, $Sa^2$ and ζ of three elements. This parity checker is for performing addition of mod 2 between coefficients of the same degrees of the polynomial expressed by the input indexes. Vss is input to the remaining input node(s) of this parity checker.

Adder circuits 53 and 54 are for searching "y" based on $y^2+y=\zeta/S^3$ corresponding to 2EC and calculating the expression index of error position "n" by transformation of x=Sy. The input portion of adder circuit 53 receives ζ and $S^{-3}$ and calculates the expression index of $\zeta/S^3$ of the syndrome part in the solution searching polynomial. The calculated result, "S" and "1 error" are input to the input portion of the next adder circuit 54, and index "i" of "y" satisfying $y^2+y=0$ will be decoded at the input portion.

If 1 error, $\zeta/S^3$ becomes zero, then there is no index of $\zeta/S^3$ in spite of that there are two solutions y="1" and "zero" satisfying $y^2+y=0$. That is, there is no index output from the preceding adder circuit. Therefore, when 1 error, the signal is directly received at the gate 72 of the syndrome calculation part, and the index of "y" satisfying $y^2+y=0$ will be decoded. In this case, the solution is decoded as "1 error". Including this case, expression indexes will be output as corresponding to indexes "n" of two errors from "i" as a result of decoding and index $\sigma_1$.

Further, in case there is not searched index "i" of the decoding result "y" at the input portion, it designates that 2EC system is not adaptable, so that signal "no solution 2EC" is generated. In case whether this signal is output or S=0 (double root), there is no solution in the 2EC-EW system, and gate 75 generates signal "not solved 2EC".

Adder circuits 55 and 56 are for searching "z" based on $z^3+z=\zeta^{5/2}/\eta^{3/2}$ corresponding to 3EC and calculating the expression index of transformation of X=az. The adder circuit 55 receives expression indexes of $\zeta^{5/2}$ and $\eta^{-3/2}$ to output the expression index of $\zeta^{5/2}/\eta^{3/2}$.

The next adder circuit 56 is for searching "z" based on $z^3+z=\zeta^{5/2}/\eta^{3/2}$ corresponding to 3EC and calculating the expression index of $\sigma_x$ based on the transformation of az. The input signals of this adder are resultant $z_i$ of the preceding portions and the expression index of index $\sigma_a$ of "a".

At the input portion of adder 56, index "j" satisfying $z^3+z=\zeta^{5/2}/\eta^{3/2}$ will be decoded. Based on the relationship between the decode result "j" and "a", the expression index of index "az" corresponding three errors from the expression index $\sigma_a$. In case there is not searched index "j" of the decoding result "z" at the input portion, it designates that 3EC system is not adaptable, so that signal "no solution 3EC" is generated.

In case whether this signal is output or η=0, there is no solution in the 3EC-EW system, and gate 76 generates signal "not solved 3EC".

Parity checker 44 disposed on the right end calculates the expression index of error position "n" as the index of "X", i.e., as the sum of X=az+S.

The signal "non correctable", which is generated when there are four or more errors and it is not correctable, will be generated from OR gate 74 when there is obtained "no solution 1EC" or "not solved 2EC" or "not solved 3EC".

Error correcting part 60 is a logic circuit, which finally corrects the read data of the memory core 10 and outputs it. Where the error location information from 2EC part is used is the case of T=0, i.e., ζ=0 or T=0. Therefore, gate 62 is on by "0" output of gate 61, so that error position information from 3EC is not used. In case 2EC condition is not satisfied, gate 62 is off while gate 63 is on, so that the error position information from 3EC will be used.

When error position information is input, the coefficient of data polynomial v(x) corresponding to the error position is inverted in logic at XOR gate 64, and corrected data "$d_n$" is output. In case of "no error" or "non correctable", gate 77 outputs through signal "through", and read data will be output as it is as data "$d_n$".

(3EC-EW, Second Decoding Solution Method 2)

Next, Second Decoding Solution Method 2 of 3EC-EW will be explained below. This is a method which is desirable for sharing circuit systems when branching to 4EC-EW.

The coefficients "D" and "T" of the error searching polynomial, i.e., cubic polynomial $\Lambda^R(x)$ shown in Expression 16 constitute simultaneous equations containing two variables together with S, ζ and η as shown in the following Expression 21

$$SD+T=\zeta$$

$$(\zeta+S^3)D+S_2T=\eta \qquad [\text{Exp. 21}]$$

To express "D" and "T" by the syndromes, the simultaneous equations will be solved. Since the coefficient matrix becomes ζ, equations to be solved are represented as follows:

$$\zeta D=\zeta S^2+\eta; \text{ and } \zeta T=\zeta S^3+\eta S+\zeta^2.$$

If ζ≠0, "D" and "T" will be decided. Therefore, go to the process of searching the error searching equation $\Lambda^R(x)=0$. If ζ=0, one of the unknowns, for example "T", is optionally set, and "D" may be searched in accordance with a method of solving the simultaneous equations with two elements. However, if three errors are generated, there is no optional relationship among "S", "D" and "T". Therefore, in case the optional relationship is satisfied, it designates four errors, or two errors or less. If there is not obtained a solution in the branch of 2EC-EW, it designates four or more errors.

So, a cubic equation will be solved under the condition of ζ≠0. The cubic equation will be divided into a linear equation and a quadratic equation. The solution method will be explained below.

To cancel the 2nd degree term in the cubic equation of $X^3+SX^2+DX+T=0$, it is subjected to the following transformation of X=x+S, and A=η/ζ is set. Since η≠0 in case of three roots, A≠0, and the following Expression 22 is obtained.

$$x^3+Ax+\zeta=0 \qquad [\text{Exp. 22}]$$

This equation may be represented as a product of linear equation x+α and quadratic equation $x^2+\beta_1 x+\beta_0$ as shown in the following Expression 23.

$$X^3+Ax+\zeta=(x+\alpha)(x^2+\beta_1 x+\beta_0)=0 \qquad [\text{Exp. 23}]$$

Here, using $\beta_0=\delta$, and $\alpha\beta_0=\zeta$, $\alpha\beta_1+\beta_0=A$ and $\alpha+\beta_1=0$, a cubic equation with an unknown $(\delta+A)/A$ will be obtained as shown in the following Expression 24.

$$\{(\delta+A)/A\}^3+\{(\delta+A)/A\}+\zeta^2/A^3=0 \quad [\text{Exp. 24}]$$

Since, in this equation, the syndrome part and unknown part are separated from each other, it may be solved with a table decoding scheme. For example, one root $(\delta+A)/A$ is selected. $\alpha=\beta_1=(A+\delta)^{1/2}$, and the root $\delta=\beta_0$ of the cubic equation are obtained, and coefficients of polynomial factors may be obtained.

As described above, linear and quadratic equations to be solved are decided, and the quadratic equation with unknown part and syndrome part separated from each other will be obtained as the following Expression 25.

$$(x/\beta_1)^2+(x/\beta_1)+\beta_0/\beta_1^2=0 \quad [\text{Exp. 25}]$$

Solve this equation, and it will be obtained two solutions together with $x=\alpha$. Using $X=x+S$, it is searched the real error position.

The solving method of the error searching cubic equation will be formalized here for making it printed on a circuit system. The cubic equation to be solved is represented as follows: $w^3+w=\zeta^5/\eta^3$. Since $\zeta\neq 0$, it is confirmed that "w" is not zero element or "1".

When selecting one root "w", $\beta_0=(w+1)\eta/\zeta$, and $\beta_1=\alpha=(w\eta/\zeta)^{1/2}$ are obtained. Since $\beta_0/\beta_1^2=(w+1)/w$, the quadratic error searching equation will be as follows: $z^2+z=(w+1)/w$. Since $(w+1)/w\neq 0$, two roots "$z_1$" and "$z_2$" are obtained. As a result, together with the root $\alpha=\beta_1$ of the linear equation, three error position solutions will be obtained as follows: $X_1=\beta_1+S$; $X_2=\beta_1 z_1+S$; and $X_3=\beta_1 z_2+S$.

Prior to the forming of 3EC-EW system in accordance with the Second Decoding Solution Method 2 described above, branch conditions in the three-error searching system will be summarized bellows. The basic conditions are the same as in the above-described case.

In case of coefficient matrix $\zeta=0$, the solutions of the simultaneous equations are not decided. Therefore, three error searching is performed under the condition of $\zeta\neq 0$. If three errors are not searched, or $\eta=0$, it designates that there are four or more errors. That is, three error searching result is used at $\eta\neq 0$ and $T\neq 0$.

If $T=0$, branch to 2EC-EW (or less) system. Since $\zeta\neq 0$ in the 2EC-EW system, two error searching is performed under the condition of $\zeta\neq 0$. If two solutions are not searched, or $S=0$, it designates that there are four or more errors.

$\zeta=0$ designates "1 error". This is equivalent to $\zeta=0$ and $\eta=0$, and error position is $X_1=S$. $S=0$ designates "no error". If $\eta\neq 0$, it designates that there are 4 errors or more.

These are summarized as follows.

(1) If $\zeta=0$ and $\eta=0$, and $X_1=S$ (including zero error, $S=0$). If $\eta\neq 0$, four or more errors.

(2) If $\zeta\neq 0$ and $T=0$, branch to 2EC-EW When $S=0$ and two solutions are not obtained, four or more errors.

(3) If $\zeta\neq 0$ and $T\neq 0$, branch to 3EC-EW. When $n=0$ and three solutions are not obtained, four or more errors.

Figure 5:
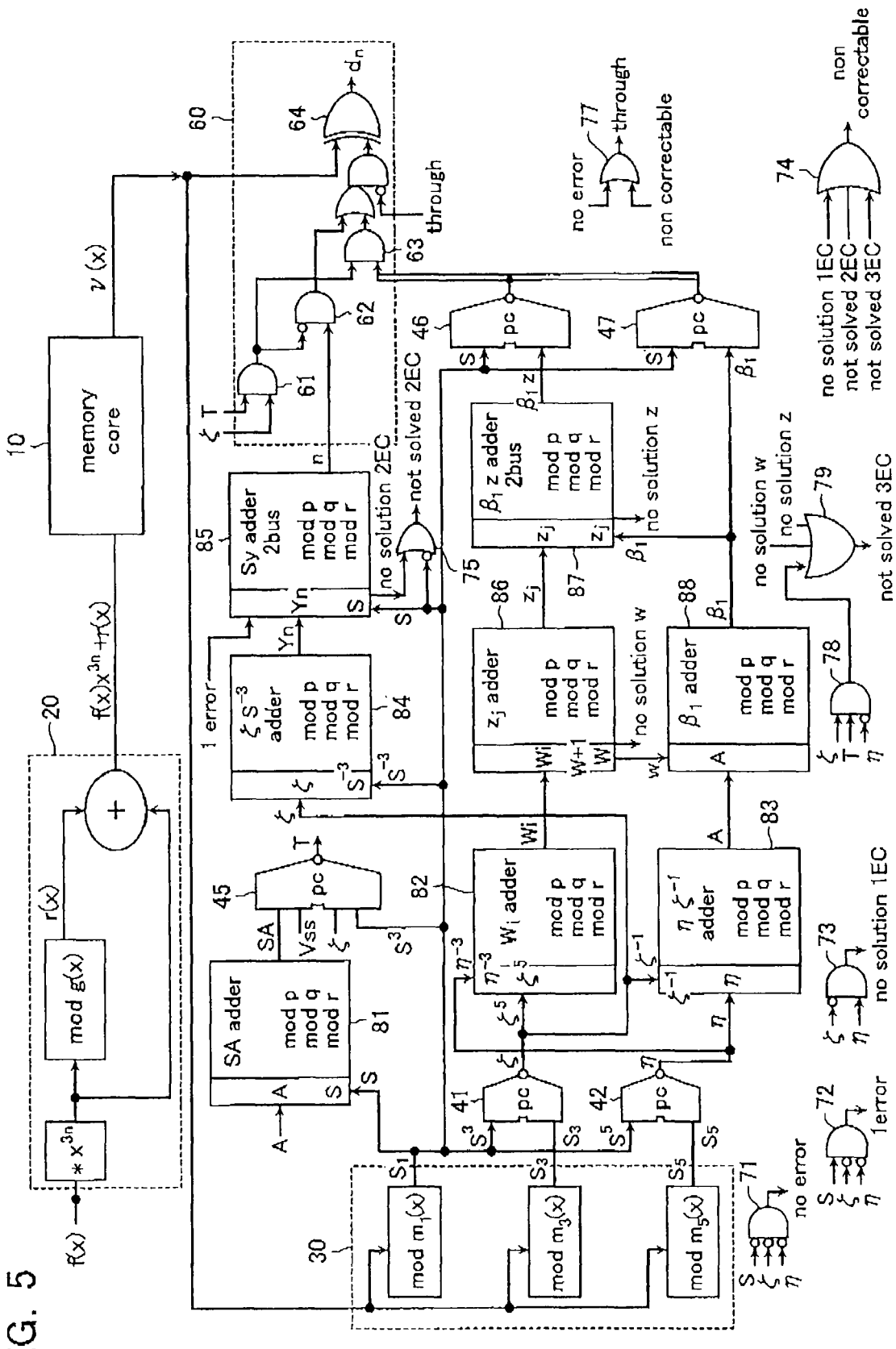
FIG. 5 shows another 3EC-BCH-ECC system.

FIG. 5 shows the 3EC-EW-BCH system, to which the above-described Solution Method 2 is adapted, and it is possible to correct up to three bits and output warning when four or more errors, in correspondence with that shown in FIG. 1. The same portions as in FIG. 1 are designated by the same symbols as in FIG. 1.

Memory core 10, encode part 20, syndrome operation part 30 are the same as those in FIG. 1. The error position calculating method with syndromes is basically the same as in the above-described case.

Indexes of $w_i=\zeta^5\eta^{-3}$ and $A=\eta\zeta^{-1}$, each of which is product or quotient between powers of syndromes S, $S_3$ and $S_5$, and $\zeta$ and $\eta$, are calculated in adder circuits 82 and 83. Adder circuit 81 calculates the product SA of A and S by use of congruences of mod p, mod q and mod r, and resultant expression indexes are used in the following processing.

4-input parity checker circuit 45 is for searching T that is the sum of three elements $S^3$, SA and $\zeta$. This parity checker is for searching the sum of coefficients of mod 2 at the same degrees of polynomials, which are reformed of the input indexes. Input to the remaining input(s) is Vss.

Adder circuits 84 and 85 are for searching "y" based on $y^2+y=\zeta/S$ corresponding 2ECr and then calculating the expression index of error position "n" based on the transformation of $X=Sy$. Inputs of the adder circuit 84 are $\zeta$ and $S^{-3}$, and this input portion is for calculating the expression index of the syndrome part of the solution searching polynomial. Inputs of the adder circuit 85 is the result of the adder circuit 84, S and signal "1 error", and this input portion decodes the index "i" of "y" satisfying $y^2+y=\zeta/S^3$.

When 1 error, $\zeta/S^3$ becomes zero, i.e., there is no index of $\zeta/S^3$ to be output from the former adder circuit in spite of that there are "1" and zero as "y" satisfying $y^2+y=0$. Therefore, signal "1 error" is directly received from gate 72, which is disposed at the syndrome calculation part, and index of "y" satisfying $y^2+y=0$ is decoded. In this case, 1-error solution will be decoded.

Including this case, from decoded "i" and index $\sigma_1$ of "S", expression indexes of indexes "n"s corresponding to two errors are output as the calculation result. In case index "i" of "y" is not searched as a decode result at the input portion, 2EC system is not adaptable, so that signal "no solution 2EC" is generated. When this signal is generated, or $S=0$, there is not obtained solutions in 2EC-EW, so that gate 75 generates signal "not solved 2EC".

Adder circuits 86, 87 and 88, corresponding to 3EC system, are for obtaining "w" and "w+1" based on $w^3+w=\zeta^5/\eta^3$, thereby calculating $z_1=(w+1)/w$; searching $\beta_1=(Aw)^{1/2}$; and obtaining "z" based on $z^2+z=z_j$, thereby calculating the expression index of transformation of $X=\beta_1 z$, respectively.

The initial adder circuit 86 receives the expression index of $w_i=\zeta^5/\eta^3$ to decode "w" satisfying $w^3+w=w_1$, and calculates $(w+1)/w$ to output "$z_j$". If there is no corresponding "w", there is no solution. Therefore, signal "no solution w" is generated for designating that it is not solvable.

Adder circuit 88 calculates Aw based on two outputs "A" and "w", and generates the power $(Aw)^{1/2}$ as $\beta_1$.

Adder circuit 87 searches "z" based on $z^2+z=z_i$ corresponding two errors of 3EC, and calculates the expression index of the transformation of $\beta_1 z$. Input to the adder circuit 87 are the preceding result $z_j$ and the expression index of $\beta_1$, and this input portion decodes the index "j" of "z" satisfying $z^2+z=z_j$. From the decoded results "j" and $\beta_1$, the expression index corresponding to two errors will be output as the calculation result.

In case there is not searched the index "j" of "z" at the input portion, it designates that there is no solution, so that signal "no solution z" is generated.

In case there is not searched solution in accordance with the 3EC decoding method, and signal "no solution w" or "no solution z" is generated, or in case of $\eta=0$ in 3EC, it is not solvable in 3EC-EW, so that gate 79 generates signal "not solved 3EC".

Parity checker circuits 46 and 47 calculate $X=\beta_1 z+S$ and $X_1+S$, respectively, and calculate the expression indexes of error positions "n" as the indexes of "X".

Signal "non correctable" will be obtained through OR gate 74 when signal "no solution 2EC", "solved 2EC" or "solved 3EC" is generated.

Data correcting part 60 is the same as that shown in FIG. 1. That is, the case where the error position information from 2EC portion is used is that of ζ=0 or T=0. In this case, the error position information from 3EC is not used.

The information from 3EC is used when the condition of 2EC is not satisfied, and the coefficients of data polynomial v(x) corresponding to error positions "n"s are inverted by XOR logic to be generated as corrected data "$d_n$". When signal "no error" or "non correctable" is generated, through signal "through" is generated, and data "$d_n$" is output as it is.

Next, 4-bit error correction system, which is perhaps the maximum error correctable number in case on-chip decoders of the finite field elements are used and high-speed data processing is performed, will be explained.

[The Principle Explanation of 4EC-EW (Four Error Correction-Error Warning)-BCH System]

Data Encoding

In addition to the irreducible polynomials $m_1(x)$, $m_3(x)$ and $m_5(x)$ used in the 3EC system, another irreducible polynomial $m_7(x)$ with root $\alpha^7$ will be used. Based on these irreducible polynomials $m_1(x)$, $m_3(x)$, $m_5(x)$ and $m_7(x)$, code generation polynomial $g(x)=m_1(x)m_3(x)m_5(x)m_7(x)$ is formed.

Since finite field elements constituting the code of system are "h" excepting zero factor, coefficients of (h−1)-degree polynomial express data, Coefficient parts up to (4n−1)-degree are used as check bits of data. Information polynomial will be expressed in the following Expression 26.

$$f(x) = a_{h-1}x^{h-1-4n} + a_{h-2}x^{h-2-4n} + \ldots + a_{4n+2}x^2 + a_{4n+1}x + a_{4n} \quad [\text{Exp. 26}]$$

Information bits in data bits are assigned to coefficients $a_{4n} \neq a_{h-1}$. As shown in the following Expression 27, with respect to polynomial f(x) with the above-described coefficients, polynomial $f(x)x^{4n}$ beginning from 4n-degree is divided by g(x), and the remaining is referred to as r(x).

$$f(x)x^{4n} = q(x)g(x) + r(x)$$

$$r(x) = b_{4n-1}x^{4n-1} + b_{4n-2}x^{4n-2} + \ldots + b_1 x + b_0 \quad [\text{Exp. 27}]$$

The coefficients $b_{4n-1} \sim b_0$ of the remaining polynomial r(x) are used as check bits, which constitute data bits to be stored in the memory together with information bits $a_{h-1} \sim a_{4n}$.

Data Decoding

Errors generated in the data bits are expressed by (h−1)-degree error polynomial e(x), and read data from the memory are expressed by the polynomial v(x) shown in the following Expression 28.

$$v(x) = f(x)x^{4n} + r(x) + e(x) \quad [\text{Exp. 28}]$$
$$= q(x)g(x) + e(x)$$

Search error polynomial e(x) from read data, and error correction may be achieved.

At a first stage, v(x) is divided by $m_1(x)$, $m_3(x)$, $m_5(x)$ and $m_7(x)$, and remainders $S_1(x)$, $S_3(x)$, $S_5(x)$ and $S_7(x)$, respectively, are obtained as syndromes as shown in Expression 29. These remainders are also those of e(x).

$$v(x) \equiv S_1(x) \bmod m_1(x)$$
$$\rightarrow e(x) \equiv S_1(x) \bmod m_1(x)$$
$$v(x) \equiv S_3(x) \bmod m_3(x)$$
$$\rightarrow e(x) \equiv S_3(x) \bmod m_3(x)$$
$$v(x) \equiv S_5(x) \bmod m_5(x)$$
$$\rightarrow e(x) \equiv S_5(x) \bmod m_5(x)$$
$$v(x) \equiv S_7(x) \bmod m_7(x)$$
$$\rightarrow e(x) \equiv S_7(x) \bmod m_7(x) \quad [\text{Exp. 29}]$$

If errors are present at degrees "i", "j", "k" and "l", e(x) is represented as follows: $e(x) = x^i + x^j + x^k + x^l$. Therefore, search degrees "i", "j", "k" and "l", and error locations may be decided, i.e., which data is erroneous will be determined.

So, calculation is performed in GF($2^n$) with respect to the indexes of roots $\alpha$ of $m_1(x)=0$ to search "i", "j", "k" and "l". Assume that the remaining polynomial obtained by dividing $x_n$ by $m_1(x)$ is referred to as pn(x), $\alpha^n = pn(\alpha)$. Therefore, unknown numbers $X_1$, $X_2$, $X_3$ and $X_4$, and syndromes $S_1$, $S_3$, $S_5$ and $S_7$ are defined as follows.

$$X_1 = pi(\alpha) = \alpha^i$$
$$X_2 = pj(\alpha) = \alpha^j$$
$$X_3 = pk(\alpha) = \alpha^k$$
$$X_4 = pl(\alpha) = \alpha^l$$
$$S_1 = S_1(\alpha) = \alpha^{\sigma 1}$$
$$S_3 = S_3(\alpha) = \alpha^{\sigma 3}$$
$$S_5 = S_5(\alpha) = \alpha^{\sigma 5}$$
$$S_7 = S_7(\alpha) = \alpha^{\sigma 4} \quad [\text{Exp. 30}]$$

From these definitions, the following Expression 31 will be obtained, $$e(\alpha) = X_1 + X_2 + X_3 + X_4 = S_1$$
$$e(\alpha^3) = X_1^3 + X_2^3 + X_3^3 + X_4^3 = S_3$$
$$e(\alpha^5) = X_1^5 + X_2^5 + X_3^5 + X_4^5 = S_5$$
$$e(\alpha^7) = X_1^7 + X_2^7 + X_3^7 + X_4^7 = S_7 \quad [\text{Exp. 31}]$$

Note here that indexes of $X_1$, $X_2$, $X_3$ and $X_4$ are "i", "j", "k" and "l", respectively, and indexes of $S_1$, $S_3$, $S_5$ and $S_7$ are $\sigma_1(=\sigma)$, $\sigma_3$, $\sigma_5$ and $\sigma_7$, respectively.

At a second stage, as shown in the following Expression 32, consider error searching polynomial $\Lambda^R(X)$ in GF($2^n$) with roots of unknown numbers $X_1$, $X_2$, $X_3$ and $X_4$, $$\Lambda^R(x) = (x - X_1)(x - X_2)(x - X_3)(x - X_4) \quad [\text{Exp. 32}]$$
$$= x^4 + Sx^3 + Dx^2 + Tx + Q = 0$$
$$S = S_1 = X_1 + X_2 + X_3 + X_4$$
$$D = X_1 X_2 + X_2 X_3 + X_3 X_4 + X_4 X_1$$
$$T = X_1 X_2 X_3 + X_2 X_3 X_4 + X_3 X_4 X_1 + X_4 X_1 X_2$$
$$Q = X_1 X_2 X_3 X_4$$

There is a certain relationship between these coefficients and syndromes $S_1 = S$, $S_3$, $S_5$ and $S_7$, which constitute simultaneous equations as shown in the following Expression 33.

$$SD + T = \zeta$$
$$(\zeta + S^3)D + S^2 T + SQ = \eta$$
$$(\eta + S^5)D + S^4 T + (\zeta + S^3)Q = \theta \quad [\text{Exp. 33}]$$

"D", "T" and "Q" may be obtained by solving the simultaneous equations. Note here that $\zeta = S^3 + S_3$, $\eta = S^5 + S_5$ and $\theta = S^7 + S_7$ are set for the convenience of calculation.

To express "D", "T" and "Q" with syndromes, the above-described simultaneous equations containing three variables may be solved with coefficient matrix of Γ as shown in the following Expression 34.

$$\Gamma = S^3\zeta + S\eta + \zeta^2$$

$$\Gamma_D = S^3\eta + S^2\zeta^2 + S\theta + \zeta\eta$$

$$\Gamma_T = S^4\eta + S^2\theta + \Theta^3$$

$$\Gamma_Q = S^4\zeta^2 + S^2\zeta\eta + \zeta\theta + \eta^2 \quad \text{[Exp. 34]}$$

When $\Gamma \neq 0$, "D", "T" and "Q" are decided, and go to the process of searching error of the search equation $\Lambda^3 R(x) = 0$. If the equation has zero element or double root, branch to 3EC-EW.

In case of $\Gamma = 0$, one of unknowns, for examples "Q" is optionally set, and "D" and "T" may be solved. If just four errors are generated, there is not optional relationship between "S", "D" and "T". Therefore, this case designates that there are generated five or more errors, or three or less errors. In case of three or less errors, it is branched to 3EC-EW, and in case of five or more errors, it corresponds to the case of "not solved 3EC" in 3EC-EW.

The equation to be solved in case of $\Gamma \neq 0$ is a biquadratic equation as shown in the following Expression 35.

$$x^4 + Sx^3 + Dx^2 + Tx + Q = 0 \quad \text{[Exp. 35]}$$

Next, it will be examined the solution method of 4EC-EW, i.e., such a condition that the above-described biquadratic equation has just four and different solutions. Since a case including zero element or double root is out on the above-described condition, this case will be initially examined.

In case zero element is a solution, the equation becomes cubic with Q=0.

If there is double root, the biquadratic equation will be factorized as shown in the following Expression 36.

$$x^4 + Sx^3 + Dx^2 + Tx + Q = (x^2 + a)(x^2 + bx + c) = 0 \quad \text{[Exp. 36]}$$

In this case, there is a certain relationship between coefficients "S", "D", "T" and "Q". That is, B=S, a+c=D, ab=T and ac=Q, and a=T/S and c=SQ/T. From these, it is obtained D=a+c=T/S+SQ/T, so that it is obtained a relationship of: $S^2Q + SDT + T^2 = 0$. Therefore, in case of Q=0 or $S^2Q + SDT + T^2 = 0$, the solution method of 3EC-EW will be adapted.

The solution method of the biquadratic error searching equation will be explained below in accordance with some cases classified based on quantities determined by the syndromes. The following four cases, Case 1~Case 4, are defined, in each of which Γ is not zero.

Case 1: $S \neq 0$ and $b \neq 0$

Here, it is supposed $a = D/S$, $b = D^2 + ST$, $c = S^2Q + SDT + T^2$ and $B = a^4 + Ta + Q$. $c = 0$ is a condition of double root. Therefore, it is $c \neq 0$ as far as 4EC solution is considered.

Perform variable transformation of X=x+a to cancel 2-degree term in the error searching equation, and factorize the resultant, and a product of quadratic equations will be obtained as follows.

$$X^4 + SX^3 + (b/S)X + B = (X^2 + \alpha_1 X + \alpha_0)(X^2 + \beta_1 X + \beta_0) = 0 \quad \text{[Exp. 37]}$$

Based on the relationship between the coefficients of the factorized equations, $\alpha_0$, $\alpha_1$, $\beta_0$ and $\beta_1$, and the quantities derived from the syndromes, unknown quantity $\delta = \alpha_0 + \beta_0$ is introduced, and the following cubic equation to be satisfied by δ will be obtained.

$$(\delta/b^{1/2})^3 + (\delta/b^{1/2}) + c/b^{3/2} = 0 \quad \text{[Exp. 38]}$$

Since "b" is used as denominators in this equation, $b \neq 0$ is a necessary condition of this case.

Solve this cubic equation, and select one root "δ", and two quadratic equations with unknown "ε", which is to satisfy the coefficients of the factorized equations, will be obtained as follows.

$$(\epsilon/\delta)^2 + (\epsilon/\delta) + B/\delta^2 = 0$$

$$(\epsilon/S)^2 + (\epsilon/S) + \delta/S^2 = 0 \quad \text{[Exp. 39]}$$

Solve these equations, and coefficients $(\alpha_0, \beta_0)$ and $(\alpha_1, \beta_1)$ are obtained, respectively. Further, solve the following quadratic equations with these coefficients to obtain unknown "X", and the solutions of the error searching biquadratic equation may be obtained based on X=x+a.

$$(X/\alpha_1)^2 + (X/\alpha_1) + \alpha_0/\alpha_1^2 = 0$$

$$(X/\beta_1)^2 + (X/\beta_1) + \beta_0/\beta_1^2 = 0 \quad \text{[Exp. 40]}$$

Note here that the unknown coefficients are transformed to be elements of GF(2) for the sake of using a table when the respective equations are solved. That is, the unknown variable is set to be $\delta_1/b^{1/2}$ in the cubic equation for searching "δ"; the unknown variable is set to be δ/δ in the quadratic equations for searching $\alpha_0$ and $\beta_0$; and the unknown variables are set to be $X/\alpha_1$ and $X/\beta_1$ in the factorized quadratic equations.

Case 2: $S \neq 0$ and $b = 0$

Here, $a = Q/S$, $b = D^2 + ST = 0$, $c = S^2Q + SDT + T^2$ and $B = a^4 + Ta + Q$. Further, $S^2 B = c$ is obtained from these conditions. $c = 0$ is a condition of double root. Therefore, it is $c \neq 0$ as far as 4EC solution is considered.

Perform variable transformation of X=x+a to cancel 2-degree term in the error searching equation, and factorize the resultant to be a product of quadratic equations will be obtained as follows.

$$X^4 + DX^2 + TX + Q = (X^2 + \alpha_1 X + \alpha_0)(X^2 + \beta_1 X + \beta_0) = 0 \quad \text{[Exp. 41]}$$

Based on the relationships, $\alpha_0 \beta_0 = B$, $\beta_1 \alpha_0 + \alpha_1 \beta_0 = 0$, $\delta + \alpha_1 \beta_1 = 0$ and $\alpha_1 + \beta_1 = S$, between the coefficients of the factorized equations, $\alpha_0$, $\alpha_1$, $\beta_0$ and $\beta_1$, and the quantities derived from the syndromes, unknown quantity $\delta = \alpha_0 + \beta_0$ is introduced, and the following cubic equation to be satisfied by "δ" will be obtained.

$$\delta^3 + c = 0 \quad \text{[Exp. 42]}$$

From this equation, $\delta = c^{1/3}$ is directly searched, and two quadratic equations with the unknown "δ", which are the same as those in Expression 39, will be obtained. Solve these equations, and coefficients $\alpha_0$, $\alpha_1$, $\beta_0$ and $\beta_1$ are obtained.

Note here that since $B/\delta^2 = \delta/S^2$ is satisfied from the condition in this Case 2, one quadratic equation for searching $\alpha_0$ and $\beta_0$ and the other quadratic equation for searching $\alpha_1$ and $\beta_1$ have the same root, and $u_1 = \alpha_0/\delta = \alpha_1/S$ and $u_2 = \beta_0/\delta = \beta_1/S$ are obtained. As a result, the two quadratic equations become substantially one equation.

Solve the factorized equations (shown in Expression 40) with the coefficients satisfying the above-described relationships, and unknown "X" is obtained, and the solution of the error searching biquadratic equation will be obtained based on X=x+a. Here, based on the above-described relationship, it is obtained $\alpha_0/\alpha_1^2 = \delta/(S^2 u_1)$ and $\beta_0/\beta_1^2 = \delta/(S^2 u_2)$.

As similar to Case 1, the unknown coefficients are transformed to be elements on GF(2) for the sake of using a table when the respective equations are solved. That is, the unknown variable is set to be $\epsilon/\delta$ in the quadratic equation for searching $\alpha_0$ and $\beta_0$; the unknown variable is set to be $\epsilon/S$ in the quadratic equations for searching $\alpha_1$ and $\beta_1$; and the unknown variables are set to be $X/\alpha_1$ and $X/\beta_1$ in the factorized quadratic equations.

Case 3: $S=0$ and $D \neq 0$

"a" can not be defined because of $S=0$ while $b=D^2+SD=D^2$ and $c=S^2Q+SDT+T^2=T^2$. Since $c=0$ is a condition of double root, it is $c \neq 0$ as far as 4EC solution is considered. $\zeta \neq 0$ and $\eta \neq 0$ from $\Gamma D = \zeta \eta \neq 0$, and $\Gamma = \zeta^2$, $D = \eta/\zeta$, $T = \zeta$ and $Q = \eta^2/\zeta^2 + \theta/\zeta$ are obtained.

The error searching equation has not a 3-degree term and is factorized into a product of quadratic equations as shown in the following Expression 43.

$$X^4+DX^2+TX+Q=(X^2+\alpha_1 X+\alpha_0)(X^{2+\beta_1}X+\beta_0)=0 \quad [\text{Exp. 43}]$$

Based on the relationship between the coefficients $\alpha_0$, $\alpha_1$, $\beta_0$ and $\beta_1$, and the quantities derived from the syndromes, unknown quantity $\delta = \alpha_0 + \beta_0$ is introduced, and the following cubic equation to be satisfied by "$\delta$" will be obtained, $$\{(\delta+D)/D\}^3+\{(\delta+D)/D\}+c/D^3=0 \quad [\text{Exp. 44}]$$

The condition of $D \neq 0$ in this Case 3 is necessary because "D" becomes the dominator of the cubic equation. This equation is cubic without 2-degree term, Solve this equation, and select one root $(\delta+D)/D$, and two quadratic equations with unknowns "$\epsilon$" will be obtained as follows.

$$(\epsilon/\delta)^2+(\epsilon/\delta)+Q/\delta^2=0$$

$$\epsilon^2+\delta+D=0 \quad [\text{Exp. 45}]$$

Solve these equations, and coefficients $(\alpha_0, \beta_0)$ and $(\alpha_1, \beta_1)$ are obtained, respectively. From the secondary equation in Expression 45, $\alpha_1$ and $\beta_1$ are obtained as follows; $\alpha_1=\beta_1=(\delta+D)^{1/2}$.

Solve the quadratic equations with the above-described coefficients as shown in the following Expression 46, error searching biquadratic equation with unknown "X" may be solved, $$(X/\alpha_1)^2+(X/\alpha_1)+\alpha_0/\alpha_1^2=0$$

$$(X/\beta_1)^2+(X/\beta_1)+\beta_0/\beta_1^2=0 \quad [\text{Exp. 46}]$$

As similar to Case 1, the unknown coefficients are transformed to be elements of GF(2) for the sake of using a table when the respective equations are solved. That is, the unknown variable is set to be $\epsilon/\delta$ in the quadratic equation for searching $\alpha_0$ and $\beta_0$; and the unknown variables are set to be $X/\alpha_1$ in the factorized quadratic equations.

Case 4: $S=0$ and $D=0$

In this case, $b=D^2+ST=D^2=0$ and $c=S^2Q+SDT+T^2=T^2$. Since $c=0$ is a condition of double root, $c \neq 0$ is a necessary condition as far as 4EC solution is considered. $\zeta \neq 0$ from $\Gamma = \zeta^2 \neq 0$, and $\eta = 0$ from $S=0$ and $D=0$, and then $T = \zeta$ and $Q = \theta/\zeta$.

The error searching equation has not 2-degree and 3-degree terms, and it is factorized into a product of two quadratic equations as follows, $$X^4+TX+Q=(X^2+\alpha_1 X+\alpha_0)(X^2+\beta_1 X+\beta_0)=0 \quad [\text{Exp. 47}]$$

Based on the relationships, $\alpha_0\beta_0=Q$, $\beta_1\alpha_0+\alpha_1\beta_0=T$, $\delta+\alpha_1\beta_1=0$ and $\alpha_1+\beta_1=0$, between the coefficients of the factorized equations, $\alpha_0$, $\alpha_1$, $\beta_0$ and $\beta_1$, and the quantities derived from the syndromes, unknown quantity $\delta = \alpha_0 + \beta_0$ is introduced, and the following cubic equation to be satisfied by "$\delta$" will be obtained.

$$\delta^3+c=0 \quad [\text{Exp. 48}]$$

This is the same as Expression 42 in Case 2. This equation is easily searched, and $\delta=c^{1/3}$ is directly obtained. By use of "$\delta$", two quadratic equations with the unknown "$\epsilon$" are obtained as shown in the following Expression 49.

$$(\epsilon/\delta)^2+(\epsilon/\delta)+Q/\delta^2=0$$

$$\epsilon^2+\delta=0 \quad [\text{Exp. 49}]$$

Solve these equations, and the coefficients $(\alpha_0, \beta_0)$ and $(\alpha_1, \beta_1)$ are obtained, respectively. From the secondary equation, $\alpha_1$ and $\beta_1$ are as follows: $\alpha_1=\beta_1=\delta^{1/2}$.

Solve the quadratic equations with the above-described coefficients, which is the same as shown in the Expression 46, error searching biquadratic equation with unknown "X" may be solved.

As similar to Case 1, the unknown coefficients are transformed to be elements of GF(2) for the sake of using a table when the respective equations are solved. That is, the unknown variable is set to be $\epsilon/\delta$ in the quadratic equation for searching $\alpha_0$ and $\beta_0$; and the unknown variables are set to be $X/\alpha_1$ in the factorized quadratic equations.

The error searching calculation process described above will be summarized as follows in accordance with the calculation processes sequentially obtained from the syndromes and for the respective cases.

Case 1: $S \neq 0$ and $b \neq 0$

One root "w" is decoded from the cubic equation of: $w^3+w=c/b^{3/2}$, and referred to as $\delta=b^{1/2}w$. Following it, roots $u_1$, $u_2$, $v_1$ and $v_2$ are decoded from the quadratic equations of: $u^2+u=B/\delta^2$; and $v^2+v=\delta/S^2$, and referred to as: $\alpha_0=\delta u_1$; $\beta_0=\delta u_2$, $\alpha_1=Sv_1$ and $\beta_1=Sv_2$.

Further, roots $y_1$, $y_2$, $z_1$ and $z_2$ are decoded from the quadratic equations of: $y^2+y=\alpha_0/\alpha_1^2$; and $z^2+z=\beta_0/\beta_1^2$, and finite field elements designating four error positions are obtained as follows: $X_1=\alpha_1 y_1+a$; $X_2=\alpha_1 y_2+a$; $X_3=\beta_1 z_1+a$ and $X_4=\beta_1 z_2+a$.

Case 2: $S \neq 0$ and $b=0$ $\delta=c^{1/3}$ is obtained. Next, roots up $u_2$, $v_1$ and $v_2$ are decoded from the quadratic equations of: $u^2+u=B/\delta^2$; and $v^2+v=\delta/S^2$, and referred to as: $\alpha_0=\delta u_1$; $\beta_0=\delta u_2$; $\alpha_1=Sv_1$ and $\beta_1=Sv_2$.

Further, roots $y_1$, $y_2$, $z_1$ and $z_2$ are decoded from the quadratic equations of: $y^2+y=\alpha_0/\alpha_1^2$; and $z^2+z=\beta_0/\beta_1^2$, and finite field elements designating four error positions are obtained as follows: $X_1=\alpha_1 y_1+a$; $X_2=\alpha_1 y_2+a$; $X_3=\beta_1 z_1+a$ and $X_4=\beta_1 z_2+a$.

Note here that quadratic equations with "u" and "v" are the same equations because of the relationship of $B/\delta^2=\delta/S^2$.

Case 3: $S=0$ and $\eta \neq 0$

One root "w" is decoded from the cubic equation of: $w^3+wc/b^{3/2}$, and "w+1" is selected and referred to as $\delta=b^{1/2}(w+1)$. Following it, roots $u_1$ and $u_2$ are decoded from the quadratic equations of $u^2+u=Q/\delta^2$, and referred to as: $\alpha_0=\delta u_1$; $\beta_0=\delta u_2$ and $\alpha_1=\beta_1=(b^{1/2}w)^{1/2}$.

Further, roots $y_1$, $Y_2$, $z_1$ and $z_2$ are decoded from the quadratic equations of: $y^2+y=\alpha_0/\alpha_1^2$; and $z^2+z=\beta_0/\beta_1^2$, and finite field elements designating four error positions are obtained as follows: $X_1=\alpha_1 y_1$; $X_2=\alpha_1 y_2$; $X_3=\beta_1 z_1$ and $X_4=\beta_1 z_2$.

Case 4: $S=0$ and $\eta=0$ $\delta=c^{1/3}$ is obtained. Next, roots $u_1$ and $u_2$ are decoded from the quadratic equations of: $u^2+u=Q/\delta^2$, and referred to as: $\alpha_0=\delta u_1$; $\beta_0=\delta u_2$ and $\alpha_1=\beta_1=\delta^{1/2}$.

Further, roots $y_1$, $y_2$, $z_1$ and $z_2$ are decoded from the quadratic equations of: $y^2+y=\alpha_0/\alpha_1^2$; and $z^2+z=\beta_0/\beta_1^2$, and finite field elements designating four error positions are obtained as follows: $X_1=\alpha_1 y_1$; $X_2=\alpha_1 y_2$; $X_3=\beta_1 z_1$ and $X_4=\beta_1 z_2$.

When solving the error searching equation, various quantities are used in the branching and calculating processes, which are those calculated from the syndromes. Syndromes $S(=S_1)$, $S_3$, $S_5$ and $S_7$ are quantities directly calculated from the stored data while other quantities are obtained by multiplication, power and addition and so on based on the syndromes.

FIG. 6 shows the procedure, in which necessary quantities are sequentially calculated and obtained from the syndromes. This calculation procedure is selected in such a way that quantities obtained in parallel at the same step are selected to be as many as possible, and the number of steps is selected to be as little as possible.

In detail, at Step 1 followed the syndrome calculation, $\delta=S^3+S_3$, $\eta=S^5+S_5$ and $\theta=S^7+S_7$ are calculated. That is, power and sum processing is performed here.

At the next Step 2, various quantities of product and quotient of the various powers based on the calculation results and "S" are calculated. Quantities necessary for calculating sums are four, i.e., $S^3\zeta$, $S\eta$, $S^4\eta$ and $S^2\theta$.

The following Step 3 is for calculating two quantities $\Gamma$ and $\Gamma T$ from the sums of the above-described four quantities and four quantities $S^3\eta$, $S\zeta$, $S\theta$ and $\zeta\eta$.

Calculated at Step 4 are sum, $\Gamma D$, of quantities obtained at the preceding Step 3 and four quantities necessary for addition in the following step.

Calculated in the following Step 5 are sum $\Gamma Q$, product "D" and quotient "T" of the quantities obtained in the preceding step. Further in the Step 6, three quantities "Q", "a" and "ST" are calculated here, which are necessary in the next step.

"b", $\zeta T$, Ta and $S^2Q$ are calculated in the Step 7, and "c" and "B" are calculated in the final Step 8. To reduce the number of sums in the calculating step of "c", the equation is transformed by use of the relationship of $\zeta=SD+T$.

Calculation steps performed after the syndrome calculation are eight steps as described above. Power processing may be achieved by a multiplexer, which rearranges codes expressing quantities; sum is obtained by a parity checker; and product and quotient are obtained by adder circuits for adding codes expressing quantities. These will be explained in detail later.

The ECC circuit of 4EC-EW searches four or less errors. The number of errors may be judged based on the information obtained from the syndromes, the error searching adapted to the error situations may be performed. It is considered as the simplest case that error searching operations are performed in parallel for all error situations, and error positions are judged based on the result. It becomes possible in this case to do high-speed error searching because the searching operations may be started in order from one that is searchable early. However, wasteful searching operations are performed in this method, and the circuit system becomes to have a large scale.

Based on the conditions of the respective error searching described above, the solution searching operations performed in parallel may be summarized as follows, Note here quantities, such as "S", "$\eta$" and the like, which are obtained from the syndromes, are used in common to every error search. The coefficients, "T", "T", "Q" and the like, in the error searching equation, are individual quantities in the equation, and these are distinguished from each other by suffix numbers. For example, coefficient "D" will be referred to as "$D_2$" in 2EC and "$D_3$" in 3EC.

In Case of 2EC or Less:

The error searching equation is a quadratic equation defined by $x^2+Sx+D_2=0$. There is a relationship between coefficient "$D_2$" and syndrome "S" such as $SD_2=\zeta$. To satisfy that this equation has two roots different from each other, it becomes a condition that there is not zero element and double root. Therefore, $S\neq 0$ and $D_2\neq 0$, and then $\eta\neq 0$. In this case, if no solution, it becomes three or more errors. When $S_0$ or $\zeta=0$, 1EC or less; when $S\neq 0$, $\eta=0$ and $D_2=0$, 1 error of $x+S=0$ when $D_2=0$; and when $S=0$, no error.

In Case of 3EC;

The error searching equation is a cubic equation defined by $x^3+Sx^2+D_2x+T_3=0$. The coefficient determinant of the simultaneous equations for searching coefficients $\zeta$ is $\zeta\neq 0$, and there is a relationship of: $\zeta D_3=S\zeta^2+\eta$ and $\zeta T_3=S^3\zeta+S\eta+\zeta^2$. To satisfy that this equation has three roots different from each other, it becomes a condition that there is not zero element and double root. That is, in consideration of zero element $T_3=0$ and double root $T_3+SD_3=\zeta=0$, it is obtained $\zeta T_3\lceil\neq 0$. If no solution, it becomes four or more errors.

In Case of 4EC:

The error searching equation is a biquadratic defined by $x^4+Sx^3+D_4x^2+T_4x+Q_4=0$. The coefficient determinant of the simultaneous equations for searching coefficients $\Gamma$ is $\Gamma=S^3\zeta+S\eta+\zeta^2=\zeta T_3$, and $\Gamma\neq 0$. To satisfy that this equation has four roots different from each other, it becomes a condition that there is not zero element and double root. That is, in consideration of zero element $Q_4=0$ and double root $S^2Q_4+SD_4T_4+T_4^2=c=0$, it is obtained $cQ_4\neq 0$. If no solution, it becomes five or more errors.

Performing the above described error searching operations in parallel, it becomes possible to constitute an ECC system, which is able to search 4-error. Since the solution searching operations of 2EC, 3EC and 4EC are performed in parallel, and error judging is performed based on the searching results, the system is simple. However, it contains wasteful searching operations, and circuit scale becomes large.

In consideration of this, to effectively reduce is the circuit scale in this embodiment, an exclusive condition for judging error numbers will be selected. That is, the exclusive condition is searched between the respective error searching processes, and based on this exclusive condition, the system is constructed in such a manner that common circuits are shared in the system and used in a time-sharing and multiplexing mode. As a result, the circuit scale will be reduced.

Since syndromes and coefficients of the error searching equation in 4EC become basics, the coefficients are referred to as $D_4=D$, $T_4=T$ and $Q_4=Q$ here. It is defined from the above-described error searching conditions that searching in 4EC becomes searching in 3EC or less in case of $\Gamma=0$ or $cQ=0$; searching in 3EC becomes searching in 2EC or less in case of $\zeta T_3=\Gamma=0$; and searching in 2EC becomes searching in 1EC or less in case of $\zeta=0$. In consideration of this, the exclusive conditions will be searched in order of the error numbers.

Condition of Branching to 1EC or Less

From $\zeta=0$ under the condition of $\Gamma=0$ and $\zeta=0$, relationships between syndromes and coefficients in 4EC become as follows.

$$SD+T=\zeta \to SD+T=0$$

$$(\zeta+S^3)D+S^2T+SQ=\eta \to SQ=\eta$$

$$(\eta+S_5)D+S^4T+(\zeta+S^3)Q=0 \to \eta D+S^3Q=\eta(S^2+D)=\theta$$

$$\Gamma=S^3\zeta+S\eta+\zeta^2 \to \Gamma=S\eta$$

$$c=S^2Q+SDT+T^2 \to c=S^2Q=\Gamma \qquad [\text{Exp. 50}]$$

From $cQ=0$, $SQ=0$ is obtained, and $\Gamma=0$ is satisfied. Further, if $\Gamma=0$, and $c=0$, and then $cQ=0$ is satisfied. Therefore, only the case of $\Gamma=0$ is to be considered. In this case, $\eta=0$ or $S=0$. From $F=S\eta$, in case of $S=0$, $\theta=0$ from $\eta$. Therefore, $\eta=0$ is always satisfied. On the other hand, from $\zeta=\eta=0$ ($\theta=0$), $\Gamma=0$ and cQ=0 are satisfied. This is the condition of 1EC in the 4EC calculation.

Therefore, the exclusive condition of branching to 1EC or less is defined by: C=n=0 ($\theta=0$). In this case, if S≠0, then 1 error, $X_1$=S; and if S=0, then no error.

Corresponded to that the error searching of 1EC or less results in "no solution" is the case where contradiction is generated under the branching condition. That is, if $\eta=0$ and $\theta\neq0$, and it is contradictory. If S=0 and $\eta\neq0$, it is judged to be contradictory based on the relationship between the syndromes and the coefficients. In this case, it is judged that there are 5 errors or more.

Condition of Branching to 2EC

In case of $\Gamma=0$, 4EC becomes 3EC or less. What is necessary to branch to 2EC or less is: $\zeta T_3=\Gamma=0$ However, if $\zeta=0$, and 1EC or less. Therefore, the condition of branching to 2EC is $T_3=0$ because of $\zeta\neq0$.

Therefore, the relationships between the syndromes and the coefficients will be rewritten as shown in the following Expression 51.

$$SD_3+T_3-\zeta \rightarrow SD_3=\zeta$$

$$(\zeta+S^3)D_3+S^2T_3=\eta \rightarrow \zeta(S^2+D_3)=\eta$$

$$\Gamma=S^3\zeta+S\eta+\zeta^2 \rightarrow \Gamma=0 \qquad [\text{Exp. 51}]$$

Since $\Gamma=0$, i.e., the condition of 2EC in 4EC is always satisfied, there is no need of considering cQ=0. Therefore, the condition of branching to 2EC is: $\Gamma=0$ and $\zeta\neq0$.

Condition of Branching to 3EC

The condition of 3EC or less is $\Gamma=0$ or cQ=0, and $\Gamma=0$ is the condition of 2EC or less. Therefore, the condition of branching to 3EC is: c=0 or Q=0 in case of $\Gamma\neq0$.

Condition of Branching to 4EC

The condition of 4EC is: $\Gamma\neq0$ and cQ≠0. In other words, the condition of branching to 4EC is: $\Gamma\neq0$ and c≠0 and Q≠0.

Equivalent to the above conditions, the error searching equation is not satisfied with finite field elements in the branched solution searching operations, thereby resulting in no solution, it is judged that there are generated five or more errors.

Figure 7:
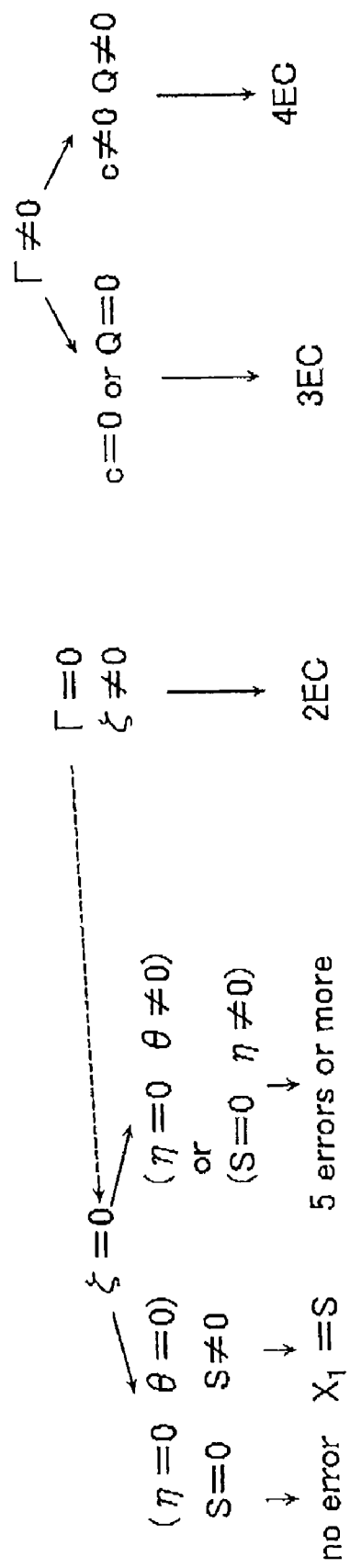
FIG. 7 shows the exclusive branching condition of solution searching in the 4EC-EW system.

The exclusive conditions described above are summarized as shown in FIG. 7. Since there is no need of considering $\Gamma=0$ in the branching on the condition of $\zeta=0$, the judgment of branching to 1EC or less may be performed early on.

Figure 8:
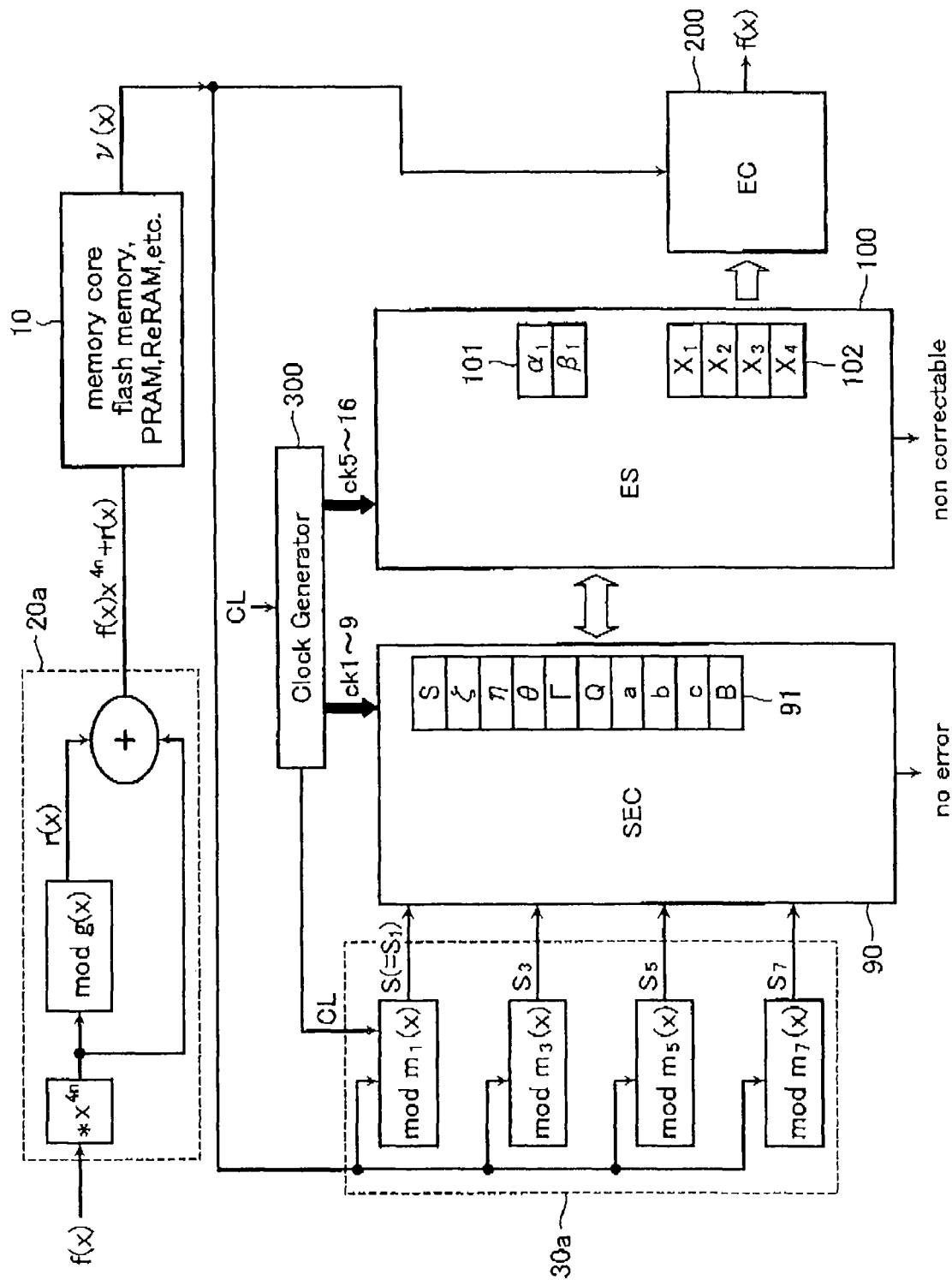
FIG. 8 shows a 4EC-BCH-ECC system in accordance with the embodiment.

FIG. 8 shows the configuration of the 4EC-EW-BCH system, which is able to correct errors up to 4 bits, and outputs a warning when there are 5 or more errors. In the encode part 20a, necessary degrees are selected and the corresponding coefficients are used in accordance with data bit configuration. Therefore, unnecessary coefficients are dealt with fixed data "0" or "1", which are not stored in the memory core 10. As a result, the system may be constituted to be adapted to the memory capacitance.

The degrees used as the information bits are selected to be able to minimize the calculation scale and system scale. In general, supposing that information data are defined by "$a_i$", input is expressed by h−1−4n degree polynomial f(x) with the coefficients of "$a_i$". When f(x) $x^{4n}$ is divided by code generation polynomial g(x) and remainder r(x) is obtained, coefficients of polynomial f(x) $x^{4n}$+r(x) are dealt with data bits to be stored in the memory core 10.

Memory core 10 is one with a large capacity such as a flash memory (specifically of a multi-level cell scheme), ReRAM, PCRAM and the like, in which bit errors are not avoidable. In detail, the memory is one having such a specification that high-speed access is required in real time. Refer to, for example, JP-A-2007-35124 (corresponding U.S. Pat. No. 7,369,433 B2). h-bit read data of the memory are dealt with the coefficients of (h−1)-degree polynomial v(x).

Syndrome operation part 30a is for dividing v (x) by $m_1(x)$, $m_3(x)$, $m_5(x)$ and $m_7(x)$ to search syndromes S, $S_3$, $S_5$ and $S_7$, respectively. Syndromes are represented by "expression indexes" which are distinguished from each other by mod p, mod q and mod r (where, h=pqr).

That is, as described later, syndromes S, $S_3$, $S_5$ and $S_7$ are represented as expression indexes, and these are subjected to addition of binary numbers in adder circuits. Further, in parity checkers, the expression indexes are decoded to finite field elements and represented as (n−1)-degree polynomial, and then the coefficients of the respective degrees are subjected to parity checking, so that the coefficients of a polynomial expressed by added elements are obtained and decoded to expression indexes.

After the syndromes have been obtained, in syndrome element calculation (SEC) part 90 defined as one calculation block, necessary quantities are calculated in the steps shown in FIG. 6 and stored in register portion 91. Register portion 91 is constituted by latches at the output portions of the respective adders. Here is shown such the register portion 91 that stores ten quantities necessary for the condition branching.

The following calculation block is error searching (ES) part 100, which is for searching error locations (positions) based on the quantities obtained in SEC part 90. ES part 100 has register portions 101 and 102 for storing the calculation result quantities.

All stored data in SEC part 90 and ES part 100 are expression indexes. There is prepared clock generator 300 for controlling the calculation processes in syndrome operation part 30a, SEC part 90 and ES part 100, which generates clocks ck1-ck10 divided from an external clock CL. There are shown in the drawing clock distributions mainly used for controlling calculation blocks.

In SEC part 90 and ES part 100, circuit blocks are used in a time-sharing and multiplexing mode. Therefore, SEC part 90 and ES part 100 are coupled with a bidirectional arrow showing that data are exchanged between them. According to these time-sharing and multiplexing, these calculation blocks are reduced in scale.

The result obtained in ES part 100 is input to the following calculation block, i.e., EC (Error Correction) part 200, and data correction of the read out data from the memory will be performed. In other words, the information data polynomial f(x), which is input to this system from the external, will be restored in EC part 200, and output.

In FIG. 8, calculation blocks are classified into SEC part 90 and ES part 100 in accordance with functions thereof. However, in the practical circuit system, common circuits are used in a time-divisional manner. Therefore, it is regarded as that FIG. 8 shows the time-divisional operations of the circuit system.

Figure 9:
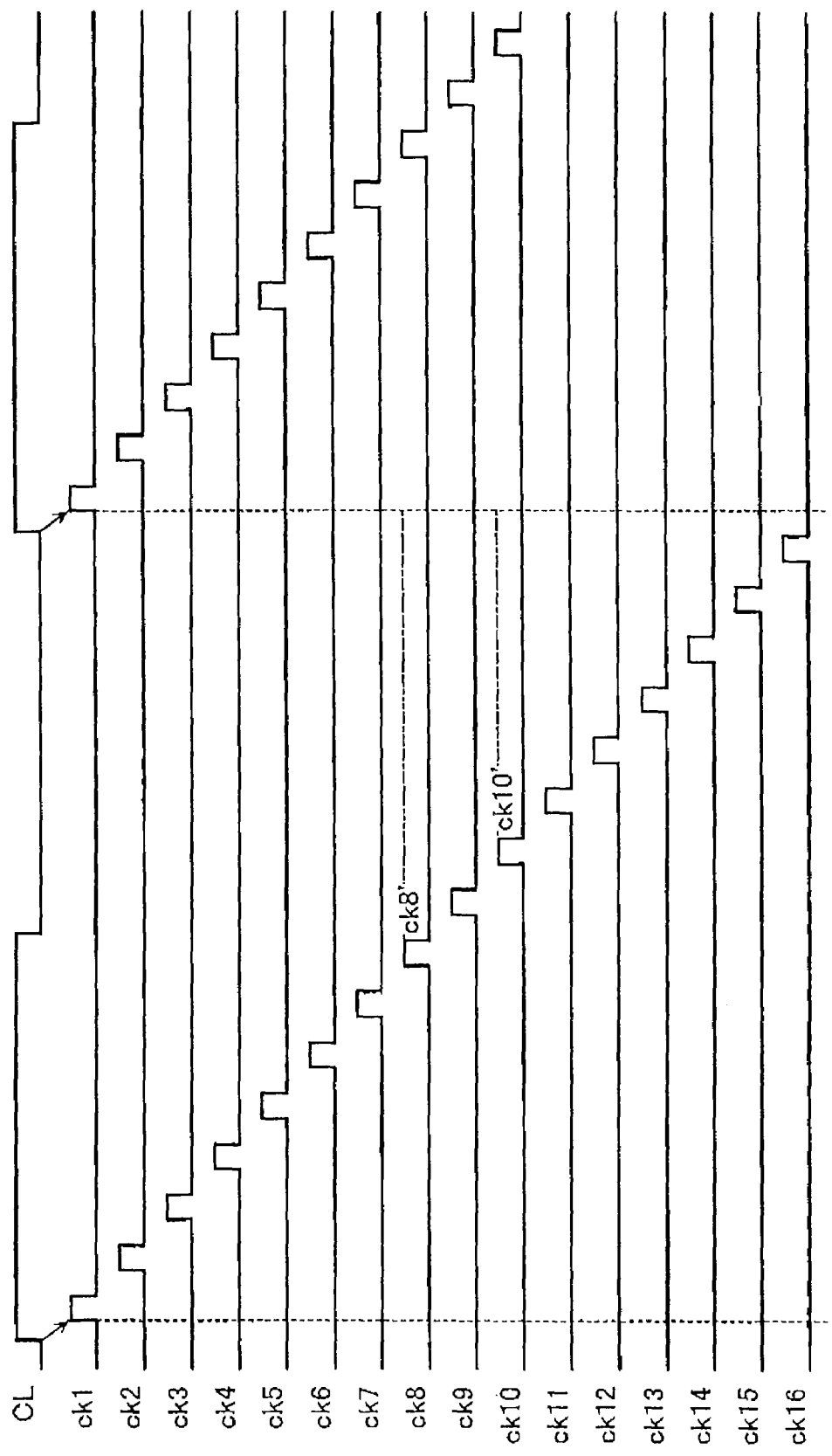
FIG. 9 shows the internal clocks in the system, which is synchronized with the external clock.

FIG. 9 shows the internal clocks generated from the clock generation circuit 300. "CL" is a basic clock used for controlling the memory and data transferring. This clock has several 10 nsec cycle time and is synchronized with the control clock prepared outside the memory. This clock CL is used as a trigger, and internal clocks ck1-ck16 are generated. The explanation of the method of clock generation is omitted here. For example, the method of clock generating disclosed in JP-A-2005-332497 may be useful.

Clocks ck1-ck16 are cyclic clocks with a pulse width of several nsec, which are sequentially generated and cascaded. Further, serving these pulse clocks as triggers, clocks attached with dash (') are generated, which are used for holding the circuit states until when a new clock (CL) cycle starts. For example, ck8' is generated from ck8; and ck10' is from ck10.

Figure 10:
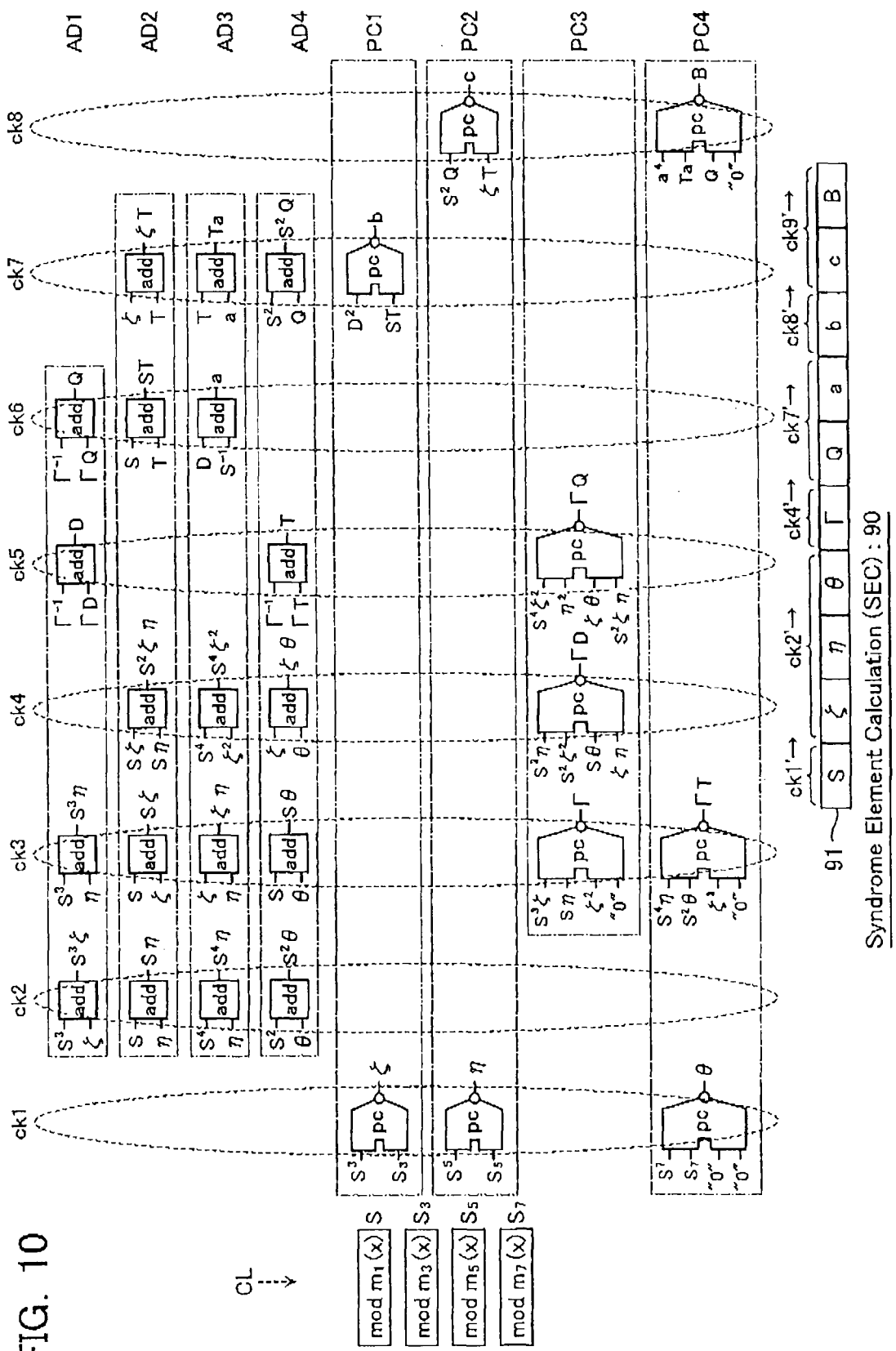
FIG. 10 shows the operation of SEC part, in which adder circuits and parity check circuits are time-shared, in accordance with the internal clock flow.

FIG. 10 shows the detailed configuration of SEC part 90. Since four adder circuits AD1-AD4 and four parity checker circuits PC1-PC4 are used in a time-sharing manner with clocks ck1-ck8, the clock flows of the respective clocks ck1-ck8 are shown in the lateral direction, and it is shown as that some circuits, adders AD and/or parity checkers PC, driven by each clock are surrounded by a dotted line.

It is shown here that four adders AD1-AD4 are used simultaneously with clock ck2; all these are also used simultaneously with clock ck3; AD2-AD4 are used simultaneously with clock ck4; and the like. Further, four parity checker circuits PC1-PC4 (including two-input parity checkers PC1 and PC2, and four-input parity checkers PC3 and PC4) are used as follows: PC1, PC2 and PC4 are used simultaneously at clock ck1 timing; PC3 and PC4 are used simultaneously at clock ck3 timing; and the like.

The respective steps are operated with clocks ck1-ck8. These steps are ones for calculating the finite field elements from syndromes as shown in FIG. 6. That is, the numbers of these steps 1 to 8 correspond to those of clocks ck1-ck8. Note here that in case one input of four-input parity checker is not used, "0", i.e., Vss, is applied to it.

Ten quantities S, $\zeta$, $\eta$, $\theta$, $\Gamma$, Q, a, b, c and B obtained in these calculation processes are held in register portion 91 (including output latches in the respective adders and parity checkers) with clocks ck1'-ck9' as shown in FIG. 10.

Figure 11:
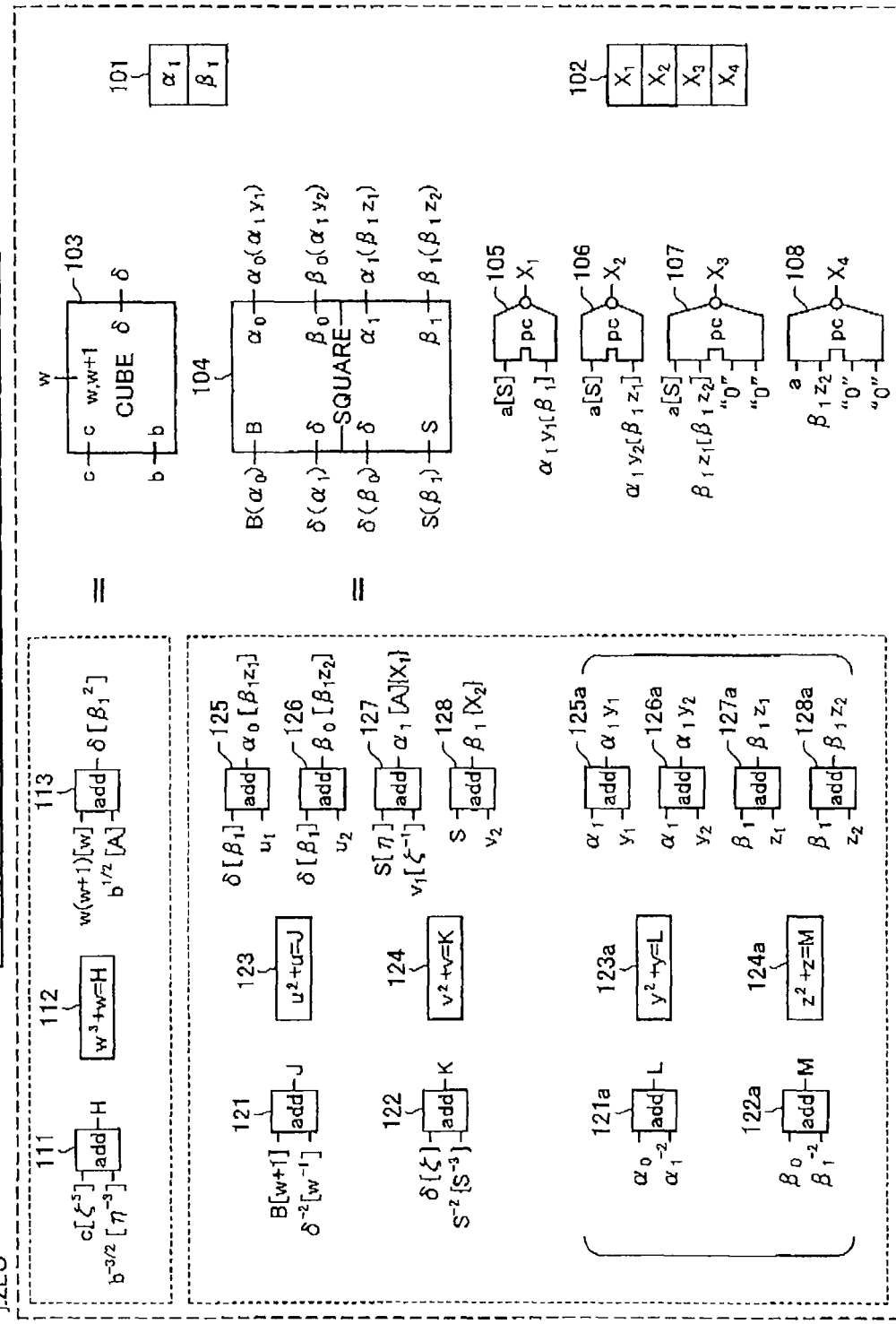
FIG. 11 shows the circuit blocks of the ES part in the system.

FIG. 11 shows the detailed configuration of ES part 100, which is for branching the calculation processes based on the finite elements stored as the calculation results in SEC part 90, and further progressing the calculation for specifying errors.

The circuits used in ES part 100 are the same as in SEC part 90. In FIG. 11, functional circuit blocks are collected in order of the calculation procedures. In detail, ES part 100 includes: circuit block (CUBE) 103 used for solving a cubic equation; circuit block (SQUARE) 104 used for solving a quadratic equation; two-input parity checkers 105-108 used for calculating the sum of elements; and registers 101 and 102 used for holding the halfway and the final calculation results.

The solution method of 4EC system will be explained first. CUBE 103 is formed of: one adder circuit 111 used for calculating quantity "H", to which the unknown part of the cubic equation for "w" is equivalent, from the syndrome; decoder calculation circuit 112 used for searching "w" from the cubic equation of $w^3+w=H$; and another adder circuit 113 used for calculating quantity "$\delta$" to be obtained from "w" as the product of "w" or "w+1" and "$b^{1/2}$".

SQUARE 104 has: two adder circuits 121 and 122 used for calculating the quantities "J" and "K" to be obtained from "$\delta$", to which the unknown parts of the quadratic equations for "u" and "v" are equivalent; decoder calculation circuits 123 and 124 used for searching "u" and "v" from two quadratic equations of $u^2+u=J$ and $v^2+v=K$, respectively; and four adder circuits 125-128 used for calculating the coefficients "$\alpha_0$", "$\beta_0$", "$\alpha_1$" and "$\beta_1$", respectively, of the factorization to quadratic equations from the biquadratic equation.

SQUARE 104 further has parenthesized circuit portions, in which adder circuits 121 and 122, decoder calculation circuits 123 and 124, and adder circuits 125-128 are multiplexed to be used as the latter half calculation portion. That is, SQUARE 104 further has: two adder circuits 121a and 122a used for calculating the quantities "L" and "M", to which the unknown parts of the quadratic equations for "y" and "z" (to be searched for obtaining the roots of the error searching biquadratic equation) are equivalent; decoder calculation circuits 123a and 124a used for searching "y" and "z" from two quadratic equations of $y^2+y=L$ and $z^2+Z=M$, respectively; four adder circuits 125a-128a used for calculating the biquadratic equation based on "y" and "z".

The former half calculation portions and the latter half calculation portions in SQUARE 104 are distinguished from each other with suffix "a" and without suffix, and it is shown that these circuits are common ones used in time-sharing. To hold the result of the former half calculation portions, there is prepared the register portion 100, in which "$\alpha_1$" and "$\beta_1$" are stored.

The calculation results of SQUARE 104 are added to the quantities obtained from the syndrome, respectively, to serve as the true error-searching results. To calculate these sums, there are four parity checker circuits 105-108 each with two inputs. To hold the results "$X_1$", "$X_2$", "$X_3$" and "$X_4$", there is prepared the register portion 102.

Note here in FIG. 11 that input/output signals of circuits used in the 3EC system are parenthesized by square brackets, [ ], and those used in the 2EC system are parenthesized by braces, { }. It is shown that these circuits are also common circuits.

Figure 12:
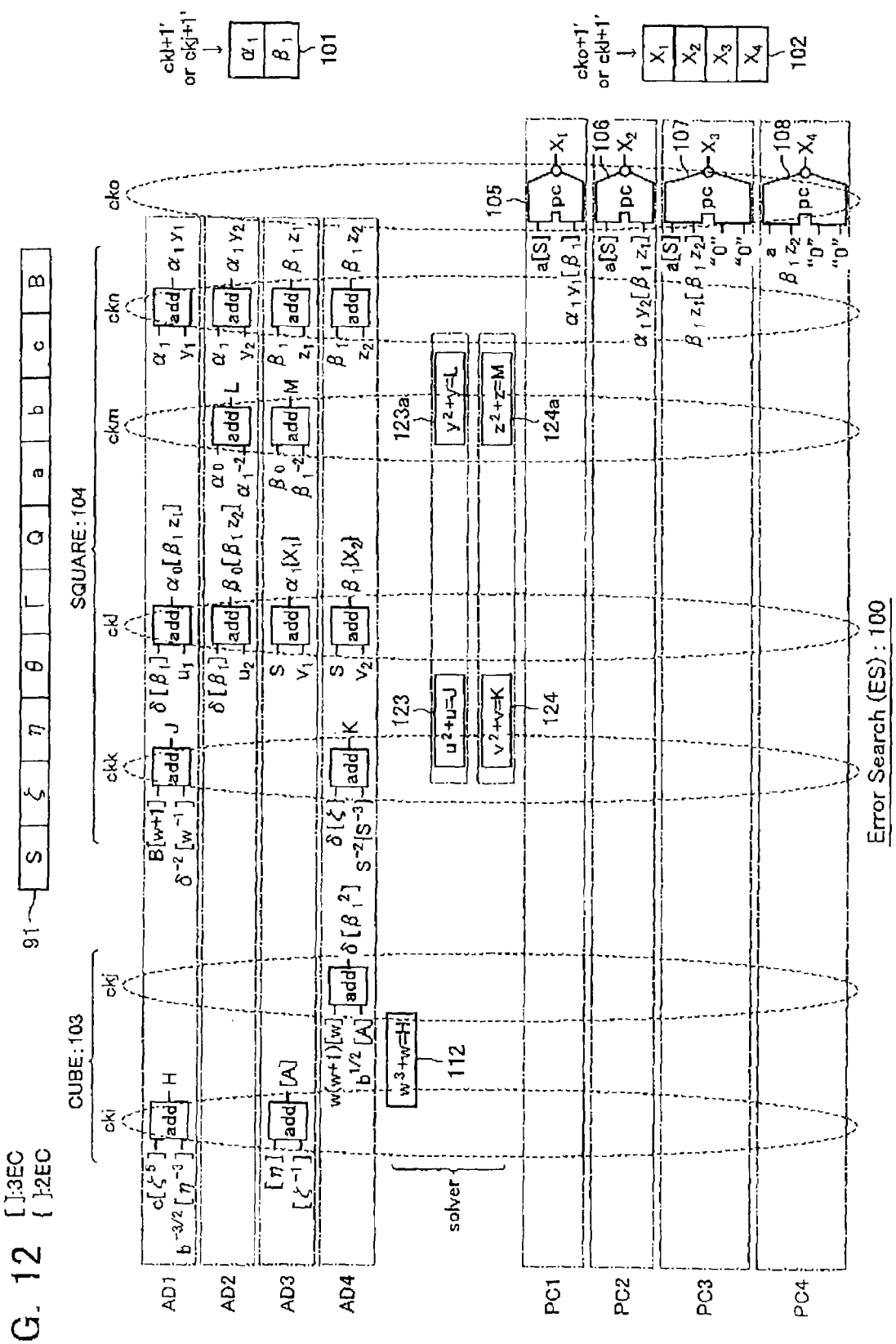
FIG. 12 shows the operation of the ES part in accordance with the internal clock flow.

FIG. 12 shows the detailed configuration of ES part 100. As similar to that shown in FIG. 10, adder circuits AD1-AD4 shared by SEC part 90, parity checker circuits PC1-PC4, and calculation blocks used for solving a cubic equation and a quadratic equation with decoders are dispersedly arranged in accordance with the clock flow.

In ES part 100, using circuits and clocks are different from each other in accordance with error searching branches. Therefore, clock numbers are not specified, and all cases where circuits are used are overlapped to be shown. Input/output signals of circuits used in the 3EC system are shown with square brackets, [ ], and those used in the 2EC system are shown with braces, { }. This is the same as shown in FIG. 11.

Register 101 for $\alpha$, $\beta$ and register 102 for Xi are for storing them after these data are calculated.

Therefore, the corresponding clocks are shown by adding +1 to those, with which the calculation result is obtained. In addition, these clocks are shown with dashes (') because these are kept during these cycle times.

Used with clocks cki and ckj are circuits blocks in CUBE 103 while calculation circuit 112 is used once for calculating cubic equation of $w^3+w=H$. Used with clocks ckk to ckn are circuits blocks in SQUARE 104. Calculation circuits 123 and 123a are shown that $u^2+u=J$ and $y^2+y=L$ are calculated in the same calculation circuit in a time-sharing mode. Similarly, calculation circuits 124 and 124a are shown that $v^2+v=K$ and $z^2+z=M$ are calculated in the same calculation circuit in a time-sharing mode.

Clock ck0 is a timing clock when the sum of elements is calculated finally for specifying the finite elements of the error location. In accordance with this clock ck0, parity checker circuits PC1-PC4 (corresponding to two-bit parity checker circuits 105-108) output $X_1$ to $X_4$.

The error searching calculation procedure in 4EC has been explained for four cases, Case1 to Case4. FIGS. 13, 14, 15 and 16 show the calculation procedures of Case1, Case2, Case3 and Case4, respectively, in ES part 100.

Next, the calculation procedures of the circuit portions will be explained in brief.

Figure 13:
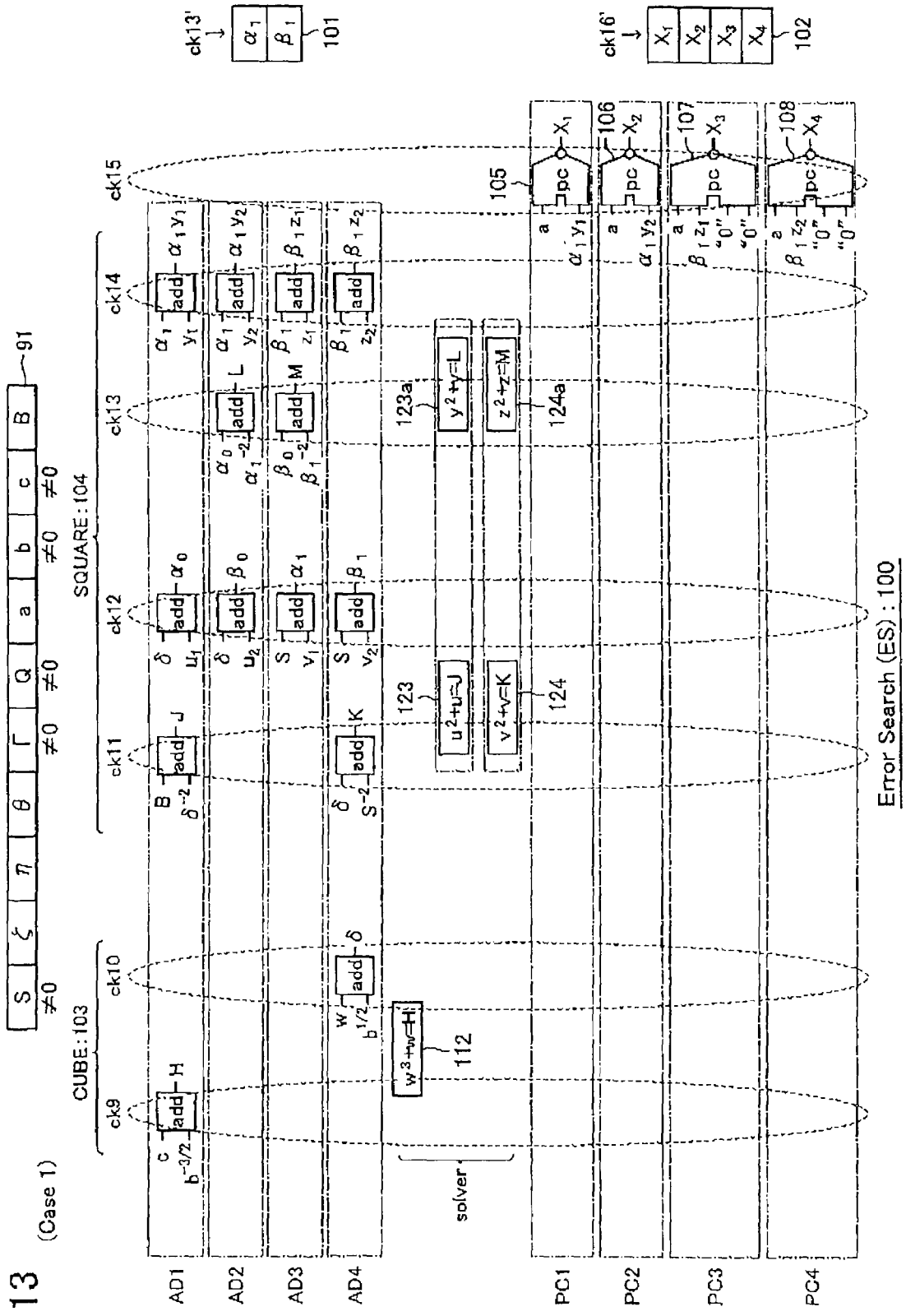
FIG. 13 shows the operation of Case 1 in the ES part.

Case1 Shown in FIG. 13

$\Gamma \neq 0$, $Q \neq 0$ and $c \neq 0$ because of 4EC. In addition, as the condition of Case1, $S \neq 0$ and $b \neq 0$.

CUBE 103 calculates $H=cb^{-3/2}$ in adder circuit AD1 with clock ck9, search "w" from $w^3+w=H$ in decoder calculation circuit 112 and calculates $\delta Wb^{1/2}$ in adder circuit AD4 with clock ck10.

SQUARE 104 calculates $J=B\delta^{-2}$ and $K=\delta S^{-2}$ in adder circuits AD1 and AD4, respectively, with clock ck11. Further, "u" and "v" are decoded from $u^2+u=J$ and $v^2+v=K$ in calculating circuits 123 and 124, respectively, with clock ck12, and $\alpha_0=\delta u_1$, $\beta_0=\delta u_2$, $\alpha_1=Sv_1$ and $\beta_1=Sv_2$ are calculated in adder circuits AD1-AD4, respectively.

Additionally, $L=\alpha_0\alpha_1^{-2}$ and $M=\beta_0\beta_1^{-2}$ are calculated in adder circuits AD2 and AD3, respectively, with clocks ck13. Further, calculating circuits 123a and 124a calculate $y_1, y_2$ and $z_1, z_2$ from $y^2+y=L$ and $z^2+z=M$, respectively, with clock ck14, and adder circuits AD1-AD4 calculate $\alpha_1y_1, \alpha_1y_2, \beta_1z_1$ and $\beta_1z_2$, respectively.

Since $\alpha_1$ and $\beta_1$ are used in the successive steps, these are stored in register 101 with clock ck13'.

At the output portion of SQUARE 104, parity checker circuits PCd to PC4 calculate $X_1=a+\alpha_1y_1$, $X_2=a+\alpha_1y_2$, $X_3=a+\beta_1z_1$ and $X_4=a+\beta_1z_2$ with clock ck15, and the calculated results will be stored in register 102 with clock ck16'.

Figure 14:
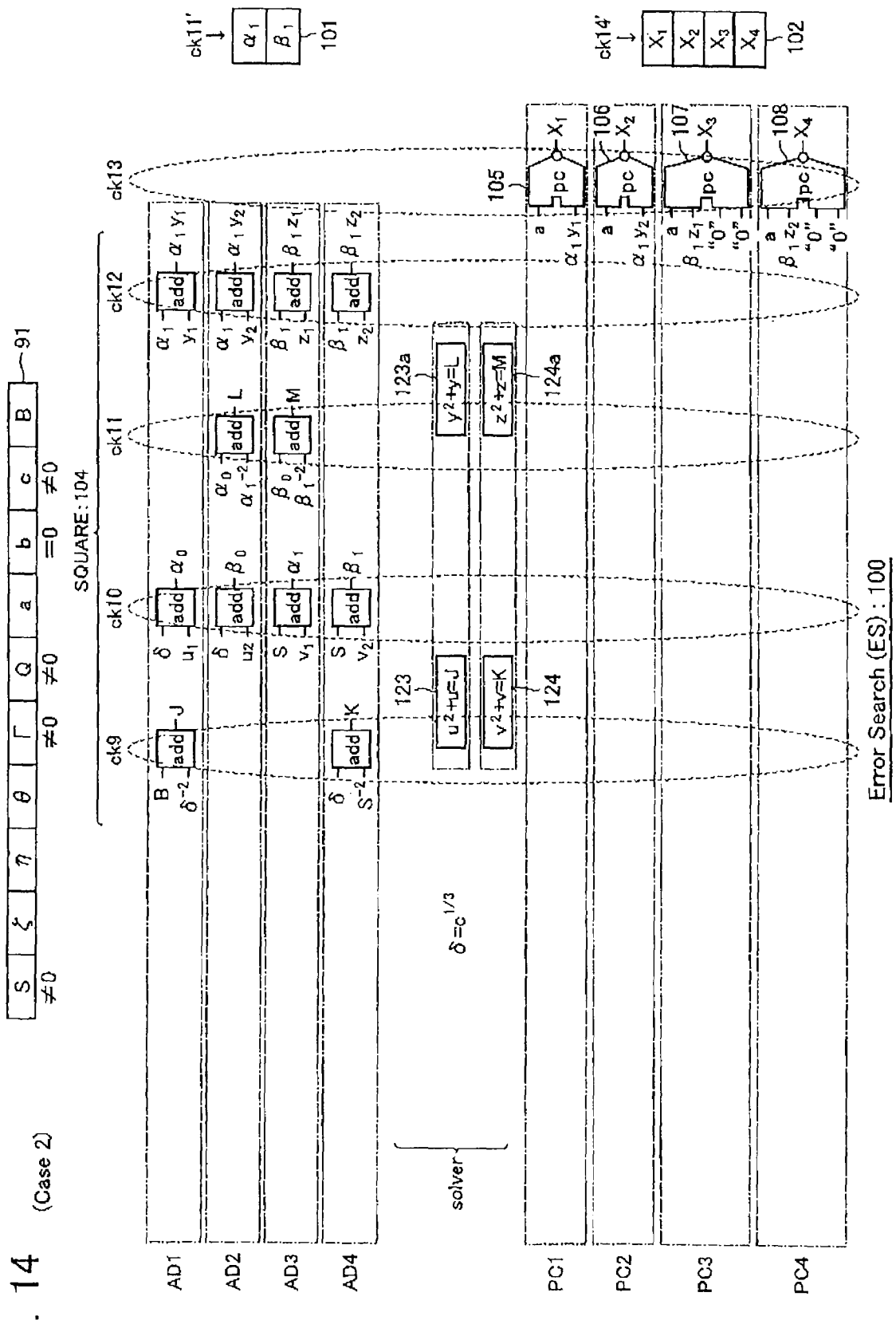
FIG. 14 shows the operation of Case 2 in the ES part.

Case2 Shown in FIG. 14

$\Gamma\neq 0$, $Q\neq 0$ and $c\neq 0$ because of 4EC. In addition, as the condition of Case2, $S\neq 0$ and b=0.

CUBE 103 is not used, and $\delta=c^{1/3}$.

SQUARE 104 calculates $J=B\delta^{-2}$ in adder circuit AD1 and $K=\delta S^{-2}$ in adder circuit AD4 with clock ck9. Further, "u" and "v" are decoded as "$u_1$ and $u_2$" and "$v_1$ and $v_2$" from $u^2+u=J$ and $v^2+v=K$ in calculating circuits 123 and 124, respectively, with clock ck10, and $\alpha_0\delta u_1$, $\beta_0\delta u_2$, $\alpha_1=Sv_1$ and $\beta_1Sv_2$ are calculated in adder circuits AD1-AD4, respectively.

Additionally, $L=\alpha_0\alpha_1^{-2}$ and $M=\beta_0\beta_1^{-2}$ are calculated in adder circuits AD2 and AD3 with clock ck11, respectively. Further, decoder calculating circuits 123a and 124a search $y_1, y_2$ and $z_1, z_2$ from $y^2+y=L$ and $z^2+z=M$, respectively, with clock ck12, and adder circuits AD1-AD4 calculate $\alpha_1y_1, \alpha_1y_2, \alpha_1z_1$ and $\beta_1z_2$, respectively.

Since $\alpha_1$ and $\beta_1$ are used in the successive steps, these are stored in register 101 with clock ck11.

At the output portion of SQUARE 104, parity checker circuits PC1 to PC4 calculate $X_1=a+\alpha_1y_1$, $X_2=a+\alpha_1y_2$, $X_3=a+\beta_1z_1$ and $X_4=a+\beta_1z_2$ with clock ck13, and the calculated results will be stored in register 102 with clock ck14'.

Figure 15:
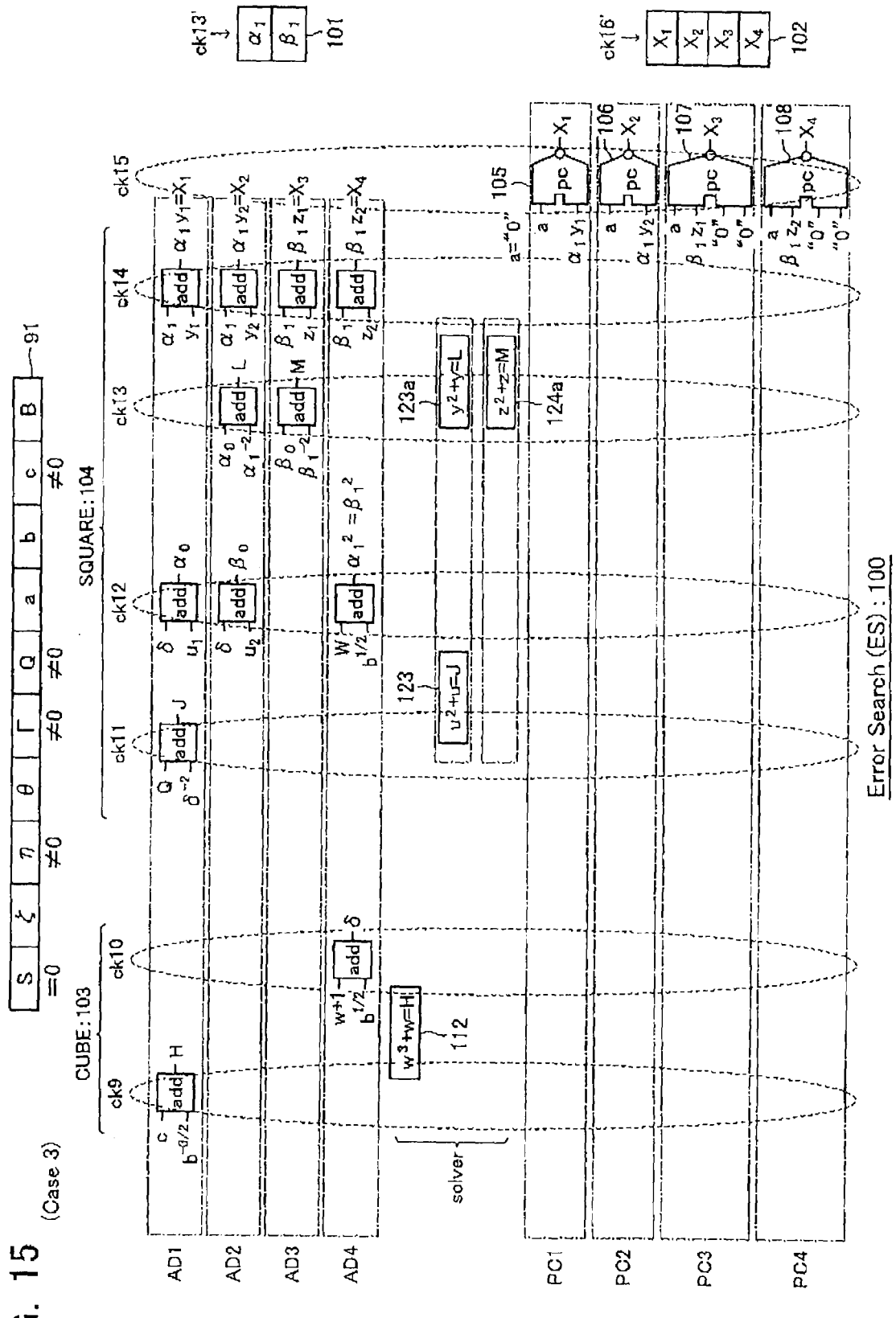
FIG. 15 shows the operation of Case 3 in the ES part.

Case3 Shown in FIG. 15

$\Gamma\neq 0$, $Q\neq 0$ and $c\neq 0$ because of 4EC. In addition, as the condition of Case3, $S=0$ and $\eta\neq 0$.

CUBE 103 calculates $H=cb^{-3/2}$ in adder circuit AD1 with clock ck9, searches "w" and "w+1" from $w^3+w=H$ in decoder calculation circuit 112 with clock ck10 and calculates $\delta=(w+1)b^{1/2}$ in adder circuit AD4.

SQUARE 104 calculates $J=Q\delta^{-2}$ in adder circuit AD1 with clock ck11, calculates "$u_1$" and "$u_2$" from $u^2+u=J$ in decoder calculating circuit 123 with clock ck12, and calculates $\alpha_0=\delta u_1$, $\beta_0=\delta u_2$ and $\alpha_1^2=\beta 1^2=wb^{1/2}$ in adder circuits AD1, AD2 and AD4, respectively.

Additionally, $L=\alpha_0\alpha_1^{-2}$ and $M=\beta_0\beta_1^{-2}$ are calculated in adder circuits AD2 and AD3, respectively, with clock ck13. Further, $u^2+u=J$ and $v^2+v=K$ being dealt with $y^2+y=L$ and $z^2+z=M$, respectively, these are decoded to $y_1, y_2$ and $z_1, z_2$ in decoder calculating circuits 123a and 124a, respectively, with clock ck14, and adder circuits AD1-AD4 calculate $\alpha_1y_1$, $\alpha_1y_2, \beta_1z_1$ and $\beta_1z_2$, respectively.

Since $\alpha_1$ and $\beta_1$ are used in the successive steps, these are stored in register 101 with clock ck13'.

At the output portion of SQUARE 104, parity checker circuits PC1 to PC4 calculate $X_1=a+\alpha_1y_1$, $X_2=a+\alpha_1y_2$, $X_3=a+\beta_1z_1$ and $X_4=a+\beta_1z_2$ with a="0" with clock ck15, and the calculated results will be stored in register 102 with clock ck16'. Although the calculating step of clock ck15 is not necessary in principle, it is used here with a="0" for keeping the procedure as unchangeable as possible.

Figure 16:
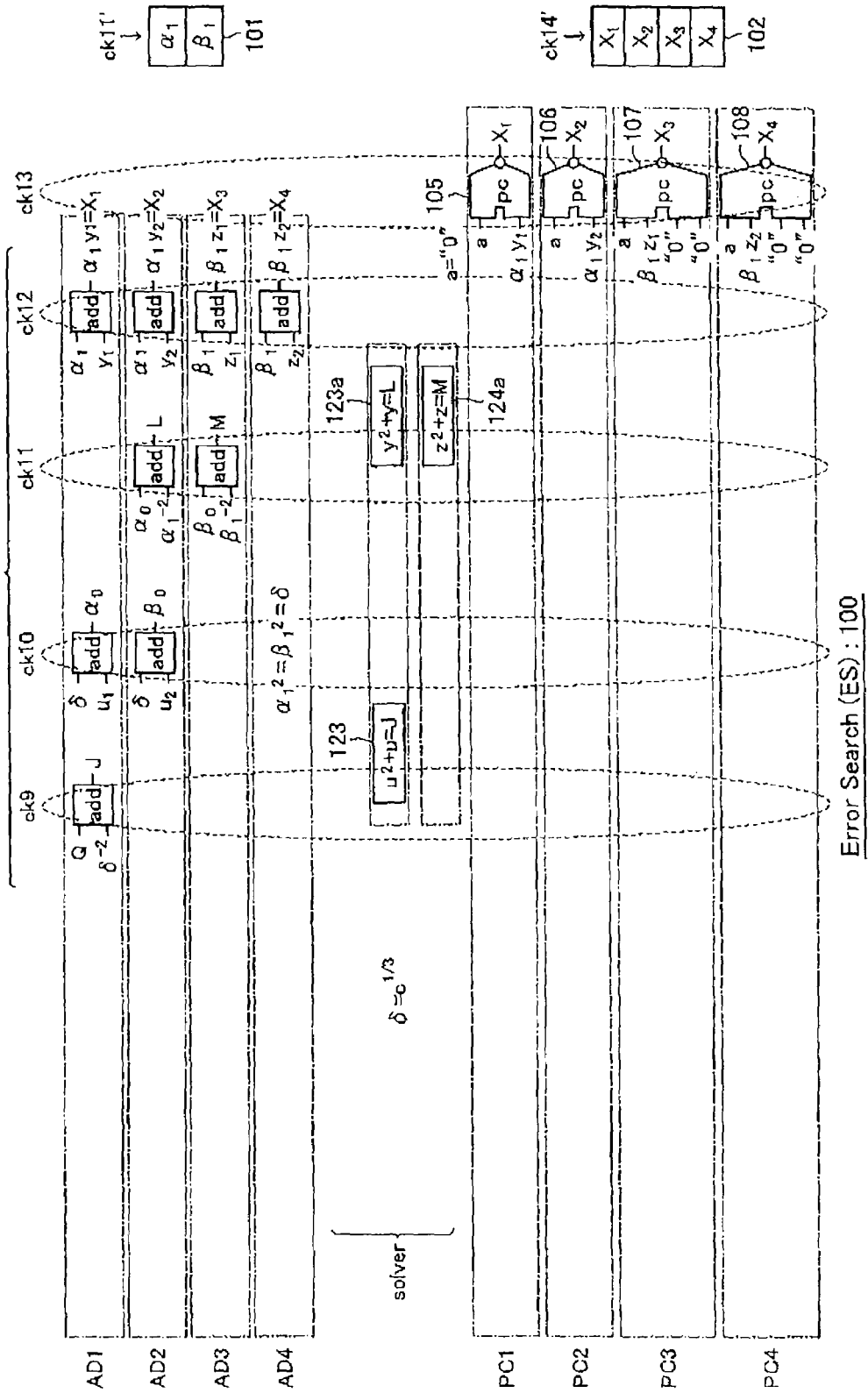
FIG. 16 shows the operation of Case 4 in the ES part.

Case4 Shown in FIG. 16

$\Gamma\neq 0$, $Q\neq 0$ and $c\neq 0$ because of 4EC. In addition, as the condition of Case4, $S=0$ and $\eta=0$.

CUBE 103 is not used, and $\delta=c^{1/3}$.

SQUARE 104 calculates $J=Q\delta^{-2}$ in adder circuit AD1 with clock ck9, calculates "$u_1$" and "$u_2$" from $u^2+u=J$ in decode calculating circuit 123 with clock ck10, and calculates $\alpha_0=\delta u_1$ and $\beta_0=\delta u_2$ in adder circuits An1 and AD2, respectively. Further, $\alpha_1^2=\beta_1^2=\delta$ is set.

In addition, $L=\alpha_0\alpha_1^{-2}$ and $M=\beta_0\beta_1^{-2}$ are calculated in adder circuits AD2 and AD3, respectively, with clock ck11. Further, $u^2+u=J$ and $v^2+v=K$ being dealt with $y^2+y=L$ and $z^2+z=M$, and these are decoded to $y_1, y_2$ and $z_1, z_2$ in the decoder calculating circuits 123a and 124a, respectively, with clock ck12, and adder circuits AD1-AD4 calculate $\alpha_1y_1$, $\alpha_1y_2, \beta_1z_1$ and $\beta_1z_2$, respectively.

Since $\alpha_1$ and $\beta_1$ are used in the successive steps, these are stored in register 101 with clock ck11'.

At the output portion of SQUARE 104, parity checker circuits PC1 to PC4 calculate $X_1=a+\alpha_1y_1$, $X_2=a+\alpha_1y_2$, $X_3=a+\beta_1z_1$ and $X_4=a+\beta_1z_2$ with a="0" with clock ck13, and the calculated results will be stored in register 102 with clock ck14'.

Figure 17:
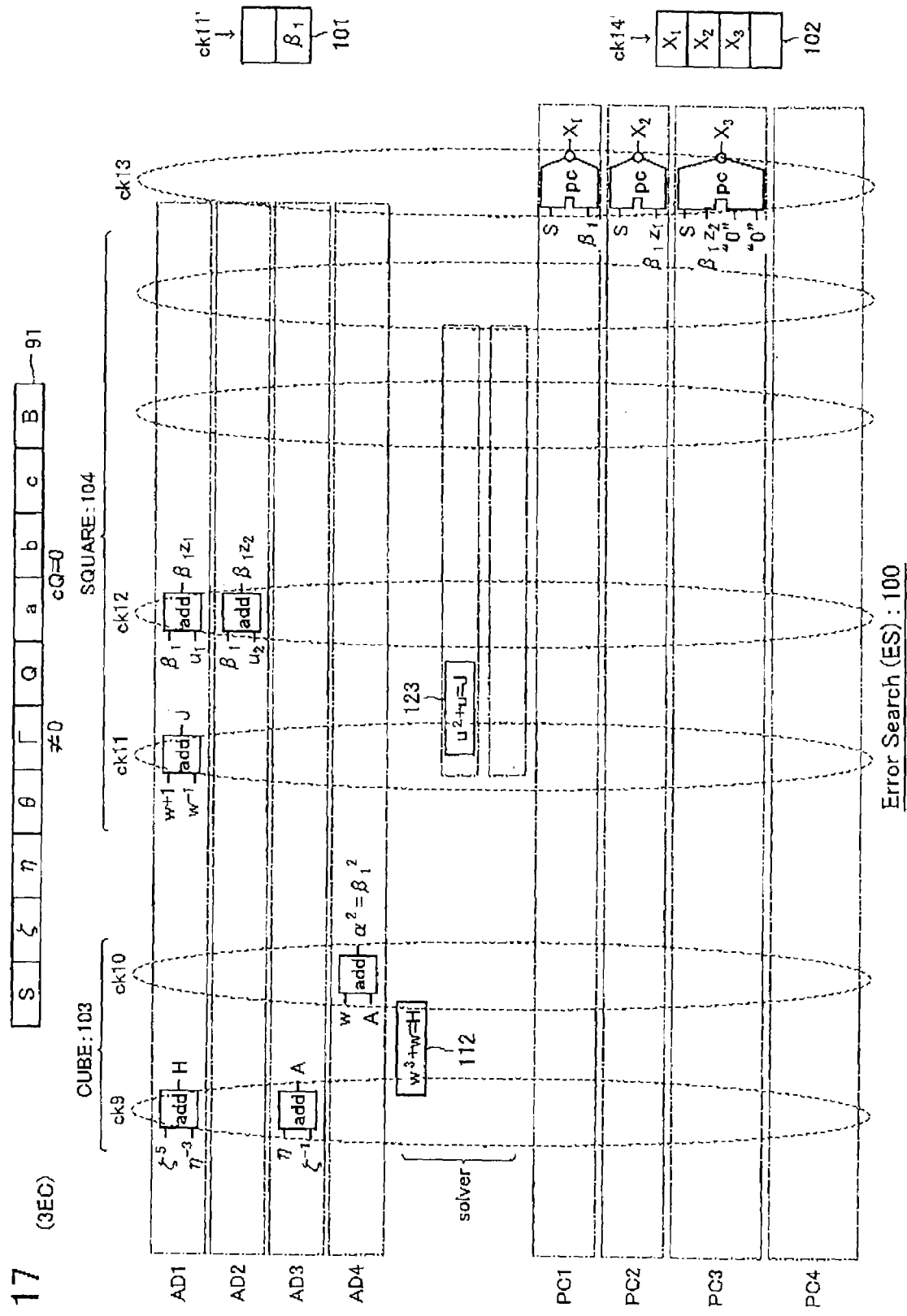
FIG. 17 shows the operation flow of the ES part in case of 3EC.

FIG. 17 shows the calculation procedure in ES part 100 in case of 3EC. $\Gamma\neq 0$, $Q=0$ or $c=0$ because of 3EC.

CUBE 103 calculates $H=\zeta^5\eta^{-3}$ and $A=\eta\zeta^{-1}$ in adder circuits AD1 and AD3, respectively, with clock ck9, calculates "w" and "w+1" from $w^3+w=H$ in decoder calculation circuit 112 with clock ck10 and calculates $\alpha^2=\beta_1^2=wA$ in adder circuit AD4.

SQUARE 104 calculates $J=(w+1)w^{-1}$ in adder circuit AD1 with clock ck11, calculates $u_1$ and $u_2$ from $u^2+u=J$ in decode calculating circuit 123 with clock ck12, and calculates $\beta_1z_1=\beta_1u_2$ and $\beta_1z_2=\beta_1u_2$ in adder circuits AD1 and AD2, respectively. Since $\beta_1$ is used in the successive steps, it will be stored in register 101 with clock ck11'.

At the output portion of SQUARE 104, parity checker circuits PC1 to PC3 calculate $X_1=S+\beta_1$, $X_2=S+\beta_1z_1$ and $X_3=S+\beta_1z_2$, and the calculated results will be stored in register 102 with clock ck14'.

Figure 18:
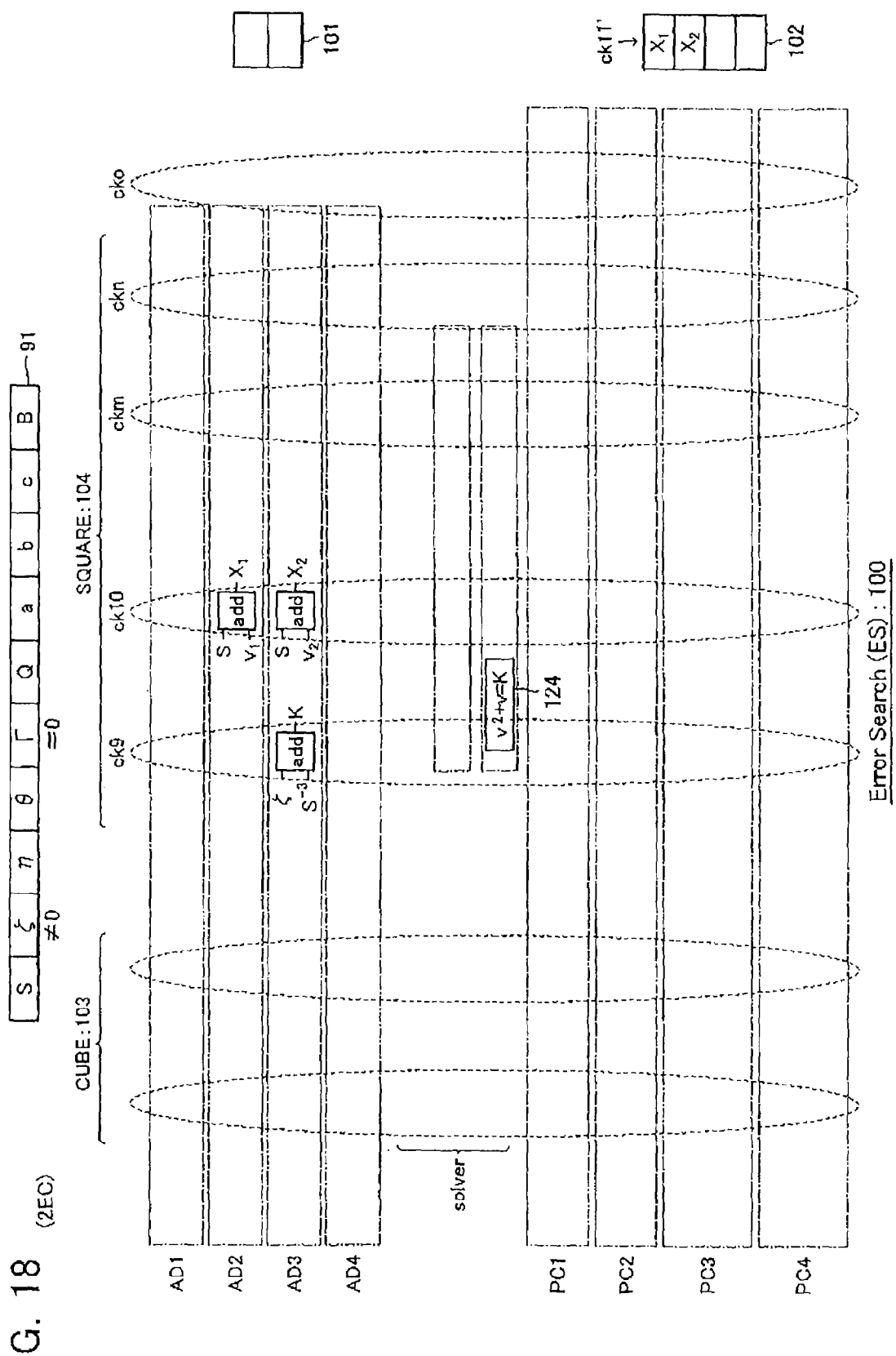
FIG. 18 shows the operation flow of the ES part in case of 2EC.

FIG. 18 shows the calculating procedure in ES part 100 in 2EC system. $\Gamma=0$ and $\zeta\neq 0$ because of 2EC. CUBE 103 is not used.

SQUARE 104 calculates $K=\zeta S^{-3}$ in adder circuit AD4 with clock ck9, calculates "$v_1$" and "$v_2$" from $v^2+v=K$ in decoder calculating circuit 124 with clock ck10 and calculates $X_1=Sv_1$ and $X_2=Sv_2$ in adder circuits AD3 and AD4, respectively.

The output of SQUARE 104 is stored in register 102 with clock ck11'.

Figure 19:
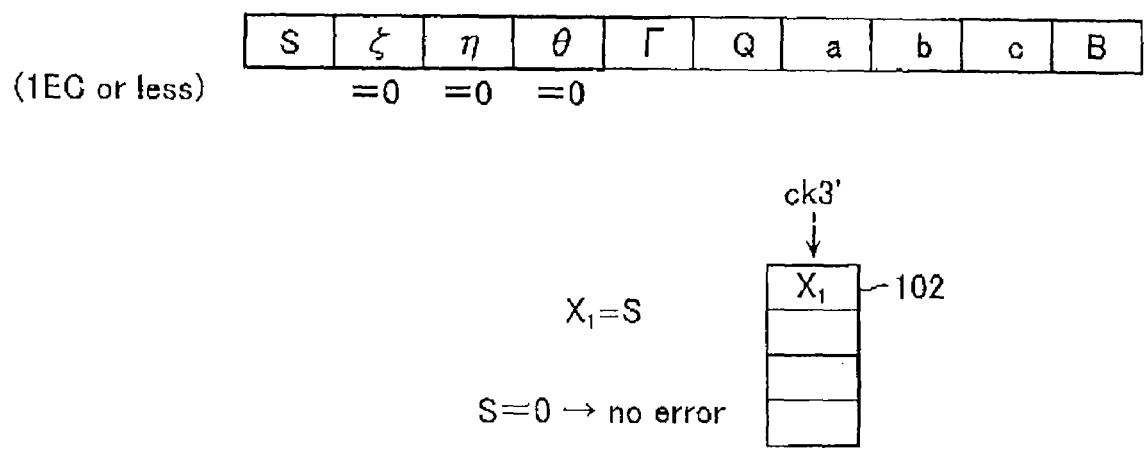
FIG. 19 shows the operation flow of the ES part in case of 1EC.

FIG. 19 shows the procedure in case of 1EC or less. $\zeta=0$, $\eta=0$ and $\theta=0$ because of 1EC or less. ES part 100 is not used, and the calculation procedure will be finished at SEC part 90. $X1=S$ is stored in register 102 with clock ck3'. If $S=0$, it becomes "no error".

In case there is no solution in decoder calculation circuit (solver) with respect to all procedures in 4EC, 3EC and 2EC, it designates that there are five or more errors. In case of $\zeta=0$, $\eta=0$ and $\theta=0$ or in case of $\zeta=0$, $S=0$ and $\eta\neq 0$, it also designates that there are five or more errors.

Comparing the above-described clock-controlled circuit system of 4EC with that shown in FIG. 1, in which clock control is not used, with respect to the numbers of adder circuits and parity checker circuits, the adder circuit number is reduced to 4 from 6, and parity checker number is not changed from 4 as it is. Therefore, it should be appreciated that the 4EC system is achieved without increasing the circuit scale. Removing unnecessary parts from the 4EC system, the clock-controlled 3EC system corresponding to that shown in FIG. 1 will be constituted.

So far, expression indexes are used for performing the operations between finite elements to be used in the calculation processes in parallel and at high speed. The expression index will be explained in detail here.

To search the product between finite field elements is to search the sum of indexes thereof. Therefore, if the figure is set to be small when an index is expressed as binary number, it becomes possible to make the carry time in the addition process short. In addition, since the sum is searched as the remainder with modulo of domain (i.e., index numbers), the larger the finite field, the larger the domain, i.e., the operation time will be increased.

It is the expression index that it becomes possible in appearance to effectively decrease the index number in one-to-one correspondence to the finite field element. For example, consider the finite field $GF(2^n)$. Domain of index thereof is: $h=2^n-1$. When the domain "h" is factorized into primes p1, p2, . . . , pi (h), the expression equivalent to the finite element $\alpha^m$ corresponding to the index "m" will be obtained as follows:

$$\alpha^m \Leftrightarrow m(\bmod h) \quad \text{[Exp. 52]}$$

$$\Leftrightarrow \{m(\bmod p1), m(\bmod p2), \ldots, m(\bmod pi(h))\}$$

This is for expressing the index as the domain components obtained by factorizing the domain, and is referred to as "expression index" in correspondence to the "index". By use of this expression index, the domain is made to be small in appearance. That is, the domain number of the index is "h" (from 0 to h−1) while that of the expression index is "pi(h)" (from 0 to pi(h)−1) defined by the maximum prime pi(h).

The product of finite field elements $\alpha^i$ and $\alpha^j$ is represented as $\alpha^{i+j}$. This may be represented as follows by use of the corresponding expression index.

$$\alpha^i \times \alpha^j = \alpha^{i+j} \Leftrightarrow \{i(p1), i(p2), \ldots, i(pi(h))\} \{j(p1), (p2), \ldots j(pi(h))\} = \{i+j(p1), i+j(p2), \ldots, i+j(pi(h))\} \quad \text{[Exp. 53]}$$

Therefore, the product of the finite field elements becomes the sum of index components with modulo of the factorized primes. That is, the bit number of domain Chit is "n", and the addition thereof is reduced in scale into the parallel addition operations of $\log_2 pi(h)$ bits, Next, some practical cases of "n" will be compared below.

It is required of the on-chip ECC system installed in a file memory with a large capacity to have a circuit scale, a processing speed and a redundancy scale, which are set suitably. In detail, n=8 to 13 in $GF(2^n)$, which may be used practically, will be considered here. Since to be considered is a high speed real time scheme, in which error searching is performed with decoders, to make the scale of the decoders not so large, n=13 is selected as the upper limit.

FIG. 20 shows the table, on which the compared results are summarized. The terms of the respective columns in the table are as follows.

Information Bit Number: Although the number of finite field elements is $2^n$, it is necessary to prepare check bits, so that the information bit number to be dealt with the power of 2 is $2^{n-1}$. If not particular about the power of 2, the number of the information bits may be increased to that obtained by subtracting check bits from $2^n$. This number designates the bit number of effective information to be processed in a lump.

4EC Check Bit Number: Check bit number "4n" of 4EC system is shown here because the system scales are compared with each other in consideration of that: 4-bit dealt in the 4EC system formed as the on-chip decode scheme is considered as the maximum error correction number with a high speed BCH processing.

Correction Rate: The bit number obtained by adding check bits to the information bits is processed in a lump in the ECC system, and errors up to 4 bits may be corrected. Therefore, the correction rate becomes $4/(2^{n-1}+4n)$.

Memory Redundancy Rate: In correspondence to the information bit number $2^{n-1}$ effective as the memory data, check bit number is set to be "4n". Therefore, the memory redundancy rate is $4n/2^{n-1}$.

$h=2^{n-1}$ Factorization; the primes of domain "h" of the index are shown here.

MAX Component Index Bit number: There are shown bit numbers for expressing the maxim prime of the index as binary number.

Bus Width: There are shown the total sum of domains of the expression index components, which serves as finite field element data bus prepared between circuits in the system.

Based on the compared results, there are shown as hatching cell areas, which satisfy the conditions of: correction rate is equal to or higher than 0.5%; check bit area is equal to or less than 10%; expression index component number is 2 or 3 in consideration of the parallel calculations; the number of component index maximum bits is equal to or less than 5; and bus width is equal to or less than 50. What satisfies the conditions with respect to all terms is $GF(2^{10})$. It should be appreciated that $GF(2^{10})$ will be selected as the most suitable finite field for the on-chip ECC system.

Next, it will be explained a suitable method of constituting the decoder circuit, which has the most effective circuit scale, on the ECC system with $GF(2^{10})$. Note that the expression index components of $GF(2^{10})$ are mod 3, mod 11 and mod 31.

A general method of searching expression index components of a finite field, which satisfying a condition, is to form a set of finite field elements, in which each expression index component satisfies each one condition, and constitute a decoder in such a manner that if there is an finite field satisfying the one condition for the set, the value of the expression index component is set as the expression index component value.

That is, if there are the following relationships of: $F(w)=w^3+w$, $F(w)=w^2+w$ and $F(w)=w$ with respect to finite field element "w", decoders are formed by grouping $F(w)$ with respect to the respective expression index components of "w", and the expression index component of "w" in the group is selected for the expression index components of $H=F(w)$.

Figure 21:
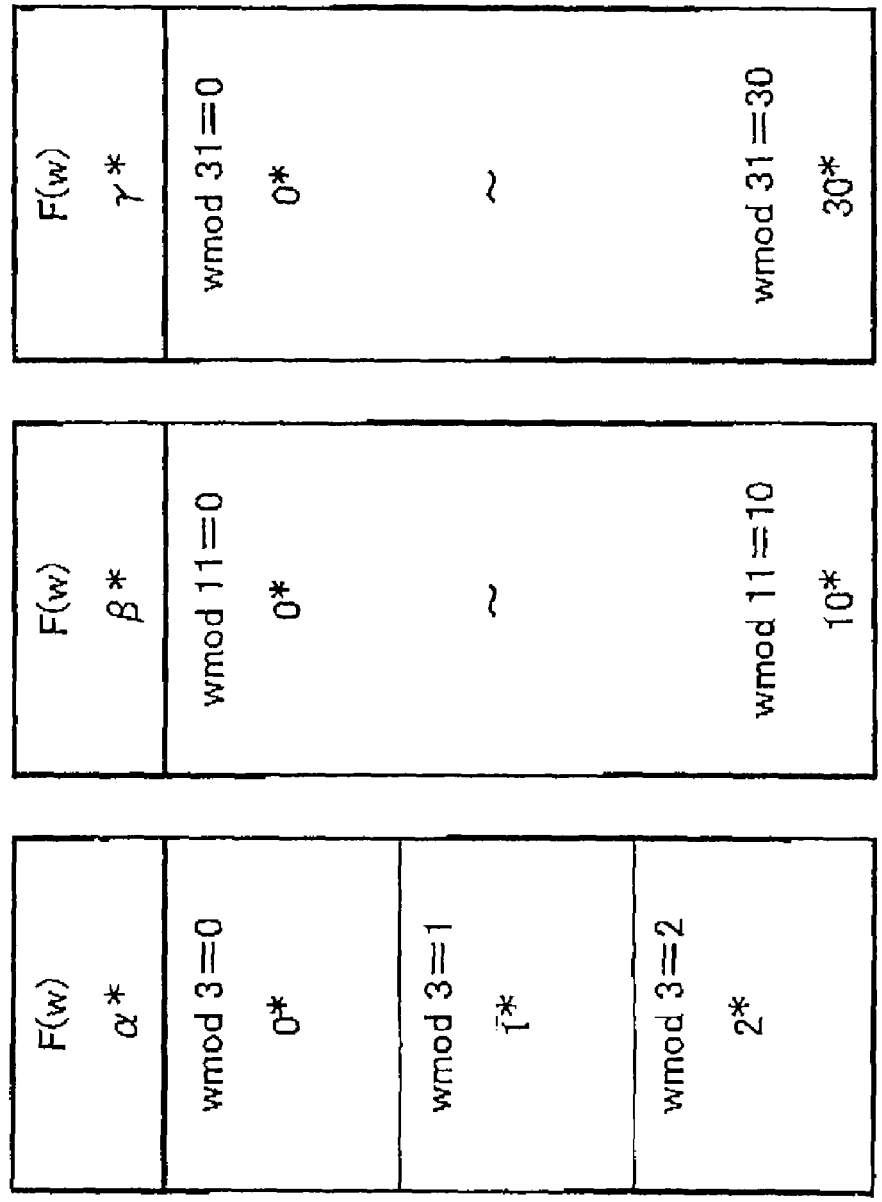
FIG. 21 shows the decode circuit scheme for decoding the expression index components.

FIG. 21 shows the summary of three kinds of decoder schemes with the expression index components mod 3, mod 11 and mod 31. $\alpha^*$, $\beta^*$ and $\gamma^*$ represent the groups of $F(w)$ of mod 3=$\alpha$, mod 11=$\beta$ and mod 31=$\gamma$, respectively. For example, $F(w)=w^3+w$ is used as the decoder of searching a cubic searching equation; $F(w)=w^2+w$ is for searching a quadratic equation; and $F(w)=w$ is for converting the polynomial expression of "w".

In the above-described decode scheme, it is in need of preparing decoder systems equal to the number of the expression index components. That is, it is required of the groups of $\alpha^*$, $\beta^*$ and $\gamma^*$ to have 3, 11 and 31 decoder systems, respectively. There are 1024 devices, which are equal to the number of finite field elements, necessary for constituting the decoders. Therefore, the circuit scale becomes large as the decoder systems are large.

Next, the method for reducing the decoder scale will be considered. With respect to the above-described groups am, $\alpha^*$, $\beta^*$ and $\gamma^*$, $\alpha^*$ and $\beta^*$ constitutes a common group $\alpha^* \wedge^R \beta^*$. Supposing that this new group is represented as $\{\alpha,\beta\}$, the following Expression 54 is obtained.

$$\{\alpha,\beta\}(=F(w): w \bmod 3=\alpha \text{ and } w \bmod 11=\beta)=\alpha^* \wedge^R \beta^*$$

$$\alpha^*=\{\alpha,0\} \vee \{\alpha,1\} \vee \{\alpha,2\} \vee \{\alpha,3\} \vee \ldots$$
$$\vee \{\alpha,9\} \vee \{\alpha,10\}$$

$$\beta^*=\{0,\beta\} \vee \{1,\beta\} \vee \{2,\beta\} \qquad \text{[Exp. 54]}$$

That is, take OR logic between the decoder circuit element and the output for $\{\alpha,\beta\}$, $\alpha$ and $\beta$ will be obtained.

FIG. 22 shows the case where two systems of the common group $\{\alpha,\beta\}$ and group $\gamma^*$ are dealt with the decoder circuit elements in correspondence to FIG. 21. As shown in FIG. 22, the number of group $\{\alpha,\beta\}$ is 3×11=33, which is nearly equal to the decoder number 31 of $\gamma^*$. The decoder systems are two, the common system and that of mod 31. Therefore, the circuit scale becomes two third in comparison with the case of three systems prepared for every element.

As a detailed example of the decoder construction, it will be explained such a case that with respect to the case of F(w)=w, the polynomial expression of the finite field is converted to the expression index.

For example, elements of $GF(2^{10})$ are obtained as the remainder of the irreducible polynomial $x^{10}+x^3+1$ on GF(2). The element that the index is "n" is the remainder polynomial obtained by dividing $x_n$, which is represented as follows by combinations of coefficients: $x^n = pn(x) = P''_9 x^9 + P''_8 x^8 + P''_7 x^7 + \ldots + P''_2 x^2 + P''_1 x + P''_0$.

Figures 23, 25:
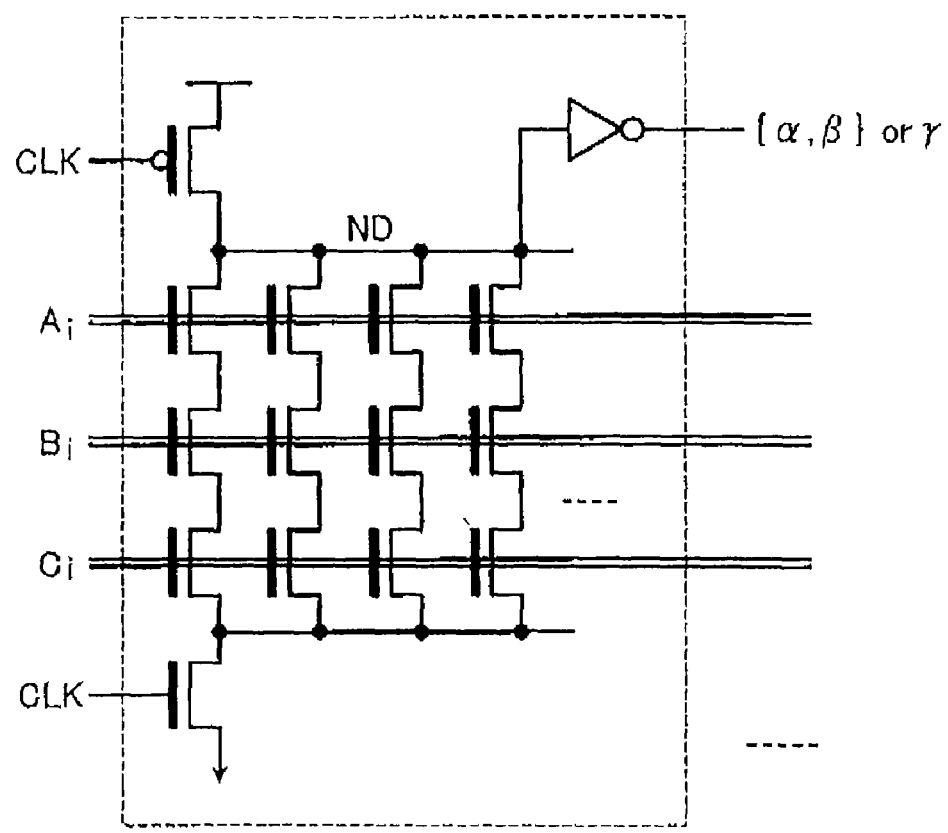
FIG. 23 shows the coefficient groups used for converting the coefficients to expression indexes.
FIG. 25 shows the decoder configuration used in a time-sharing mode.

To transform this coefficient expression to expression index, as shown in FIG. 23, the coefficients are classified into three groups of four-bit, four-bit and two-bit, and each four-bit or two-bit binary is converted to hexadecimal numbers. That is, A0~A15, B0~B15 and C0~C3 are obtained in order from the lower coefficient side of the polynomial.

Figure 24:
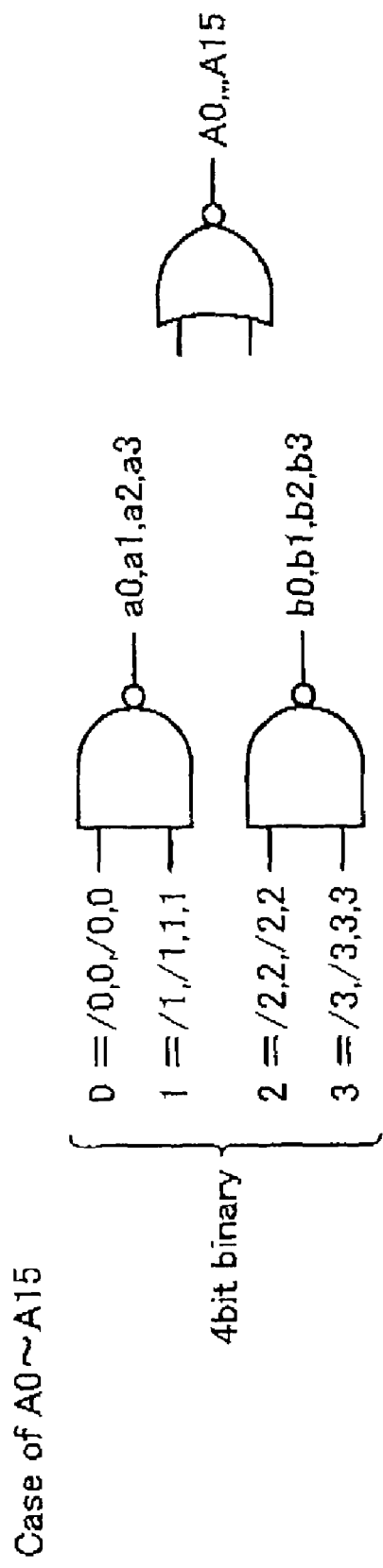
FIG. 24 shows the pre-decoder for converting 4-bit binary data to hexadecimal data.

FIG. 24 shows a pre-decode circuit for obtaining A0~A15 from the lowest 4-bit binary. Since the finite field is represented by the combination of Ai, Bi and Ci, decoder circuit $\{\alpha,\beta\}$ or $\gamma$ is represented as an OR logic of NAND of Ai, Bi and Ci, as shown in FIG. 25. This decoder operates as follows: when clock CLK is raised, if the polynomial expression of Ai, Bi and Ci belonging to $\{\alpha, \beta\}$ or $\gamma$ is in this decoder, node ND is discharged and this raises the output.

Figure 26:
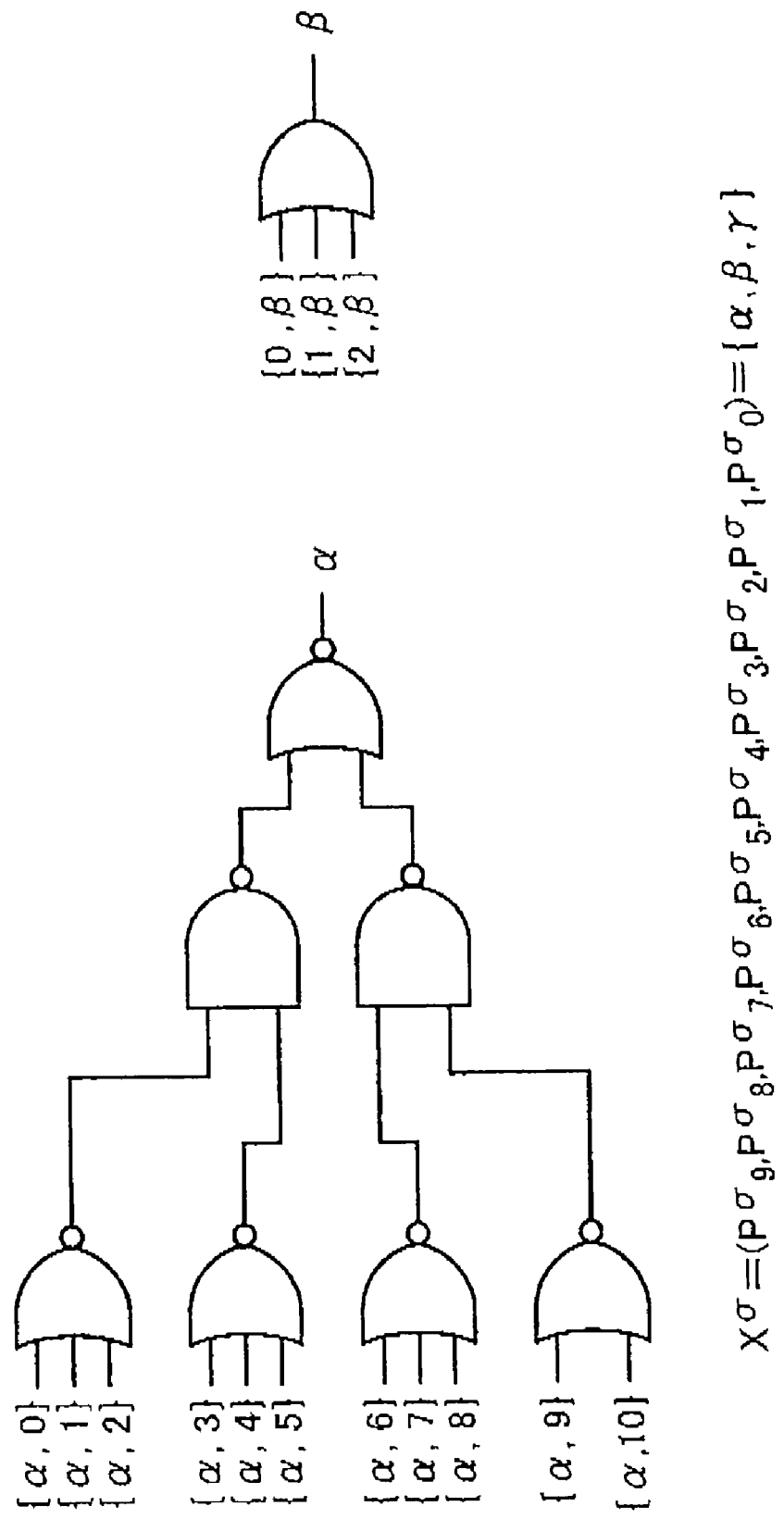
FIG. 26 shows the composition circuit of composing the decoded result of the expression index.

If composing the result of the expression index decoder with OR logics as shown in FIG. 26, the expression index components $\alpha$ and $\beta$ are obtained. As a result, the polynomial expression of $x^\alpha = (P^o_9, P^o_8, P^o_7, \ldots, P^o_2, P^o_1, P^o_0)$ of the finite field element $x^o$ may be converted to the "expression index" expression.

In the calculation system of 4EC, as explained above, the product of the finite field elements is obtained as the sum of indexes with an adder circuit. Many adder circuits are used in a time-sharing mode for searching multiple products. Next, it will be explained a method of constituting the input/output of the adder circuit.

The calculation in the adder circuit is performed between the expression index components expressed as binary numbers. Therefore, as shown in FIG. 27, it is in need of preparing: index/binary converting circuit 401 for converting the input expression indexes to binary numbers; adder 402 for processing the obtained binary data; and binary/index converting circuit 403 for converting the operation result to the expression index.

Passed on the data bus between adders are expression index components. Therefore, in case time-sharing is used with clocks "ckm" and "ckn", adder input multiplexer 400 is necessary at the input portion. That is, in case $\alpha$ is input with clock "ckm", and $\beta$ is input with clock "ckn", the input expression index components are multiplexed in the multiplexer 400 formed of clocked inverters to be input index "i".

Note here that in case time-sharing is performed with more clocks, clock corresponding portions will be increased.

Index/binary converter circuit 401 has, as shown in FIG. 28, a bit number defined in accordance with the domain of the expression index components. In case of $GF(2^{10})$, the domains of the expression index components are 3, 11 and 31, which become 2-, 4- and 5-bit binary numbers, respectively.

Converting is performed in such a manner that nodes ND0, ND1, . . . , ND3/4 are charged up while clocks "ckm" and "ckn" are not activated, and these are discharged in accordance with the component indexes "i"s, so that binary-expressed "i"s will be obtained. Binary expressions are defined by node levels of 2-bit (0, 1), 4-bit (0, 1, 2, 3), and 5-bit (0, 1, 2, 3, 4) corresponding to the expression index components i(3), i(11) and i(31), respectively, and the node levels are held in latches during the clock pulse time.

The output of adder 402 is binary. Supposing here that the binary bits are s0, s1, s2 and s3, these are pre-decoded in the binary/index converting circuit 403 shown in FIG. 29, and signals 0, 1, 2, 3 and 00, 4, 8, 12 are obtained. Then, with index decode & latch 404, which is a 2-input or 3-input circuit, the expression index is decoded. Decode inputs of the expression index components i(3), i(11) and i(31) are shown in the tables shown in FIGS. 31, 32 and 33, respectively.

The circuit functions with clocks "ckm+1" and "ckn+1", which are one-clock delayed to "ckm" and "ckn", respectively. The decoder output is latched with clocks "ckm+1" and "ckn+1" during the ECC cycle, and serves to be usable in the successive clock cycles. A part of the output latches 404 serves as the register portion 91 and the like, which has been specifically explained in the SEC part in the ECC circuit block.

Figure 34:
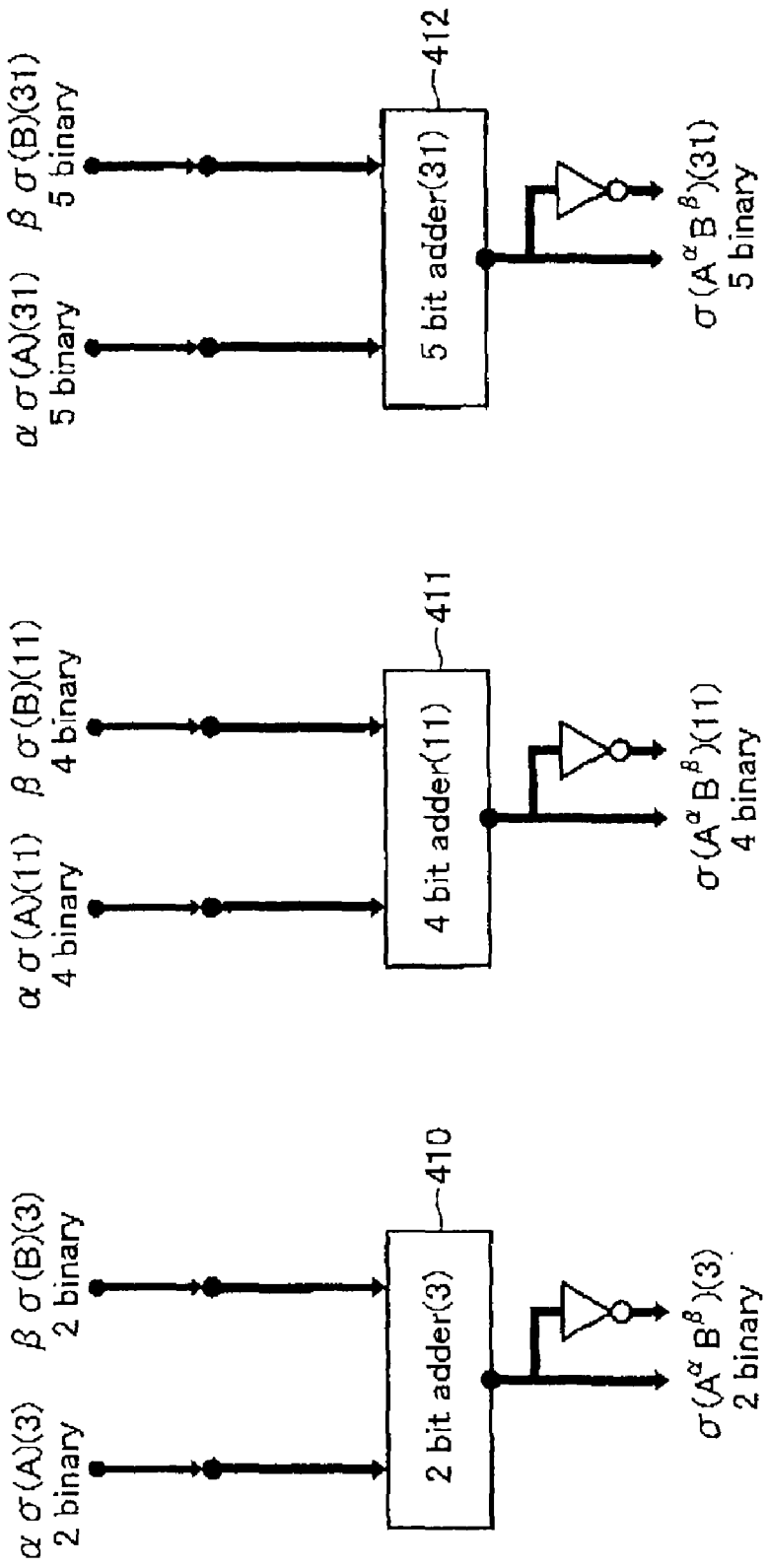
FIG. 34 shows the adder body.

Adder 402 is for searching sums of the expression indexes for the respective buses of three expression index components. As shown in FIG. 34, 2-bit adder 410, 4 Dbit adder 411 and 5-bit adder 412 are disposed in parallel in adder 402.

Each adder searches the product, $A^\alpha B^\beta$, of $\alpha$-th power of A and $\beta$-th power of B with respect to the finite field elements A and B. That is, with transformation $\sigma$, the calculation is performed as the sum of binary numbers for each component as follows; $\sigma(A^{\alpha B\beta}) \equiv \alpha\sigma(A) + \beta\sigma(B) (\bmod\ 3), (\bmod\ 11), (\bmod\ 31)$.

These adders are congruence-use ones, which are explained in detail below.

Figure 35:
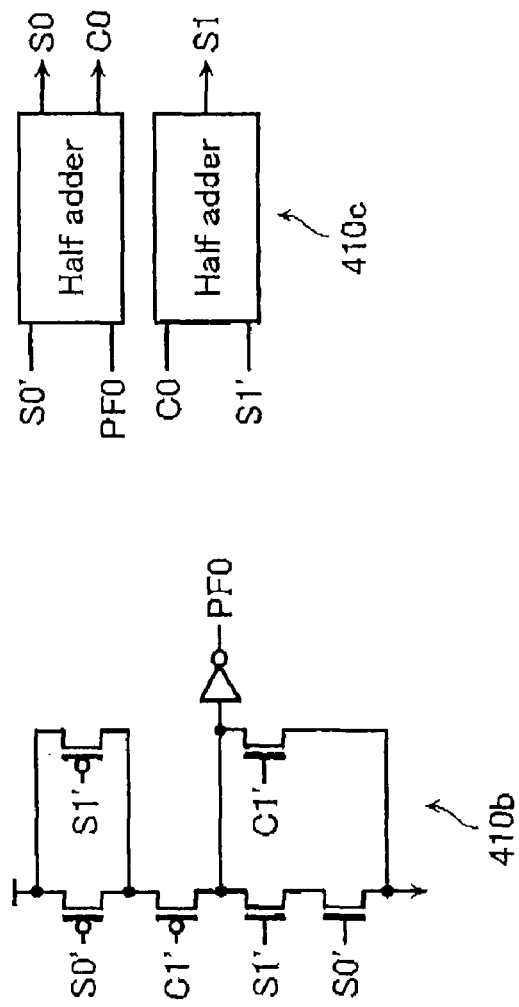
FIG. 35 shows the 2-bit adder configuration of the adder.

FIG. 35 shows the circuit symbol and the detailed configuration of 2-bit adder 410. Additions of the respective digits of numbers A and B are searched at full adders and half adders to output the sum as a remainder of mod 3.

This adder has first stage adder circuit 410a; carry correction circuit 410b for detecting that the sum is equal to 3 or more to carry; and second stage adder circuit 410c for adding a complement of 3, i.e., 1(=4−3) in accordance with the output PF0 of the carry correction circuit 410b when the sum is 3 or more.

It is not required of this adder to be synchronized with a clock, and the output is determined when the input is determined. Therefore, the system load such as timing control has been reduced.

Figure 36:
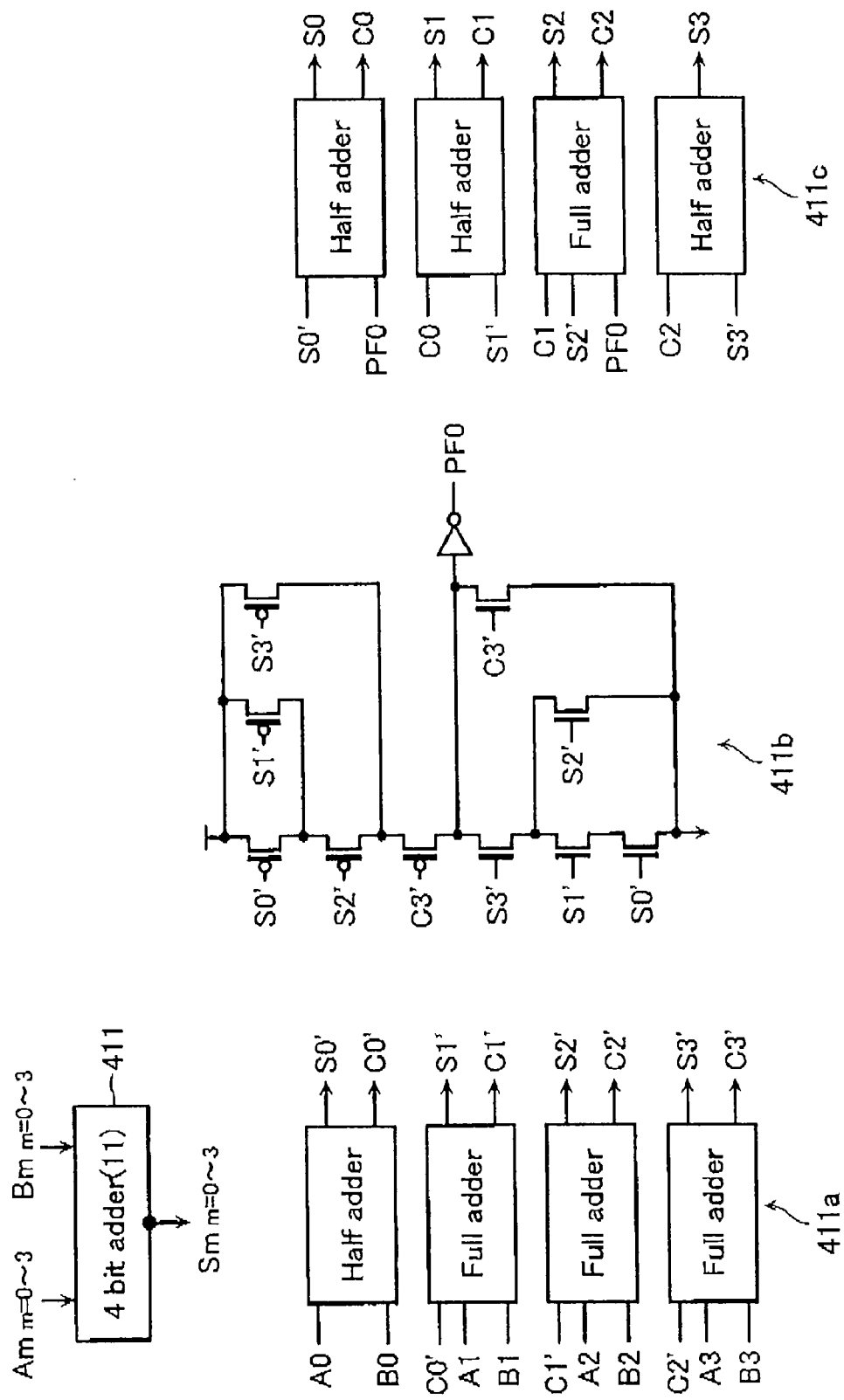
FIG. 36 shows the 4-bit adder configuration of the adder.

FIG. 36 shows the circuit symbol and the detailed configuration of 4-bit adder 411. Additions of the respective digits of numbers A and B are searched at full adders and half adders to output the sum as a remainder of mod 11.

This adder has first stage adder circuit 411a; carry correction circuit 411b for detecting that the sum is equal to 11 or more to carry; and second stage adder circuit 411c for adding a complement of 11, i.e., 5(=16−11) in accordance with the output PF0 of the carry correction circuit 411b when the sum is 11 or more.

FIG. 37 shows the circuit symbol and the detailed configuration of 5-bit adder 412. Additions of the respective digits of numbers A and B are searched at full adders and half adders to output the sum as a remainder of mod 31.

This adder has first stage adder circuit 412a; carry correction circuit 412b for detecting that the sum is equal to 31 or more to carry; and second stage adder circuit 412c for adding a complement of 31, i.e., 1(−32−31) in accordance with the output PF0 of the carry correction circuit 412b when the sum is 31 or more.

In the adders shown in FIGS. 36 and 37, as similar to that shown in FIG. 35, it is not required to be synchronized with a clock, and the output is determined when the input is determined. Therefore, the system load such as timing control has been reduced.

Figure 38:
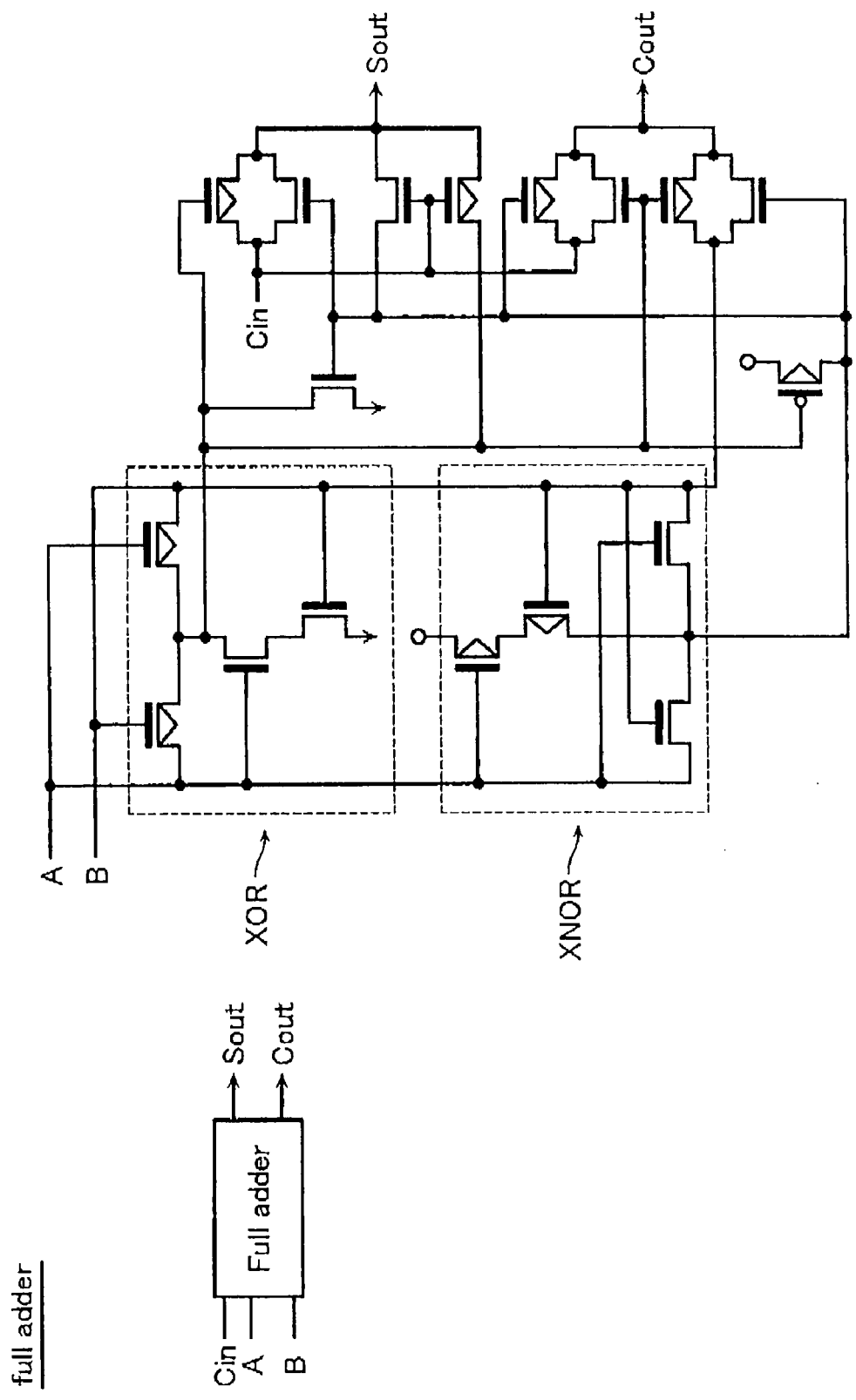
FIG. 38 shows the full adder configuration.
Figure 39:
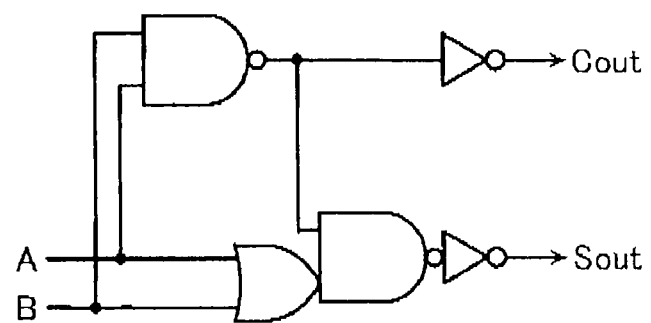
FIG. 39 shows the half adder configuration.

FIGS. 38 and 39 show a full adder and a half adder, respectively, which are basic circuits used for adding binary numbers. In the full adder, XOR and XNOR logic processing is performed for A and B to be added, and further logic processing is performed with carry signal Cin, thereby outputting the sum, Sout, of A, B and Cin, and carry signal Cout. The half adder is constituted by conventional logic gates.

In the calculation processes, there are generated often the powers of the finite field elements. However, the relationship between the powers corresponds to a kind of transformation between the respective elements, and it designates not calculating but connection-changing. FIG. 40 is a table showing a part of the corresponding relationships between the indexes of powers and the expression indexes.

A power of element becomes a multiple of expression index. As shown in FIG. 40, the component indexes of the expression index {(31), i(11), i(3)} are multiplied by "m", and new components are obtained as shown under x(m) columns. Combining these transformations, required expression indexes will be obtained.

For example, (−⅔)th power of the element defined by expression index {3,8,0} corresponds to (−⅔) times of the expression index.

Explaining in detail, the first index component is i(31)=3, and this is transformed to 28, as shown on −i(31) sub-column in ×(−1) column. Then this is dealt with new component i(31), and transformed to 25, as shown on 2i(31) sub-column in ×2 column. Then this is dealt with new component i(31), and transformed to 29, as shown in i/3(31) sub-column in ×(⅓) column. This transforming order is not necessary, and every order leads to the same result.

The second index component is i(11)=8, and this is transformed to 3, as shown on −i(11) sub-column in ×(−1) column. Then this is dealt with new component i(11), and transformed to 6, as shown on 2i(11) sub-column in ×2 column. Then this is dealt with new component i(11), and transformed to 2, as shown on i/3(11) sub-column in ×(⅓) column.

The third index component is i(3)=0, and this is transformed to 0, as shown on i(3) sub-column in ×(−1) column. Then this is dealt with new component i(3), and transformed to 0, as shown on 2i(3) sub-column in ×2 column. Then this is dealt with new component i(3), and transformed to 0, as shown on i/3(3) sub-column in ×(⅓) column.

With the transformation described above, the expression index {3,8,0} is converted to expression index {29,2,0} through (−⅔)th power of the corresponding elements. As described above, a new expression index is derived from the power of expression index on $GF(2^{10})$.

As explained above, according to this embodiment, there is provided a high speed and simplified ECC-BCH system, which is installed in a memory device, and 4-bit error correctable through the real time processing on the read/write data pass. The point of the system simplification is in that (1) the branching condition of the calculation process is defined to be exclusive with quantities derived from the syndromes, and (2) many logic operation circuits are used in a time-sharing mode. Further, as explained in detail, finite field $GF(2^{10})$ is effective to constitute a suitable on-chip 4EC system.

In accordance with this embodiment, 4-bit error correction, which is considered as the maximum error correction number in case BCH error correction is performed with the table decoder, may be finished in the processing time of several nsec. Further, according to this embodiment, the performance of a file memory with a large capacity is not decreased; the chip-area increasing is little; and the reliability is improved.

This invention is not limited to the above-described embodiment. It will be understood by those skilled in the art that various changes in form and detail may be made without departing from the spirit, scope, and teaching of the invention.

What is claimed is:
1. A memory device having an error detection and correction system constructed on a Galois finite field, wherein
the error detection and correction system comprises:
an encode part configured to generate check bits to be written into the memory device together with information bits;
a syndrome operation part configured to calculate syndromes from read data;
a syndrome element calculation part configured to perform finite field calculations based on the syndromes and to calculate intermediate values necessary in the calculation for calculating error locations;
an error searching part configured to perform data reception from the syndrome element calculation part and to perform finite field calculations to produce error locations; and
a clock generator configured to generate internal clocks used for making operation circuits in the syndrome element calculation part and the error searching part activated in a time-sharing mode,
the syndrome element calculation part and the error searching part using expression indexes to perform multiplication and addition between finite field elements, the expression indexes, in which differing prime factors of the domain of a finite field are "p" and "q", representing indexes of the finite field elements by combinations of numbers in mod p and numbers in mod q.

2. The memory device according to claim 1, wherein the operation circuits in the syndrome element calculation part and the error searching part include adder circuits and parity checker circuits, which perform multiplication and addition, respectively, between the finite field elements.

3. The memory device according to claim 1, wherein the error detection and correction system is constructed on Galois finite field GF(2^10), and the indexes of the finite field elements are represented by combinations of expression indexes mod 3, mod 11 and mod 31, with which multiplication and addition between the finite field elements are performed.

4. The memory device according to claim 1, wherein the error detection and correction system is for error-correcting up to four bits, and error searching branch thereof for 1-bit, 2-bit, 3-bit and 4-bit error searching is judged in accordance with exclusive conditions between the calculated intermediate values from the syndromes.

* * * * *